United States Patent
Hong et al.

(10) Patent No.: US 11,417,853 B2
(45) Date of Patent: Aug. 16, 2022

(54) ORGANIC LIGHT-EMITTING DIODE AND ORGANIC LIGHT-EMITTING DEVICE HAVING THE SAME

(71) Applicant: LG Display Co., Ltd, Seoul (KR)

(72) Inventors: Tae-Ryang Hong, Paju-si (KR); Hyong-Jong Choi, Paju-si (KR); Jun-Yun Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 359 days.

(21) Appl. No.: 16/573,696

(22) Filed: Sep. 17, 2019

(65) Prior Publication Data
US 2020/0119299 A1    Apr. 16, 2020

(30) Foreign Application Priority Data
Oct. 10, 2018 (KR) .................. 10-2018-0120460

(51) Int. Cl.
    *H01L 51/50*      (2006.01)
(52) U.S. Cl.
    CPC ........ *H01L 51/504* (2013.01); *H01L 51/5004* (2013.01); *H01L 51/5016* (2013.01); *H01L 51/5096* (2013.01); *H01L 2251/5376* (2013.01); *H01L 2251/552* (2013.01)
(58) Field of Classification Search
None
See application file for complete search history.

(56) References Cited

U.S. PATENT DOCUMENTS

| 2015/0280158 A1 | 10/2015 | Ogiwara et al. |
| 2017/0346029 A1 | 11/2017 | Kim et al. |
| 2018/0149595 A1 | 5/2018 | Adachi et al. |

FOREIGN PATENT DOCUMENTS

| CN | 106206958 A | 12/2016 |
| CN | 106340594 A | 1/2017 |
| CN | 106784354 A | 5/2017 |
| CN | 107112421 A | 7/2017 |
| CN | 107256927 A | 10/2017 |
| CN | 110034234 A | 7/2019 |
| KR | 10-2019-0012679 A | 2/2019 |

*Primary Examiner* — Gregory D Clark
(74) *Attorney, Agent, or Firm* — Birch, Stewart, Kolasch & Birch, LLP

(57) ABSTRACT

Disclosed is an organic light-emitting diode and an organic light-emitting device including the organic light-emitting diode. The organic light-emitting diode includes a cathode electrode; an anode electrode; a first emitting material layer including a first host and a first delayed fluorescent material, which is between the cathode electrode and the anode electrode; and a second emitting material layer having a second delayed fluorescent material and a first fluorescent or phosphorescent material, between the cathode electrode and the anode electrode. The organic light-emitting diode has enhanced luminous efficiency and color continuity.

26 Claims, 11 Drawing Sheets

ORGANIC LIGHT-EMITTING DIODE AND ORGANIC LIGHT-EMITTING DEVICE HAVING THE SAME

CROSS-REFERENCE TO RELATED APPLICATIONS

This application claims the priority benefit of Korean Patent Application No. 10-2018-0120460, filed in the Republic of Korea on Oct. 10, 2018, which is incorporated herein by reference in its entirety.

BACKGROUND

Technical Field

The present disclosure relates to an organic light-emitting diode, and more specifically, to an organic light-emitting diode enhancing luminous efficiency and color continuity and organic light-emitting device having the same.

Description of the Related Art

As a display device has become larger, there exists a need for a flat display device with lower spacing occupation. Among the flat display devices, a display device using an organic light-emitting diode (OLED) has come into the spotlight.

In the OLED, when electrical charges are injected into an emission layer between an electron injection electrode (i.e., cathode) and a hole injection electrode (i.e., anode), electrical charges are combined to be paired, and then emit light as the combined electrical charges are disappeared.

The OLED can be formed even on a flexible transparent substrate such as a plastic substrate. In addition, the OLED can be driven at a lower voltage of 10 V or less. Moreover, the OLED has relatively lower power consumption for driving compared to plasma display panel and inorganic electroluminescent devices, and color purity thereof is very high. Further, since the OLED can display various colors such as green, blue, red and the like, the OLED display device has attracted a lot of attention as a next-generation display device that can replace a liquid crystal display device (LCD).

BRIEF SUMMARY

Accordingly, the present disclosure is directed to an organic light-emitting diode and an organic light-emitting device having the same that substantially obviates one or more of the problems due to the limitations and disadvantages of the related art.

An object of the present disclosure is to provide an organic light-emitting diode, which is capable of preventing decrease of luminous efficiency which would occur in a single layered emitting material layer including the host, the delayed fluorescent material and the fluorescent or phosphorescent material, and an organic light-emitting device having the same.

Another object of the present disclosure is to provide an organic light-emitting diode, which is capable of increasing the concentration of the fluorescent or phosphorescent material as a final dopant to prevent dramatically changing the luminescence spectrum depending on relative differences in concentration of the fluorescent or phosphorescent material, and an organic light-emitting device having the same.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

According to an aspect, the present disclosure provides an organic light-emitting diode, comprising: a cathode electrode; an anode electrode; a first emitting material layer having a first host and a first delayed fluorescent material, between the cathode electrode and the anode electrode; and a second emitting material layer having a second delayed fluorescent material and a first fluorescent or phosphorescent material, between the cathode electrode and the anode electrode.

According to another aspect, the present disclosure provides an organic light-emitting device having the above organic light-emitting diode.

It is to be understood that both the foregoing general description and the following detailed description are examples and are explanatory and are intended to provide further explanation of the disclosure as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Reference will now be made in detail to aspects of the disclosure, examples of which are illustrated in the accompanying drawings.

Organic Light-Emitting Device

Figure 1:
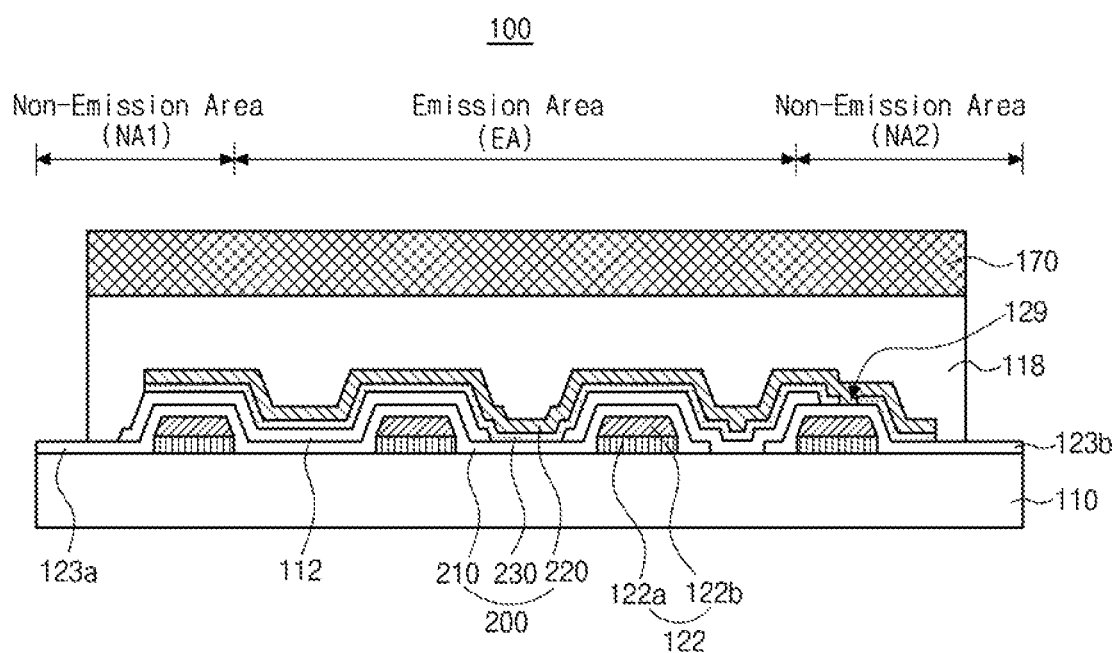
FIG. 1 is a schematic cross-sectional view illustrating an organic light-emitting illumination device of the present disclosure.

The present disclosure relates to an organic light-emitting diode (OLED) that includes multiple-layered emitting material layers at least one of which includes delayed fluorescent material and an organic light-emitting device including the OLED. The OLED has enhanced luminous efficiency and color continuity. The OLED of the present disclosure may be applied to an organic light-emitting device such as an organic light-emitting display device and an organic light-emitting illumination device. An organic light-emitting illumination device having the OLED will be explained. FIG. 1 is a cross-sectional view illustrating an organic light-emitting illumination device of the present disclosure.

As illustrated in FIG. 1, the organic light-emitting illumination device 100 includes a substrate 100 that defines an emission area "EA," which substantially laminates and emit light outwardly, and a non-emission areas "NA1" and "NA2", each of which is disposed along an outer periphery of the emission area "EA". The substrate 100 may include, but are not limited to, glass, thin flexible material and/or polymer plastics. For Example, the flexible material may be selected from the group, but are not limited to, polyimide (PI), polyethersulfone (PES), polyethylenenaphthalate (PEN), polyethylene terephthalate (PET), polycarbonate (PC) and combination thereof.

An organic light-emitting diode (OLED) 200 is disposed on the substrate 100. Particularly, the organic light-emitting diode 200 includes first and second electrodes 210 and 220, each of which is disposed on an entire surface of the substrate 110, and an emission layer 230 as an emitting unit disposed between the first and second electrodes 210 and 220. As electrical signals are applied into the first and second electrodes 210 and 220, the emission layer 230 illuminate and emit light toward the entire substrate 110.

The first electrode 210 may be an anode and include a conductive material having a relatively high work function value. For example, the first electrode 210 may include, but are not limited to, a transparent conductive material such as indium tin oxide (ITO), indium zinc oxide (IZO), indium tin zinc oxide (ITZO), SnO, ZnO, indium cerium oxide (ICO), aluminum doped zinc oxide (AZO), and the like.

In one exemplary embodiment, when the organic light-emitting illumination device 100 is a top-emission type, a reflective electrode or a reflective layer may be disposed under the first electrode 210. For example, the reflective electrode or the reflective layer may include, but are not limited to, aluminum-palladium-copper (APC) alloy.

An emission layer 230 as an emitting unit is disposed on the first electrode 210. In one exemplary embodiment, the emission layer 230 may have a mono-layered structure of an emitting material layer. Alternatively, the emission layer 230 may have a multiple-layered structure of a hole injection layer, a hole transport layer, an electron blocking layer, an emitting material layer, a hole blocking layer, an electron transport layer and/or an electron injection layer (See, FIGS. 2, 6 and 8). In one embodiment, the emitting material layer may have multiple-layered structure, as described below.

The second electrode 220 is disposed over the substrate 110 above which the emission layer 230 is disposed. The second electrode 220 may be disposed over a whole emission area "EA" and may include a conductive material having a relatively low work function value compared to the first electrode 210. The second electrode 220 may be a cathode. For example, the second electrode 220 may include, but are not limited to, aluminum (Al), magnesium (Mg), calcium (Ca), silver (Ag), alloy thereof or combination thereof such as aluminum-magnesium alloy (Al—Mg).

In one exemplary embodiment, an auxiliary electrode 122 connecting to the first electrode 210 may be disposed on a part of the emission area "EA" and the non-emission areal "NA1" and "NA2" defined in the substrate 110. The first electrode 210 includes a transparent conductive material in order to pass through light emitted from the emission layer 230. But, the transparent conductive material has higher electrical resistance compared to metals. In case of fabricating the large-area light-emitting diode illumination device 100, higher electrical resistance of the transparent conductive material makes the voltage applied to the emission area "EA" to be distributed unevenly across the whole emission area "EA". Due to such uneven voltage distribution, uniform luminance cannot be realized in the large-area light emitting diode illumination device 100.

The auxiliary electrode 122 may be disposed in the form of a matrix shape having a thin width, a mesh shape, a hexagonal shape, an octagonal shape and a circular shape, and the like throughout the entire emission area "EA". Accordingly, uniform voltage is distributed across the first electrode 210, which is disposed over the entire surface of the emission area "EA", and thereby achieving uniform luminance emission across the large-area light-emitting diode illumination device 100.

The auxiliary electrode 122 may be disposed under the first electrode 210, as illustrated in FIG. 1. Alternatively, the auxiliary electrode 122 may be disposed on the first electrode 210. As an example, the auxiliary electrode 122 may include, but is not limited to, highly conductive metals such as Al, Au, Cu, Ti, W, Mo and alloy thereof. In one exemplary embodiment, the auxiliary electrode 122 has a double-layered structure, i.e. a first auxiliary electrode 122a and a second auxiliary electrode 122b on the first auxiliary electrode 122a. Alternatively, the auxiliary electrode 122 may have single-layered structure.

A first pad 123a is disposed on the first non-emission area "NA1" of the substrate 110 and a second pad 123b and a contact portion 129, which electrically connects the second pad 123b to the second electrode 220, are disposed on the second non-emission area "NA2" of the substrate 110. Each of the first and second pads 123a and 123b is connected to outer source so that voltages may be applied into the first and second electrodes 210 and 220. The first pad 123a may be formed integrally with the first electrode 210 and the second pad 123b may be formed of a same material as the first electrode 210. But, the second pad 123b is spaced apart and electrically isolated from the first pad 123a and the first electrode 210.

Alternatively, the emission layer 230 and the second electrode 220 may be formed using the same mask so that the emission layer 230 and the second electrode 220 may be formed on the substrate 110 with the same area. Since the emission layer 230 is disposed between the second pad 123b and the second electrode 220, the second electrode 220 cannot be brought into contact physically with the second pad 123b by the emission layer 230. The contact portion 129 may be formed by removing a part of the emission layer 230 and inserting the second electrode 220 within the removed part. Accordingly, the second electrode 220 is brought into contact with the second pad 123b via the contact portion 129. In other words, the contact portion 129 is a contact hole that is formed in the emission layer 230 and exposes the second pad 123b to the outside. The contact portion 129 may be formed in various shapes and sizes such as a circular shape, a square shape, or a strip shape.

A passivation layer 112 is disposed over the emission area "EA" and the non-emission areas "NA1" and "NA2" of the substrate 110. The passivation layer 112 disposed only on a part of the emission area "EA" is configured to cover the auxiliary electrode 122 and the first electrode 210 on the auxiliary electrode 122 and is not disposed on an emitting region where the light is actually emitted. Besides, the passivation layer 122 in the emission area "EA" is formed so as to surround the auxiliary electrode 122, thereby reducing step differences by the auxiliary electrode 122. Accordingly, various layers to be formed thereafter can be stably formed without being broken.

The passivation layer 112 may include an inorganic insulating material such as silicon oxide ($SiO_x$) or silicon nitride ($SiN_x$), or an organic insulating material such as benzocyclobutene or photo-acryl. Alternatively, the passivation layer 122 may include multiple layers which are laminated sequentially with inorganic materials and organic materials.

The passivation layer 112 is disposed on the auxiliary electrode 122 in the emission area "EA". Since the emission layer 230 on the auxiliary electrode 122 is not brought direct contact with the first electrode 210, an organic light-emitting element is not formed over the auxiliary electrode 122. In other words, the organic light-emitting element within the emission area "EA" may be formed at only outer sides of the auxiliary electrode 122 having a predetermined shape.

As an example, the emission area "EA" and the non-emission areas "NA1" and "NA2" may be deposited using the same mask. The emission layer 230 and the second electrode 220 may be formed with the same area. Owing to the emission layer 230 disposed between the second electrode 220 and the second pad 123b in the emission area "EA", the second electrode 220 is not brought directly contact with the second pad 123b.

As an example, the auxiliary electrode 122, the first and second pads 123a and 123b, the passivation layer 112 and the contact portion 129 are formed between the substrate 110 and the OLED 200. Alternatively, at least one of the auxiliary electrode 122, the first and second pads 123a and 123b, the passivation layer 112 and the contact portion 129 may be omitted. Moreover, the light-emitting diode illumination device 100 may further comprise an inner coupling layer disposed between the substrate 110 and the OLED 200 for improving an external quantum efficiency (ECE) and/or an outer coupling layer disposed under the substrate 110 for increasing haze.

An adhesive or a tackifier 118 is applied over the substrate 110 having the OLED 200, and a film 170 is disposed on the adhesive 118 to encapsulate the light-emitting diode illumination device 100. The adhesive 118 may include, but are not limited to, photo-curable adhesives or thermally-curable adhesives. As an example, the adhesive 118 may comprise, but are not limited to, acrylate-based and/or epoxy-based pressure sensitive adhesives (PSA) and/or optically clear adhesives (OCA).

The film 170 may include various materials. The film 170 prevents outer moisture or air from filtrating into the OLED 200 and may include any material to achieve such a function. As an example, the film 170 may include, but are not limited to, a polymer such as polyethylene terephthalate (PET) or thin metal foil such as aluminum. Besides, in case the light-emitting diode illumination device 100 is fabricated with a sheet-manufacturing apparatus not a roll-manufacturing apparatus, the film 170 may include un-bend materials such as glass.

Besides, an encapsulation layer may be disposed on the second electrode 230. The encapsulation layer may include a first passivation layer of an organic material and/or an inorganic material, and a second passivation layer of epoxy-based compounds, acrylate-based compounds or acryl-based compounds.

Moreover, a flexible circuit film such as an FPC (flexible printed circuit) is attached to each of the first and second pads 123a and 123b, respectively. Each of the first and second pads 123a and 123b is brought contact with an external source via the flexible circuit film so that electrical signal is applied to the first and second pads 123a and 123b.

Organic Light-Emitting Diode (OLED)

Figure 2:
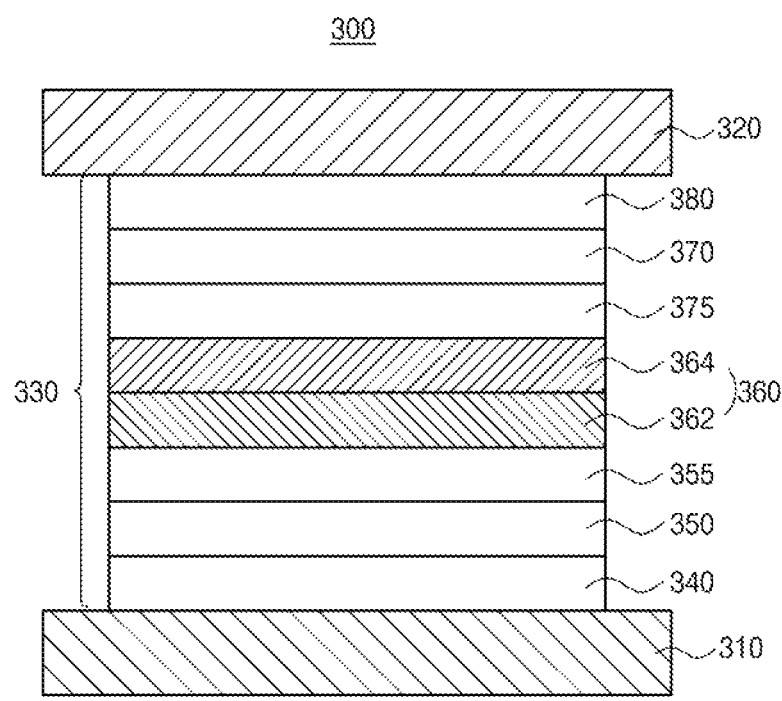
FIG. 2 is a schematic cross-sectional view illustrating an organic light-emitting diode in accordance with an exemplary embodiment of the present disclosure.

FIG. 2 is a schematic cross-sectional view illustrating an organic light-emitting diode in accordance with an exemplary embodiment of the present disclosure.

As illustrated in FIG. 2, the organic light-emitting diode (OLED) 300 in accordance with an exemplary embodiment of the present disclosure includes first and second electrodes 310 and 320 facing each other, an emission layer 330, as an emitting unit, disposed between the first and second electrodes 310 and 320. In one exemplary embodiment, the emission layer 330 include a hole injection layer (HIL) 340, a hole transport layer (HTL) 350, an emitting material layer (EML) 360, an electron transport layer (ETL) 370 and an electron injection layer (EIL) 380 each of which is laminated sequentially from the first electrode 310. Besides, the emission layer 330 may further include a first exciton blocking layer, i.e. an electron blocking layer (EBL) 355 disposed between the HTL 350 and the EML 360 and/or a second exciton blocking layer, i.e., a hole blocking layer (HBL) 375 disposed between the EML 360 and the ETL 370.

The first electrode 310 may be an anode that provides a hole into the EML 360. As described above, the first electrode 310 may include a conductive material having a relatively high work function value, for example, a transparent conductive oxide (TCO). In an exemplary embodiment, the first electrode 310 may include, but are not limited to, ITO, IZO, ITZO, SnO, ZnO, ICO, AZO, and the like.

The second electrode 320 may be a cathode that provides an electron into the EML 360. As described above, the second electrode 320 may include a conductive material having a relatively low work function values, i.e., a highly reflective material such as Al, Mg, Ca, Ag, alloy thereof, combination thereof, and the like.

The HIL 340 is disposed between the first electrode 310 and the HTL 350 and improves an interface property between the inorganic first electrode 310 and the organic HTL 350. In one exemplary embodiment, the HIL 340 may include, but are not limited to, 4,4'4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino)

triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl] benzene (TDAPB), poly(3,4-ethylenedioxythiophene)polystyrene sulfonate (PEDOT/PSS) and/or N-(biphenyl-4-yl)-9,9-dimethyl-N-(4-(9-phenyl-9H-carbazol-3-yl)phenyl)-9H-fluoren-2-amine. The HIL 340 may be omitted in compliance with a structure of the OLED 300.

The HTL 350 is disposed adjacently to the EML 360 between the first electrode 310 and the EML 360. In one exemplary embodiment, the HTL 350 may include, but are not limited to, N,N'-Diphenyl-N,N'-bis(3-methylphenyl)-1,1'-biphenyl-4,4'-diamine (TPD), NPB, 4,4'-bis(N-carbazolyl)-1,1'-biphenyl (CBP), Poly[N,N'-bis(4-butylpnehyl)-N,N'-bis(phenyl)-benzidine] (Poly-TPD), Poly[(9,9-dioctylfluorenyl-2,7-diyl)-co-(4,4'-(N-(4-sec-butylphenyl) diphenylamine))] (TFB), Di-[4-(N,N-di-p-tolyl-amino)-phenyl]cyclohexane (TAPC), N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

In one exemplary embodiment, each of the HIL 340 and the HTL 350 may be laminated with a thickness of, but are not limited to, about 5 nm to about 200 nm, preferably about 5 nm to about 100 nm.

The EML 360 includes hosts and dopants in which substantial illumination is done. Phosphorescent materials, which utilize triplet exciton as well as singlet exciton, show higher luminous efficiency than fluorescent materials, which utilize only the singlet exciton. Accordingly, phosphorescent hosts that can be used with phosphorescent dopants have attracted a lot of attentions. An excited state triplet energy level of the phosphorescent host must be higher than an excited stated triplet energy level of the phosphorescent dopant so as to prevent the triplet energy of the phosphorescent dopant from transferring to the phosphorescent host.

The triplet energy of the organic aromatic compounds drops sharply as the organic aromatic compounds have increased conjugation structure or fused rings. Accordingly, the organic materials that can be used as the phosphorescent hosts are extremely limited. In addition, the OLED using the phosphorescent host has a low color continuity, which is a limit to be applied to an organic light-emitting illumination device using the OLED.

In one exemplary embodiment, the EML 360 includes a first EML (EML1) 362 and a second EML (EML2) 364. The configuration and the luminous mechanism in the EML1 362 and the EML2 364 will be explained in more detail below.

The ETL 370 and the EIL 380 are laminated sequentially between the EML 360 and the second electrode 320. The ETL 370 includes a material having high electron mobility so as to provide electrons stably into the EML 360 by fast electron transportation.

In one exemplary embodiment, the ETL 370 may include, but are not limited to, oxadiazole-based compounds, triazole-based compounds, phenanthroline-based compounds, benzoxazole-based compounds, benzothiazole-based compounds, benzimidazole-based compounds, triazine-based compounds, and the like.

For example, the ETL 370 may include, but are not limited to, tris-(8-hydroxyquinoline aluminum ($Alq_3$), 2-biphenyl-4-yl-5-(4-t-butylphenyl)-1,3,4-oxadiazole (PBD), spiro-PBD, lithium quinolate (Liq), 1,3,5-Tris(N-phenyl-benzimidazol-2-yl)benzene (TPBi), Bis(2-methyl-8-quinolinato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl) 1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)](PFNBr), tris(phenylquinoxaline) (TPQ) and/or 10-Di-2-naphthalenyl-2-anthracenyl)phenyl]-1-phenyl-1H-benzimidazole.

The EL 380 is disposed between the second electrode 320 and the ETL 370, and can improve physical properties of the second electrode 320 and therefore, can enhance the life span of the OLED 300. In one exemplary embodiment, the EIL 380 may include, but are not limited to, an alkali halide such as LiF, CsF, NaF, $BaF_2$ and the like, and/or an organic metal compound such as lithium benzoate, sodium stearate, and the like.

In one embodiment, each of the ETL 370 and the EL 380 may be laminated with a thickness of, but are not limited to, about 10 nm to about 200 nm, preferably about 10 nm to about 100 nm.

When holes are transferred to the second electrode 320 via the EML 360 and/or electrons are transferred to the first electrode 310 via the EML 360, the OLED 300 may have short lifespan and reduced luminous efficiency. In order to prevent these phenomena, the OLED 300 in accordance with this embodiment of the present disclosure has at least one exciton blocking layer adjacent to the EML 360.

For example, the OLED 300 of the exemplary embodiment includes the EBL 355 between the HTL 350 and the EML 360 so as to control and prevent electron transfers. In one exemplary embodiment, the EBL 355 may include, but are not limited to, TCTA, Tris[4-(diethylamino)phenyl] amine, N-(bipnehyl-4-yl)-9,9-dimethyl-N-(4-(9-phenyl-9H-carbazol-3-yl)phenyl)-9H-fluorene-2-amine, TAPC, MTDATA, 1,3-Bis(carbazol-9-yl)benzene (mCP), 3,3'-Bis (N-carbazolyl)-1,1'-biphenyl (mCBP), CuPc, N,N'-bis[4-(bis(3-methylphenyl)amino)phenyl]-N,N'-diphenyl-[1,1'-biphenyl]-4,4'-diamine (DNTPD) and/or TDAPB.

In addition, the OLED 300 further includes the HBL 375 as a second exciton blocking layer between the EML 360 and the ETL 370 so that holes cannot be transferred from the EML 360 to the ETL 370. In one exemplary embodiment, the HBL 375 may include, but are not limited to, oxadiazole-based compounds, triazole-based compounds, phenanthroline-based compounds, benzoxazole-based compounds, benzothiazole-based compounds, benzimidazole-based compounds, and triazine-based compounds.

For example, the HBL 375 may include a compound having a relatively low HOMO energy level compared to the emitting material in EML 360. The HBL 375 may include, but are not limited to, BCP, BAlq, $Alq_3$, PBD, spiro-PBD, Liq, Bis-4,5-(3,5-di-3-pyridylphenyl)-2-methylpyrimidine (B3PYMPM), Oxybis(2,1-phenylene)bis(diphenylphosphoine oxide (DPEPO) and combination thereof.

As an example, each of the EBL 355 and the HBL 375 may be laminated with a thickness of, but are not limited to, about 5 nm to about 200 nm, preferably about 10 nm to about 100 nm.

As described above, the EML 360 of the OLED 300 according to the first embodiment of the present disclosure includes the EML1 362 and the EML2 364. Particularly, the EML 360 includes the EML1 362 including first and second compounds and the EML2 364 including third and fourth compounds. In an exemplary embodiment, each of the second and third compounds may be a delayed fluorescent material. The EML1 362 is disposed between the first electrode 310 and the second electrode 320, and the EML2 364 is disposed between the first electrode 310 and the EML1 362 or between the EML1 362 and the second electrode 320. Hereinafter, the EML 360, where the EML2 364 is disposed between the EML1 362 and the second electrode 320, will be explained.

An organic light-emitting diode (OLED) emits light as holes injected from the anode and electrons injected from the cathode are combined to form excitons in an EML and then unstable excited state excitons return to a stable ground state. The external quantum efficiency (EQE; $\eta_{ext}$) of the luminous material applied into the EML may be calculated by product of four parameters, i.e. exciton generation efficiency or singlet-triplet ratio "$\eta_{S/T}$", a charge balance factor "r", radiative quantum efficiency "$\Phi$" and out-coupling efficiency "$\eta_{out-coupling}$".

The singlet-triplet ratio has maximum value of 0.25 in case of fluorescent materials. Theoretically, when electrons meet holes to form exciton, a singlet exciton of a paired spin and a triplet exciton of an unpaired spin are generated by a ratio of 1:3 by spin arrangements. Only the singlet exciton among the excitons can be involved in emission process in case of the fluorescent materials.

Charge balance factor "r" is a balance between holes and electrons both of which form excitons and generally has a value of "1" assuming 1:1 matching of 100%. "$\Phi$" is a value related with luminous efficiency of actual luminous materials and depends upon photoluminescence of dopant in a host-dopant system.

"$\eta_{out-coupling}$" is a ratio of light extracted outwardly among the emitted light in a luminous materials. When isotropic luminous material is thermally deposited to form a thin film, each of luminous molecules does not have specific orientation, but exists with random states. The out-coupling efficiency in such random orientation is generally assumed "0.2". Accordingly, when combining 4 parameters, the OLED may exhibit at most 5% luminous efficiency in case of using the prior art fluorescent material.

In contrast, phosphorescent materials adopt different luminous mechanism of converting both singlet excitons and triplet exciton into light. The phosphorescent materials convert singlet excitons into triplet excitons through inter-system crossing (ISC). Therefore, it is possible to enhance luminous efficiency in case of applying the phosphorescent materials that use both the singlet excitons and the triplet excitons during the luminous process compared to the fluorescent materials.

In case of using metal complexes having a heavy metal such as Ir, Pt, and the like as the phosphorescent materials, it is possible to convert singlet state to triplet state through strong spin-orbital bonds by the heavy metal. However, the prior art blue phosphorescent materials do not have enough color purity for the display device and exhibit very short luminous lifespan, and therefore, they have not been used in commercial display devices.

Delayed fluorescent material has been developed for solving the problems caused by the prior art fluorescent and phosphorescent materials. Representative delayed fluorescent materials utilize thermally activated delayed fluorescence (TADF) mechanism. The delayed fluorescent material enables intramolecular charge transfer and can utilize triplet exciton energy as well as singlet exciton energy during the emission process, and therefore can enhance luminous efficiencies.

Figure 3:
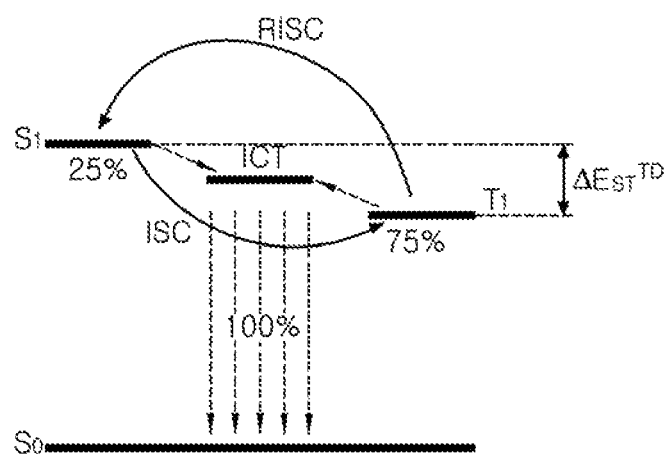
FIG. 3 is a schematic diagram illustrating luminous mechanism by a delayed fluorescent material in an EML in accordance with an exemplary embodiment of the present disclosure.

FIG. 3 is a schematic diagram illustrating luminous mechanism by a delayed fluorescent material in an EML in accordance with an exemplary embodiment of the present disclosure.

The delayed fluorescence can be divided into a thermally activated delayed fluorescence (TADF) and a field activated delayed fluorescence (FADF). Triplet exciton in the delayed fluorescent material can be activated by heat or electrical field so that super-fluorescence beyond the maximal luminous efficiency by conventional fluorescent material can be implemented.

Since the triplet excitons within the delayed fluorescent material can be activated by heat or electrical field generated in driving the OLED, the triplet excitons can be involved in emission processes. Since the delayed fluorescent material generally has an electron donor moiety as well as an electron acceptor moiety, it can be converted to an intramolecular charge transfer (ICT) state. In case of using the delayed fluorescent material, which can be converted to an ICT state, as a dopant, the excitons of singlet energy level $S_1$ as well as the excitons of triplet energy level $T_1$ can move to an intermediate energy level state, i.e. ICT state, and then the intermediate stated excitons can be transferred to a ground state ($S_0$; $S_1 \rightarrow ICT \leftarrow T_1$). Since the excitons of singlet energy level $S_1$ as well as the excitons of triplet energy level $T_1$ in the delayed fluorescent material is involved in the emission process, the delayed fluorescent material can improve internal quantum efficiency and luminous efficiency.

Since both the Highest Occupied Molecular Orbital (HOMO) and the Lowest Unoccupied Molecular orbital (LUMO) are widely distributed over the whole molecule within the common fluorescent material, it is not possible to inter-convert between the singlet energy level and the triplet energy level within it (selection rule). In contrast, since the delayed fluorescent material, which can be converted to ICT state, has little orbital overlaps between HOMO and LUMO, there is little interaction between the HOMO state molecular orbital and the LUMO state molecular orbital within the delayed fluorescent material. As a result, the changes of spin states of electrons does not have an influence on other electrons, and a new charge transfer band (CT band) that does not follow the selection rule is formed in the delayed fluorescent material.

In other words, since the delayed fluorescent material has the electron acceptor moiety spacing apart from the electron donor moiety within the molecule, it exists as a polarized state having a large dipole moment within the molecule. As there is little interaction between HOMO molecular orbital and LUMO molecular orbital in the molecule having the dipole moment of the polarized state, both the triplet energy level excitons and the singlet energy level excitons can be converted to ICT state. Accordingly, the excitons of triplet energy level $T_1$ as well as the excitons of singlet energy level $S_1$ can participate in the emission process.

In case of driving the OLED that includes the delayed fluorescent material, 25% excitons of singlet energy level $S_1$ and 75% excitons of triplet energy level $T_1$ are converted to ICT state by heat or electrical field, and then the converted excitons transfers to the ground state $S_0$ to achieve luminescence. Therefore, the delayed fluorescent material may have 100% internal quantum efficiency in theory.

The delayed fluorescent material must have an energy bandgap $\Delta E_{ST}^{TD}$ equal to or less than about 0.3 eV, for example, from about 0.05 to about 0.3 eV, between the singlet energy level $S_1$ and the triplet energy level $T_1$ so that exciton energy in both the singlet energy level and the triplet energy level can be transferred to the ICT state.

Since the delayed fluorescent material can exhibit 100% internal quantum efficiency in theory, it can implement as high luminous efficiency as the conventional phosphorescent material including a heavy metal. However, due to the bond conformation between the electron acceptor-electron donor and the sterical twists in the delayed fluorescent material, and additional charge transfer transition (CT transition) caused by them, the delayed fluorescent material shows broad spectrum in the course of emission, i.e. broad full width at half maximum (FWHM), which results in poor color purity. In addition, the delayed fluorescent material exhibits short luminous life span owing to utilizing the triplet exciton energy as well as the singlet exciton energy.

The OLED including a host, a delayed fluorescent material and a fluorescent or phosphorescent material having narrow FWHM in a single-layered EML may be considered so as to solve the problems accompanied by the delayed fluorescent material. In such a single-layered EML, the delayed fluorescent material is illuminated by RISC and the exciton energy of the delayed fluorescent material is transferred to the fluorescent or phosphorescent material through Dexter resonance energy transfer (DRET) mechanism, which transfers energy by exciton diffusions through intermolecular electron exchanges. DRET mechanism occurs rapidly in the range of $10^{-11}$ to $10^{-9}$ seconds. On the contrary, RISC mechanisms of the delayed fluorescent material is done within $10^{-10}$ to $10^{-7}$ seconds and the emission of the delayed fluorescent material caused by the RISC mechanism is done within about $10^7$ seconds. In other words, each of the RISC mechanism and the emission mechanism of the delayed fluorescent material is much slower than DRET mechanism.

Accordingly, the exciton energy generated in the delayed fluorescent material is transferred rapidly to the fluorescent or phosphorescent material through DRET mechanism so that actual emission occurs in the fluorescent or the phosphorescent material. But, the emission of the delayed fluorescent material itself rarely occurs owing to the slow RISC mechanism. Since the actual emission occurs only in the fluorescent or phosphorescent material in the single-layered EML including the host, the delayed fluorescent material and the fluorescent or phosphorescent material, the OLED having the single-layered EML may show reduced color continuity.

Moreover, when the fluorescent material is used as the final luminous material, the delayed fluorescent material should achieve 100% internal quantum efficiency through RISC. The rate of DRET mechanism, which is an energy transfer mechanism among adjacent molecules, is much faster than the rate of RISC mechanism of the delayed fluorescent material. The triplet exciton energy of the delayed fluorescent material is rapidly transferred to the triplet exciton energy of the fluorescent material by DRET mechanism before the excited stated triplet exciton energy of the delayed fluorescent material is converted to the excited state singlet energy of the delayed fluorescent material via RISC mechanism. Since the triplet exciton energy of the fluorescent material is quenched as a non-emission, substantially only the singlet exciton energy of the delayed fluorescent material may be transferred to the singlet exciton energy of the fluorescent material, so that luminous efficiency can be lowered.

Accordingly, it is necessary to minimize DRET mechanism through which the exciton energy of the delayed fluorescent material is transferred to the fluorescent or phosphorescent material in the same EML. Transfer efficiency in DRET mechanism is inversely proportional to sixth power of the intermolecular distance. Accordingly, when the same material layer includes much contents of the fluorescent or phosphorescent material, the triplet exciton energy of the delayed fluorescent material is quenched as a non-emission as the exciton energies generated in the delayed fluorescent material is transferred rapidly to the fluorescent or phosphorescent material.

In case the single-layered EML includes the host, the delayed fluorescent material and the fluorescent or phosphorescent material as a final dopant, the fluorescent or phosphorescent material comprises typically at most 0.5% by weight so as to minimize DRET phenomenon. But, it is very difficult to dope the final dopant to 0.5% by weight over all regions in the single-layered EML of the OLED. Since a luminescence spectrum is dramatically changed depending on relative concentration differences of the final dopant, when the final dopant is doped to a very small amount such as 0.5% by weight, the luminescence spectrum is drastically changed according to the minute doping concentration differences (ex. 40% doping concentration changes such as a concentration differences±0.2% by weight in case that the doping concentration of 0.5% by weight) in regions of the EML. Thus, it may be difficult to realize a uniform emission spectrum across the single-layered EML.

Figure 4:
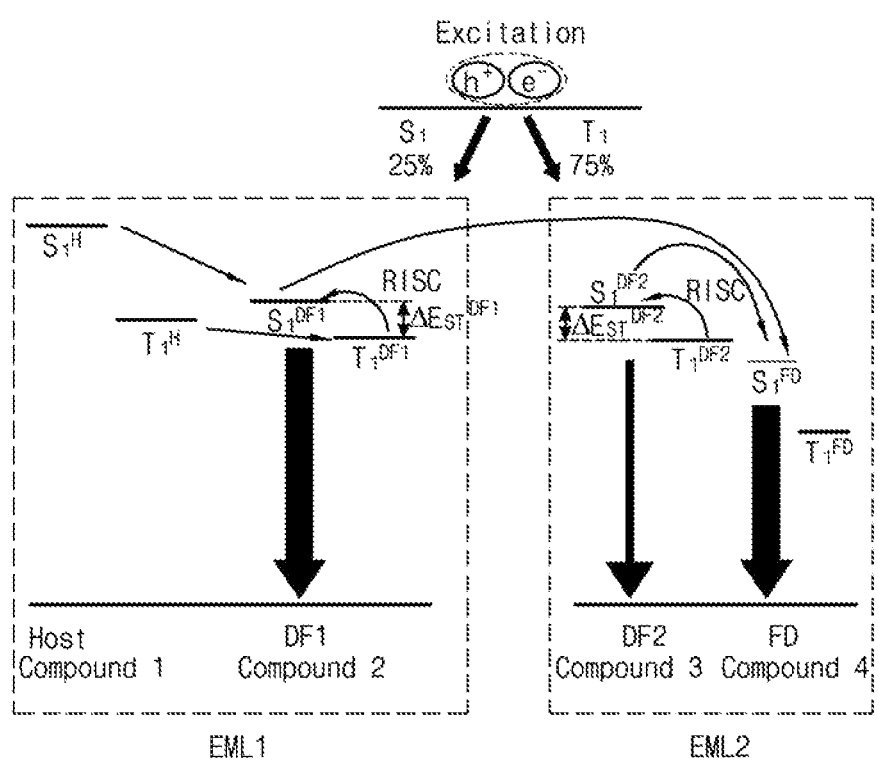
FIG. 4 is a schematic diagram illustrating luminous mechanism by energy levels among luminous materials in a double-layered EML that includes a fluorescent material in accordance with an exemplary embodiment of the present disclosure.
Figure 5:
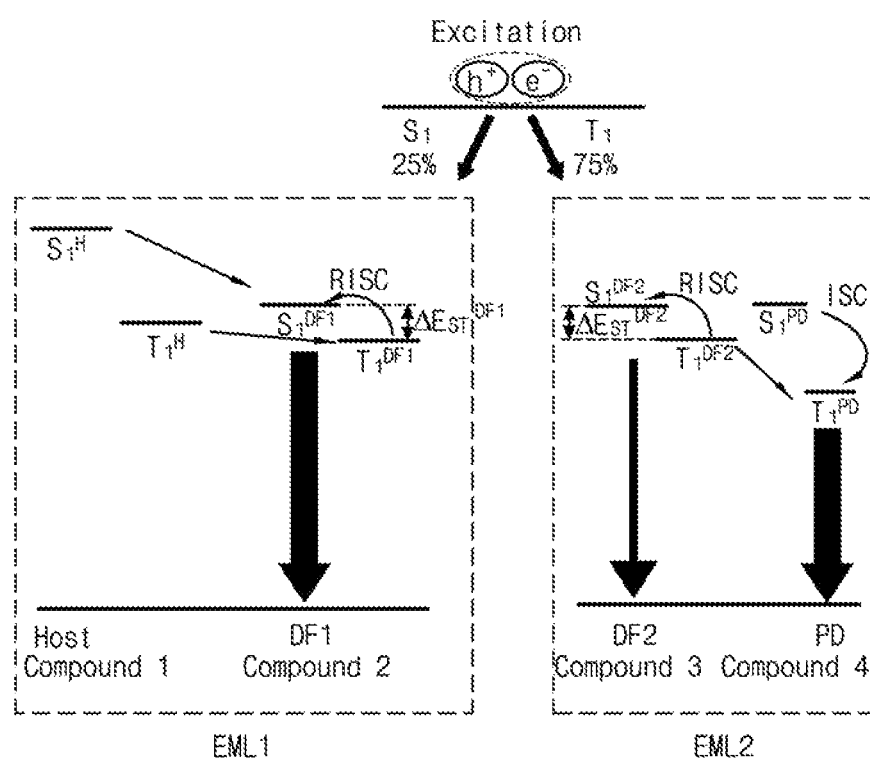
FIG. 5 is a schematic diagram illustrating luminous mechanism by energy levels among luminous materials in a double-layered EML that includes a phosphorescent material in accordance with an exemplary embodiment of the present disclosure.

In this exemplary embodiment, the OLED 300 includes a double-layered EML 360 having the EML1 362 and the EML2 364 each of which includes different kinds of luminous materials. In this case, it is necessary to adjust properly components, kinds, singlet energy levels, triplet energy levels, Highest Occupied Molecular Orbital (HOMO) energy levels and Lowest Unoccupied Molecular Orbital (LUMO) energy levels among the first to fourth compounds. FIG. 4 is a schematic diagram illustrating luminous mechanism by energy levels among luminous materials in a double-layered EML that includes fluorescent material in accordance with an exemplary embodiment of the present disclosure and FIG. 5 is a schematic diagram illustrating luminous mechanism by energy levels among luminous materials in a double-layered EML that includes a phosphorescent material in accordance with an exemplary embodiment of the present disclosure.

The EML1 362 includes a first compound, which may be a host, and a second compound, which may be a first delayed fluorescent material. The EML2 364 includes a third compound, which may be a second delayed fluorescent material, and a fourth compound, which may be a fluorescent or phosphorescent material. In one exemplary embodiment, the second compound in the EML1 362 may act as a dopant and the third compound the EML2 364 may act as a host. In one embodiment, the second compound has an energy level bandgap $\Delta E_{ST}^{DF1}$ between an excited state singlet energy level $S_1^{DF1}$ and an excited state triplet energy level $T_1^{DF1}$ equal to or less than about 0.3 eV so as to realize a delayed fluorescence. Besides, the third compound may have an energy level bandgap $\Delta E_{ST}^{DF2}$ between an excited state singlet energy level $S_1^{DF2}$ and an excited state triplet energy level $T_1^{DF2}$ equal to or less than about 0.3 eV so as to realize a delayed fluorescence. In one exemplary embodiment, the second compound may be the same, but are not limited to, as the third compound.

As such, when the triplet energy is converted to the singlet energy in the second compound, i.e. the first delayed fluorescent material in the EML1 362 by RISC mechanism, the singlet energy of the second compound can be transferred to the fourth compound, i.e. the fluorescent or phosphorescent material in the EML2 364, which is disposed adjacently to the EML1 362, by Foster resonance energy transfer (FRET) mechanism, which transfers exciton energies in a form of non-radiation through an electrical field by a dipole-dipole interaction. Besides, when the triplet energy is converted to the singlet energy in the third compound, i.e. the second delayed fluorescent material in the EML2 364 by RISC, the singlet energy of the third compound can be transferred to the fourth compound, i.e. the fluorescent or phosphorescent material in the EML2 364 via DRET mechanism.

To realize such luminescence, the exciton energy generated in the first compound, which may be a host, needs to be transferred to the second compound, which may be the first delayed compound, and to emit light. For example, each of an excited state singlet energy level $S_1^H$ and an excited state triplet energy level $T_1^H$ of the first compound is higher than each of the excited state singlet energy level $S_1^{DF1}$ and the excited state triplet energy level $T_1^{DF1}$ of the second compound, respectively. Moreover, each of the excited state singlet energy level $S_1^H$ and the excited state triplet energy level $T_1^H$ of the first compound may be higher than each of the excited state singlet energy level $S_1^{DF2}$ and the excited state triplet energy level $T_1^{DF2}$ of the third compound, respectively.

As an example, when the excited state triplet energy level $T_1^H$ of the first compound is not higher enough than the excited state triplet energy levels $T_1^{DF1}$ and $T_1^{DF2}$ of the second and/or third compounds, each of which may be a delayed fluorescent material, the excitons of the triplet state level $T_1^{DF1}$ and $T_1^{DF2}$ of the second and/or third compound can be reversely transferred to the excited state triplet energy level $T_1^H$ of the first compound. Accordingly, the excitons of the triplet state level $T_1^{DF1}$ and $T_1^{DF2}$ of the delayed fluorescent materials may be quenched as a non-emission and the triplet state excitons of the delayed fluorescent materials cannot be involved in the emission. For example, the excited state triplet energy level $T_1^H$ of the first compound may be high by at least 0.2 eV compared to the excited state triplet energy levels $T_1^{DF1}$ and $T_1^{DF2}$ of the second and/or third compounds.

In one exemplary embodiment, the first compound, which may be the host, may have the excited state singlet energy level $S_1^H$ of, but are not limited to, about 3.0 eV to about 3.5 eV, and the excited state triplet energy level $T_1^H$ of, but are not limited to, about 2.5 eV to about 3.0 eV, respectively. Each of the second and third compounds, each of which may be the delayed fluorescent material, may have the excited stated singlet energy levels $S_1^{DF1}$ and $S_1^{DF2}$ of, but are not limited to, about 2.3 eV to about 3.0 eV, and the excited state triplet energy levels $T_1^{DF1}$ and $T_1^{DF2}$ of, but are not limited to, about 2.1 eV to about 2.8 eV, respectively.

Besides, it may be necessary to transfer energy from the second compound, in which excitons of singlet and triplet energy levels are converted to the ICT state by RISC, in the EML1 362 to the fourth compound, which may be the fluorescent or phosphorescent material, in the EML2 364. Moreover, it may be necessary to transfer energy from the third compound, in which excitons of singlet and triplet energy levels are converted to the ICT state by RISC, to the fourth compound in the EML2 364. For realizing such exciton energy transfers, each of the excited state singlet energy levels $S_1^{DF1}$ and $S_1^{DF2}$ and the excited state triplet energy levels $T_1^{DF1}$ and $T_1^{DF2}$ of the second and third compound, which may be delayed fluorescent materials, respectively, is higher than each of the excited state singlet energy levels $S_1^{FD}$ and the excited state triplet energy levels $T_1^{FD}$ of the fourth compound, which is the fluorescent material.

Alternatively, each of the excited state singlet energy levels $S_1^{DF1}$ and $S_1^{DF2}$ of the second and third compounds may not be higher than an excited state singlet energy level $S_1^{PD}$ of the fourth compound, while each of the excited state triplet energy levels $T_1^{DF1}$ and $T_1^{DF2}$ of the second and third compound, which may be delayed fluorescent materials, respectively, may be higher than the excited state triplet energy levels $T_1^{PD}$ of the fourth compound, when the fourth compound in the EML2 364 is the phosphorescent material, as illustrated in FIG. 5.

As an example, the fourth compound, which may be the fluorescent material, may have the excited state singlet energy level $S_1^{FD}$ of, but are not limited to, about 2.3 eV to about 2.7 eV and have the excited triplet energy level $T_1^{FD}$ of, but are not limited to, about 2.1 eV to about 2.5 eV. Alternatively, the fourth compound, which may be the phosphorescent material, may have the excited state singlet energy level $S_1^{PD}$ of, but are not limited to, about 2.3 eV to about 2.8 eV, and have the excited triplet energy level $T_1^{PD}$ of, but are not limited to, about 2.0 eV to about 2.4 eV.

As described above, the EML 360 of the OLED 300 in accordance with an exemplary embodiment of the present disclosure includes the EML1 362 including the first compound as the host and the second compound as the first delayed fluorescent material, and the EML2 364 including the third compound as the second delayed fluorescent material and the fourth compound as the fluorescent or phosphorescent material.

The triplet exciton energy, generated in the second compound in the EML1 362, can be transferred to the fourth compound in the EML2 364 located adjacently to the EML1 362 though FRET mechanism, which occurs very slowly, i.e. within about $10^{-10}$ to about $10^{-7}$ seconds, compared to DRET mechanism, which occurs rapidly within about $10^{-11}$ to $10^{-9}$ seconds.

The rate of converting the triplet exciton energy to the singlet exciton energy of the second compound by RISC is substantially the same as the rate of transferring the triplet exciton energy of the second compound to the triplet exciton energy of the fourth compound by FRET. A significant amount of the triplet energy generated in the second compound is not directly transferred to the fourth compound by FRET mechanism, but is converted to the own singlet energy of the second compound by RISC mechanism. Since the triplet energy as well as the singlet energy in the second compound can be transferred to the fourth compound, the EML 360 may exhibit maximal internal quantum efficiency and the OLED 300 may enhance its luminous efficiency. In addition, the OLED 300 can improve its color continuity because the light emission are caused by the fourth compound as well as by the second compound that has a different luminescence wavelength range from that of the fourth compound.

Moreover, the reduction in the luminous efficacy due to the DRET phenomenon does not occur even if the doping concentration of the fourth compound in EML2 364 is 1% by weight or more. As the doping concentration of the fourth compound, which is a final dopant, is increased, the luminescence spectrum is not changed at a minute difference in the doping concentration (for example, a concentration difference±0.2 wt %). Accordingly, a uniform luminescence spectrum across the entire region of the OLED 300 can be secured even if there is a slight difference in the doping concentration of the fourth compound in a certain region of the EML 360. In other words, since the doping concentration of the fluorescent or phosphorescent material, which is substantially the final dopant, can be increased, a uniform luminescence spectrum can be realized despite the difference in the doping concentration in a relatively wide range in accordance of the present disclosure.

In one exemplary embodiment, it is necessary to adjust appropriately a Highest Occupied Molecular Orbital (HOMO) energy levels and Lowest Unoccupied Molecular Orbital (LUMO) energy levels between the first compound, which is a host, and the second compound, which is the first delayed fluorescent material in the EML1 362. As an example, an energy level bandgap ($|HOMO^H-HOMO^{DF1}|$) between a Highest Occupied Molecular Orbital energy level ($HOMO^H$) of the first compound and a Highest Occupied Molecular Orbital energy level ($HOMO^{DF1}$) of the second compound, or an energy level bandgap ($|LUMO^H-LUMO^{DF1}|$) between a Lowest Unoccupied Molecular Orbital energy level ($LUMO^H$) of the first compound and a Lowest Unoccupied Molecular Orbital energy level ($LUMO^{DF1}$) of the second compound may be equal to or less than about 0.5 eV, for example, between about 0.1 eV to about 0.5 eV. In this case, the charges can be moved efficiently from the first compound, which can be the host, to the second compound, which can be the first delayed material, and thereby enhancing the luminous efficiency of the OLED 300.

In another exemplary embodiment, the HOMO energy level $HOMO^H$ of the first compound, which may be the host, is deeper or lower than the HOMO energy level $HOMO^{DF}$ of the second and third compounds, each of which may respectively be the delayed fluorescent material. When the delayed fluorescent material is used in the EML 360, the delayed fluorescent material is doped to about 10% by weight or more in order to maximize the luminous efficiency. In this case, the probability that holes and electrons are directly into the dopant is increased. Accordingly, when the $HOMO^H$ of the first compound, which may be the host for the EML1 362, is higher than the $HOMO^{DF1}$ of the second compound, which may be the dopant for the EML1 362, holes are injected into the $HOMO^H$ of the host, while electrons are injected into the $LUMO^{DF1}$ of the first delayed fluorescent material so that an excited complex (exciplex) between the host and the delayed fluorescent material is formed in the EML1 362. Accordingly, the triplet exciton energy of the delayed fluorescent material does not contribute to the light emission mechanism, i.e. is quenched as a non-emission and the OLED 300 may have lower luminous efficiency.

On the other hand, when the first compound having a HOMO energy level relatively lower than the HOMO energy level of the second compound, which may be the first delayed fluorescent material, is used as a host, the formation of an exciplex between the first compound, which may be the host, and the second compound, which may be the first delayed fluorescent material, in the EML1 362 can be inhibited.

In an alternative embodiment, the EML1 362 may be disposed between the EML2 364 and the second electrode 320. In this embodiment, it is necessary to prevent electrons from being directly transferred to the second compound, which may be the delayed fluorescent material, to form exciplex in the EML1 362. In one exemplary embodiment, the LUMO energy level $LUMO^H$ of the first compound is shallower or higher than the LUMO energy level $LUMO^{DF1}$ of the second compound. For example, when a HOMO-LUMO energy bandgap HOMO-$LUMO^{DF1}$ of the second compound, which may be the first delayed fluorescent material, is located between a HOMO-LUMO energy bandgap HOMO-$LUMO^H$ of the first compound, which may be the host, exciplex between the first compound, which may be the host, and the second compound, which may the first delayed fluorescent material, is not formed in the EML1 362 irrespective of the second compound concentration. Accordingly, the triplet exciton energy of the first delayed fluorescent material is not quenched as a non-emission and the emission efficiency of the OLED 300 may be enhanced.

In one exemplary embodiment, the first compound, which may be the host, may have the HOMO energy level $HOMO^H$ of, but is not limited to, about −5.5 eV to about −6.0 eV, preferably about −5.7 eV to about −5.9 eV and have the LUMO energy level $LUMO^H$ of, but is not limited to, about −2.0 eV to about −2.5 eV, preferably about −2.0 eV to about −2.4 eV. Moreover, each of the second and third compounds, which may be the delayed fluorescent materials, may have the HOMO energy level $HOMO^{DF}$ of, but is not limited to, −5.7 eV to about −6.0 eV and have the LUMO energy level $LUMO^{DF}$ of, but is not limited to, about −2.8 eV to about −3.5 eV, respectively.

In another exemplary embodiment, the fourth compound, which may be the fluorescent material, may have a HOMO energy level $HOMO^{FD}$ of, but is not limited to, about −5.2 eV to about −5.7 eV, preferably about −5.3 eV to about −5.6 eV and has a LUMO energy level $LUMO^{FD}$ of, but is not limited to, about −3.0 eV to about −3.5 eV. Also, the fourth compound, which may be the phosphorescent material, may have a HOMO energy level $HOMO^{PD}$ of, but is not limited to, about −5.6 eV to about −6.0 eV and have a LUMO energy level $LUMO^{PD}$ of, but is not limited to, about −3.0 eV to about −3.3 eV.

In one exemplary embodiment, the first compound may include, but are not limited to, mCP, mCBP, CBP, and/or 1,3,5-Tri[(3-pyridyl)-phen-3-yl]benzene (TmPyPB). In another exemplary embodiment, the first compound, which may be the host, may include, but are not limited to, an organic compound represented by Chemical Formula 1:

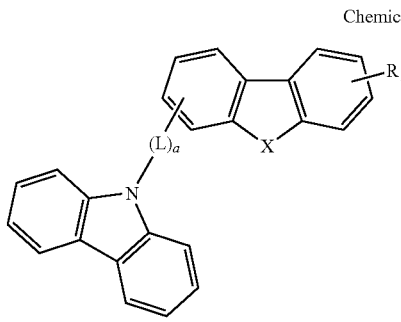

Chemical Formula 1

In Chemical Formula 1, $R_1$ is hydrogen, deuterium, tritium, $C_5$~$C_{30}$ aryl group unsubstituted or substituted with $C_5$~$C_{30}$ aromatic group, or $C_4$~$C_{30}$ hetero aryl group unsubstituted or substituted with $C_5$~$C_{30}$ aromatic group. X is nitrogen, oxygen or sulfur. L is $C_5$~$C_{30}$ arylene group or $C_4$~$C_{30}$ hetero arylene group and a is 1 or 2.

Particularly, the first compound, which may be used as the host of the EML1 362, may include, but are not limited to, anyone of the following structure of Chemical Formula 2:

Chemical Formula 2

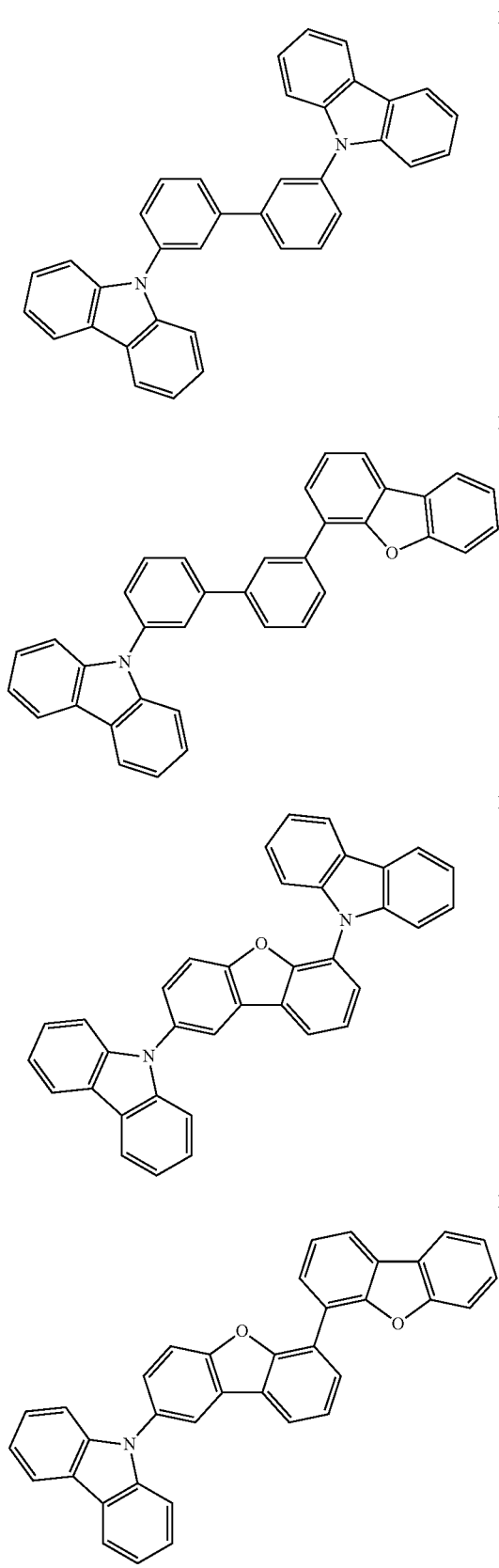

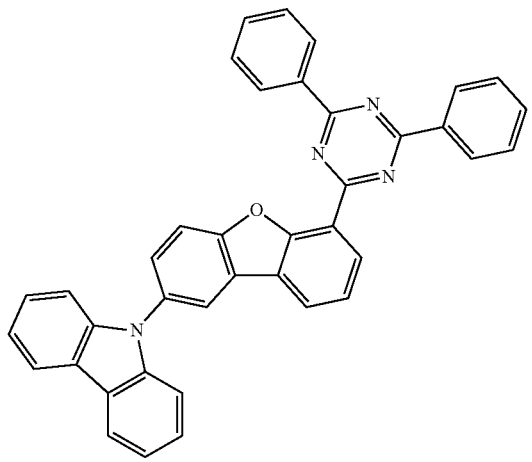

Each of the organic compound represented by Chemical Formula 2 has energy levels as follows: H-1 (mCBP; $S_1$: 3.2 eV; $T_1$: 2.9 eV; HOMO: −5.8 eV; LUMO: −2.4 eV); H-2($S_1$: 3.2 eV; $T_1$: 2.9 eV; HOMO: −5.9 eV; LUMO: −2.4 eV); H-3($S_1$: 3.2 eV; $T_1$: 2.9 eV; HOMO −5.8 eV; LUMO: −2.5 eV); H-4($S_1$: 3.1 eV; $T_1$: 2.9 eV; HOMO: −5.8 eV; LUMO: −2.5 eV); and H-5($S_1$: 3.1 eV; $T_1$: 2.8 eV; HOMO: −5.9 eV; LUMO: −2.8 eV).

In another exemplary embodiment, the first compound may be the same material as the EBL 355 (See, FIG. 2). As an example, the material of the EBL 355 usable as the first compound has a HOMO energy level $HOMO^{EBL}$ lower than the HOMO energy level $HOMO^{DF1}$ of the second compound and an excited state triplet energy level $T_1^{EBL}$ higher than the excited state triplet energy level $T_1^{DF1}$ of the second compound. In this case, the EML1 362 may have an electron blocking function as well as an emission function. In other words, the EML1 362 can act as a buffer layer for blocking electrons. In one embodiment, the EBL 355 may be omitted where the EML1 362 may be an electron blocking layer as well as an emitting material layer.

In another exemplary embodiment, the first compound of the EML1 362 may be the same material as the HBL 375 when the EML1 362 is disposed between the EML2 364 and the second electrode 320. As an example, the material of the HBL 375 usable as the first compound has a LUMO energy level $LUMO^{HBL}$ higher than the LUMO energy level $LUMO^{DF1}$ of the second compound and an excited state triple energy level $T_1^{HBL}$ higher than the excited state triplet energy level $T_1^{DF1}$ of the second compound. In this case, the EML1 362 may have a hole blocking function as well as an emission function. In other words, the EML1 362 can act as a buffer layer for blocking hole. In one embodiment, the HBL 375 may be omitted where the EML1 362 may be a hole blocking layer as well as an emitting material layer.

The second and/or third compounds, each of which may be the delayed fluorescent material, may include a moiety acting as an electron acceptor and another moiety acting as an electron donor separated from the electron acceptor via an appropriate linker (e.g. homo arylene group such as phenylene). In one exemplary embodiment, each of the second and third compounds may have a triazine core or an aromatic core substituted with at least one cyano group, respectively. Particularly, each of the second and third compounds respectively may include, but are not limited to, at least one organic compound having the following structure of Chemical Formula 3:

Chemical Formula 3

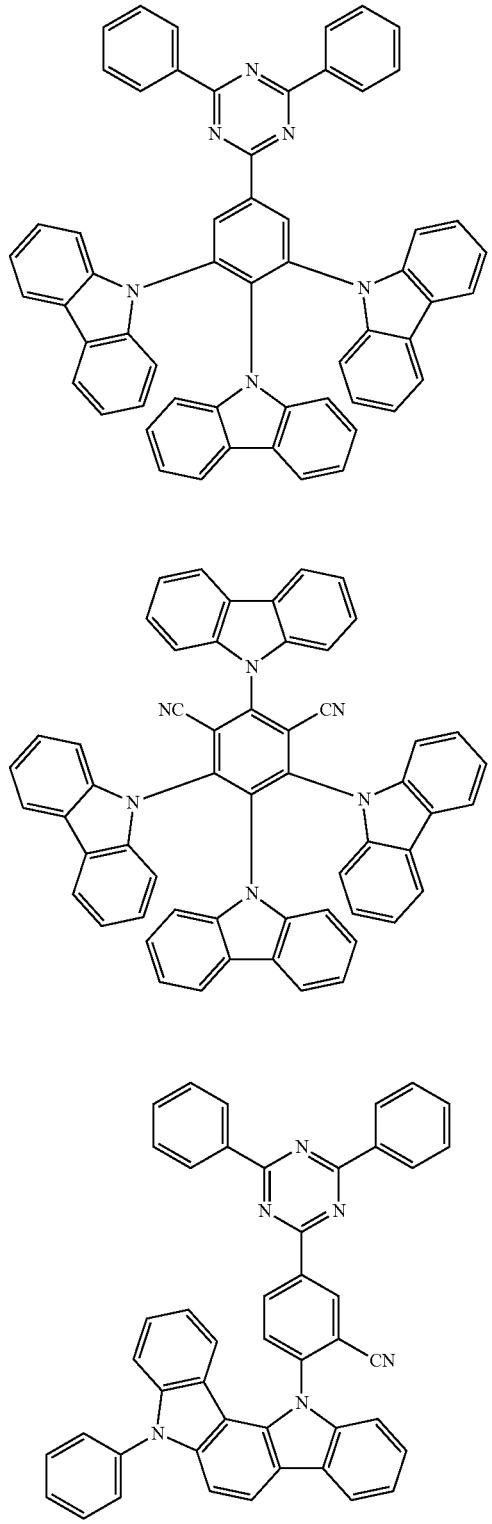

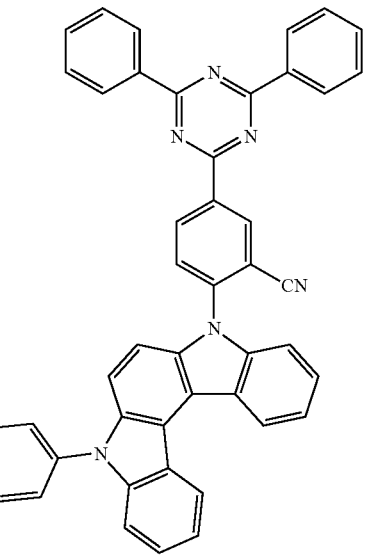

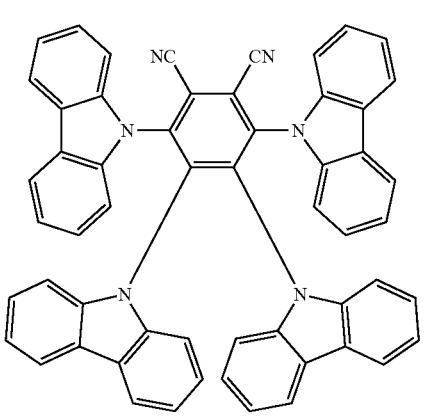

Each of the organic compound exhibiting a delayed fluorescence represented by Chemical Formula 3 has energy levels as follows: DF-1(TczTrz; 9,9',9"-(5-(4,6-diphenyl-1,3,5-triazin-2-yl)benzene-1,2,3-triyl) tris(9H-carbazole); $S_1$: 3.0 eV; $T_1$: 2.8 eV; LUMO: −2.8 eV; HOMO: −5.8 eV), DF-2(4CzIPN; 2,4,5,6-Tetra(9H-carbazol-9-yl)isophthalonitrile; $S_1$: 2.7 eV; $T_1$: 2.6 eV; LUMO: −3.4 eV; HOMO: −5.9 eV), DF-3($S_1$: 2.6 eV; $T_1$: 2.5 eV; LUMO: −3.2 eV; HOMO: −5.8 eV), DF-4($S_1$: 2.4 eV; $T_1$: 2.2 eV; LUMO: −3.2 eV; HOMO: −5.8 eV); and DF-5($S_1$: 2.3 eV; $T_1$: 2.1 eV; LUMO: −3.4 eV; HOMO: −5.8 eV).

In an exemplary embodiment, the fourth compound as the fluorescent or phosphorescent material may include, but are not limited to, materials having large absorption wavelength range in the overlapping region with a luminescence wavelength range of the second and third compounds as the delayed fluorescent materials. In this case, energy transfer efficiency from the second and third compound as the delayed fluorescent material to the forth compound as the fluorescent or phosphorescent material is enhance, thereby, maximizing the luminous efficiency of the OLED 300. In one exemplary embodiment, the fourth compound as the fluorescent material may include, but is not limited to, anyone of an organic compound having the flowing structure of Chemical Formula 4:

Chemical Formula 4

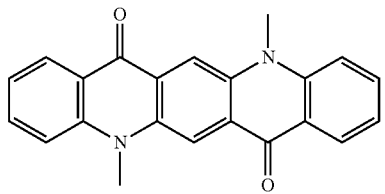
FD-1

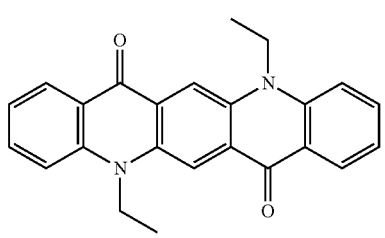
FD-2

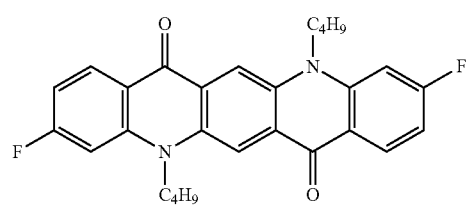
FD-3

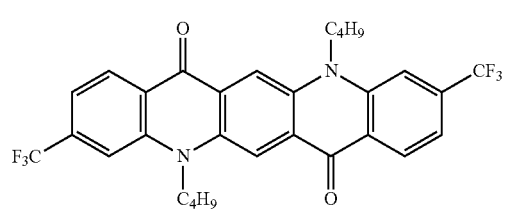
FD-4

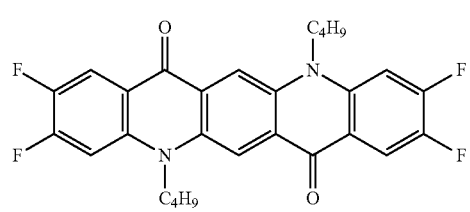
FD-5

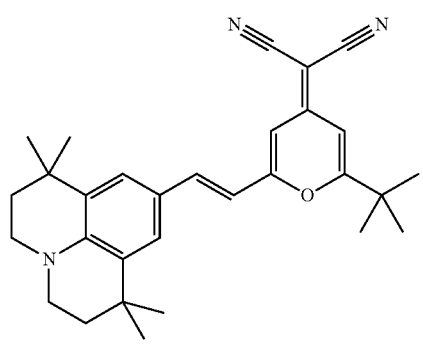
FD-6

Each of the organic compounds represented by Chemical Formula 4 has energy levels as follows: FD-1(5,12-dimethylquinolino[2,3-b]acridine-7,14(5H, 12H)-dione; $S_1$: 2.3 eV; $T_1$: 2.0 eV; LUMO: −3.0 eV; HOMO: −5.4 eV); FD-2(5,12-diethylquinolino[2,3-b]acridine-7,14(5H, 12H)-dione; $S_1$: 2.3 eV; $T_1$: 2.2 eV; LUMO: −3.0 eV; HOMO: −5.4 eV); FD-3(5,12-dibutyl-3,10-difluoroquinolino[2,3-b]acridine-7,14(5H, 12H)-dione; $S_1$: 2.2 eV; $T_1$: 2.0 eV; LUMO: −3.1 eV; HOMO: −5.5 eV); FD-4(5,12-dibutyl-3,10-bis(trifluoromethyl)quinolino[2,3-b]acridine-7,14(5H, 12H)-dione; $S_1$: 2.2 eV; $T_1$: 2.0 eV; LUMO: −3.1 eV; HOMO: −5.5 eV); FD-5 (5,12-dibutyl-2,3,9,10-tetrafluoroquinolino[2,3-b]acridine-7,14(5H, 12H)-dione; $S_1$: 2.0 eV; $T_1$: 1.8 eV; LUMO: −3.3 eV; HOMO: −5.5 eV); FD-6(1,1,7,7-tetramethyl-2,3,6,7-tetrahydro-1H, 5H-benzo[ij]quinolizin-9-yl)ethenyl]-4H-pyran-4-ylidene}propanedinitrile; DCJTB; $S_1$: 2.3 eV; $T_1$: 1.9 eV; LUMO: −3.1 eV; HOMO: −5.3 eV).

In an alternative embodiment, the fourth compound as the phosphorescent material may include, but is not limited to, any metal complexes emitting green (G) light. As an example, the fourth compound as the phosphorescent material may include, but are not limited to, at least one metal complex having the following structure of Chemical Formula 5:

Chemical Formula 5

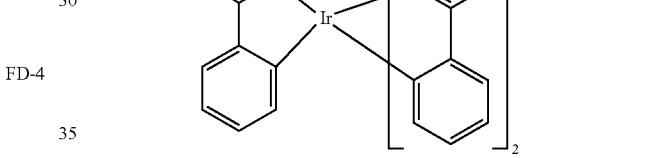
PD-1

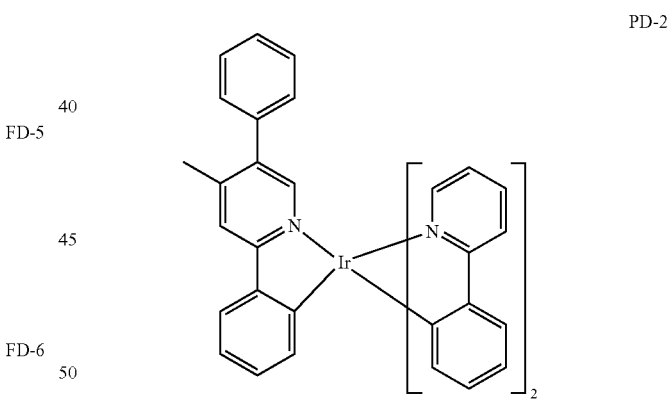
PD-2

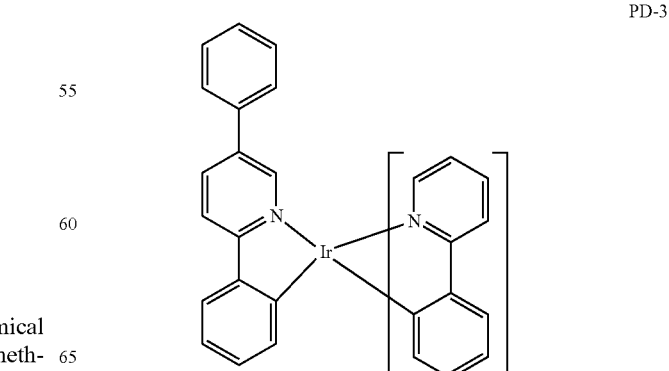
PD-3

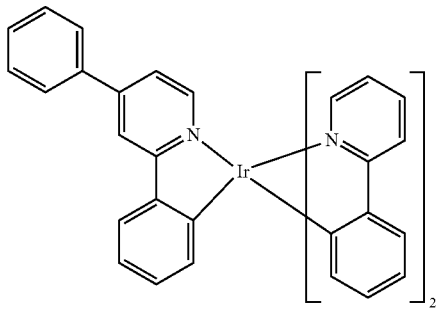

PD-4

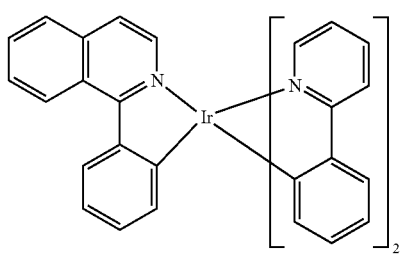

Pd-5

Each of the metal complexes represented by Chemical Formula 5 has energy levels as follows: PD-1($S_1$: 2.8 eV; $T_1$: 2.4 eV; LUMO: −3.0 eV; HOMO: −6.0 eV); PD-2($S_1$: 2.6 eV; $T_1$: 2.4 eV; LUMO: −3.0 eV; HOMO: −5.9 eV); PD-3 ($S_1$: 2.6 eV; $T_1$: 2.3 eV; LUMO: −3.2 eV; HOMO: −5.8 eV); PD-4($S_1$: 2.4 eV; $T_1$: 2.2 eV; LUMO: −3.1 eV; HOMO: −5.8 eV); and PD-5($S_1$: 2.3 eV; $T_1$: 2.0 eV; LUMO: −3.2 eV; HOMO: −5.6 eV).

In one exemplary embodiment, the weight ratio of the first compound may be equal to or more than the weight ratio of the second compound in the EML1 362. As an example, the EML1 362 may include, but is not limited to, the first compound of about 50 to about 95% by weight, preferably about 60 to about 80% by weight, and the second compound of about 5 to about 50% by weight, preferably about 20 to about 40% by weight. When the contents of the second compound as the first delayed fluorescent material is larger than the contents of the first compound as the host, the self-quenching phenomenon of the delayed fluorescent material may lower the luminous efficiency of the OLED 300.

In another embodiment, the weight ratio of the third compound may be more than the weight ratio of the fourth compound in the EML2 364. As an example, the EML2 364 may include, but is not limited to, the third compound of about 90 to about 99% by weight, preferably about 95 to about 99% by weight, and the fourth compound of about 1 to about 10% by weight, preferably about 1 to about 5% by weight.

In an alternative embodiment, the weight ratio of the second compound as the first delayed fluorescent material in the EML1 362 may be more than the weight ratio of the fourth compound as the fluorescent or phosphorescent material in the EML2 364. Accordingly, exciton energy can be transferred sufficiently to the fourth compound as the fluorescent or phosphorescent material in the EML2 364 from the second compound as the delayed fluorescent material in the EML1 362 through FRET mechanism.

In one exemplary embodiment, each of the EML1 362 and the EML2 364 may be laminated with a thickness of, but are not limited to, about 5 nm to about 100 nm, preferably about 10 nm to about 30 nm, and more preferably about 10 nm to about 20 nm.

The triplet exciton energy generated in the second compound, which may be the first delayed fluorescent material, in the EML1 362 not converted to the singlet energy of the second compound, may be transferred to the triplet energy of the fourth compound, which may be the fluorescent or phosphorescent material in the EML2 364. Since the triplet energy of the fluorescent material cannot participate in the emission process, the triplet exciton of the fluorescent material is quenched as a non-emission and the quantum efficiency of the OLED 300 may decrease.

In order to prevent such a decrease in the quantum efficiency, an energy control layer (ECL) may be disposed between the EML1 362 and the EML2 364. The ECL may include a material having an excited state triplet energy level higher than the excited state triplet energy level $T_1^{DF1}$ of the second compound. As an example, the ECL may include, but are not limited to, an organic compound represented by the following Chemical Formula 6 or Chemical Formula 7:

Chemical Formula 6

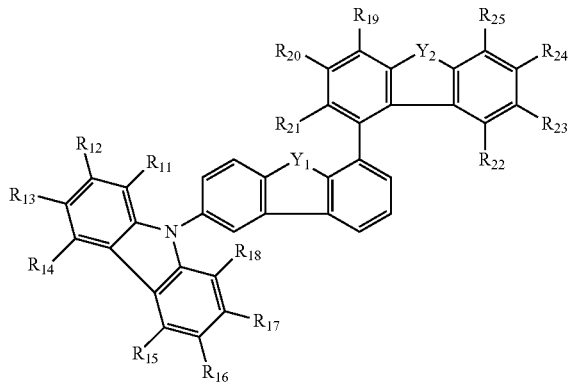

Chemical Formula 7

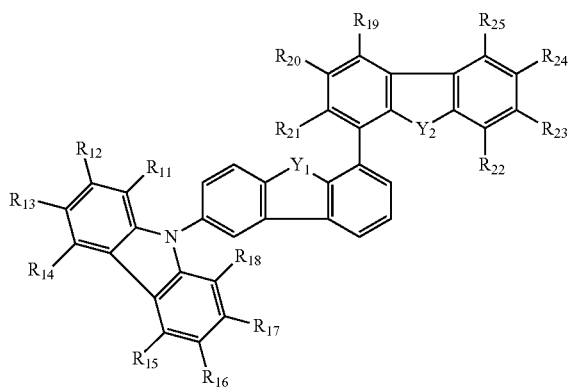

In Chemical Formulae 6 and 7, each of $R_{11}$ to $R_{25}$ is independently hydrogen, deuterium, tritium, silyl group, $C_1$~$C_{20}$ alkyl group, $C_1$~$C_{20}$ alkoxy group, $C_1$~$C_{20}$ alkyl amino group, $C_5$~$C_{30}$ aryl group, $C_4$~$C_{30}$ hetero aryl group, $C_5$~$C_{30}$ alkyl aryl group, $C_4$~$C_{30}$ hetero alkyl aryl group, $C_5$~$C_{30}$ aryloxyl group, $C_4$~$C_{30}$ hetero aryloxyl group, $C_5$~$C_{30}$ aryl amino group or $C_4$~$C_{30}$ hetero aryl amino group, or two adjacent groups among $R_{11}$ to $R_{25}$ forms $C_{10}$~$C_{30}$ fused aromatic or hetero aromatic ring, wherein each of the fused aromatic and hetero aromatic rings is unsubstituted or substituted with $C_5$~$C_{30}$ aryl group or $C_4$~$C_{30}$ hetero aryl group, respectively. Each of $Y_1$ and $Y_2$ is independently oxygen (O) or sulfur (S).

Particularly, the organic compound usable as the ECL may include, but are not limited to, any organic compound having the following structure of Chemical Formula 8:

Chemical Formula 8

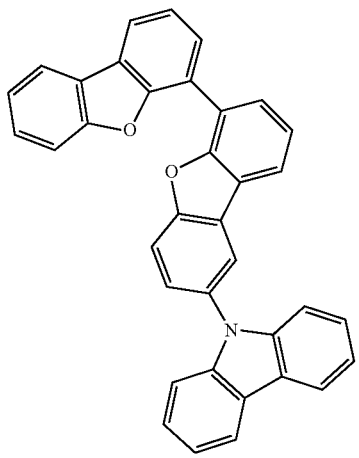

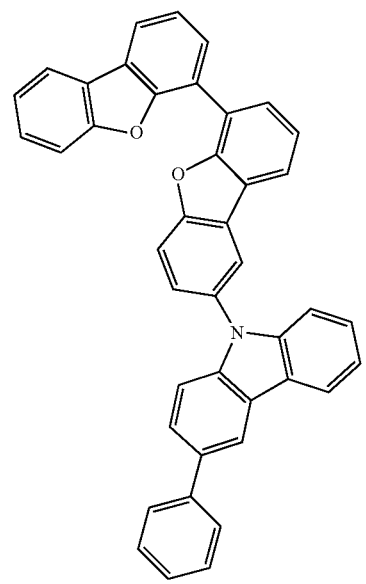

-continued

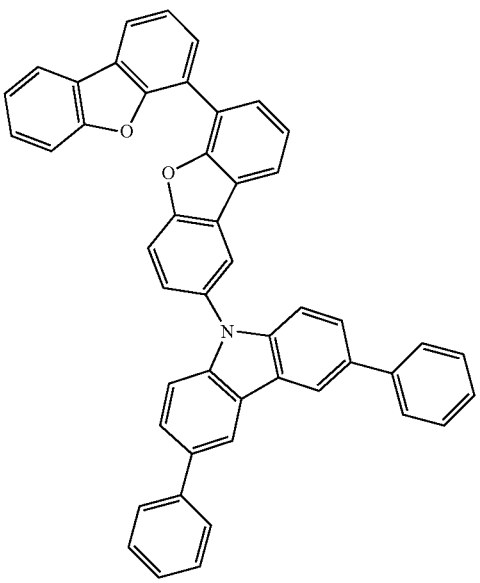

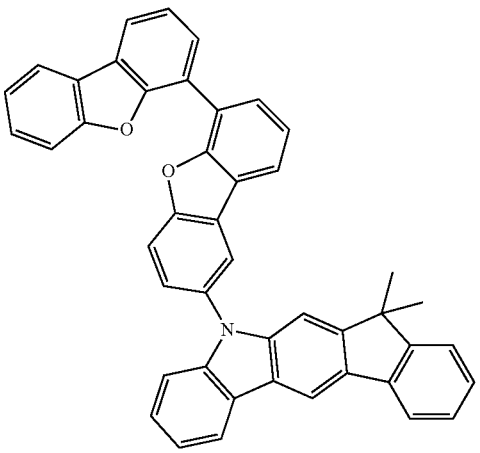

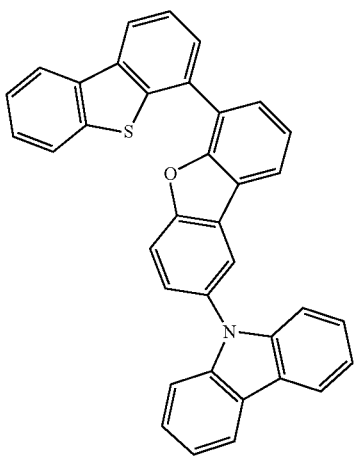

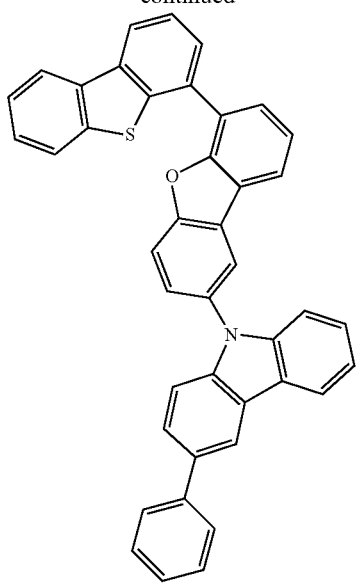
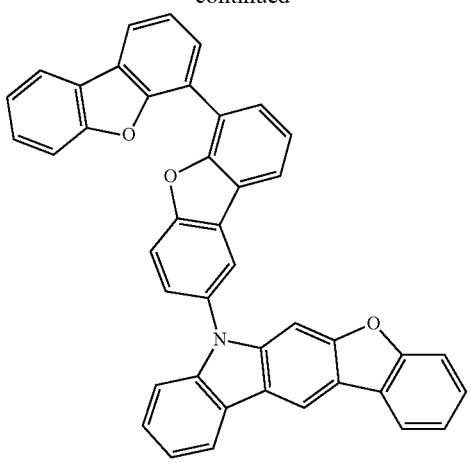
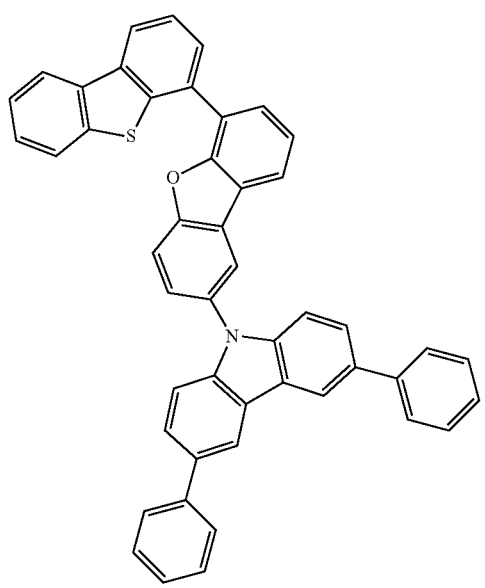
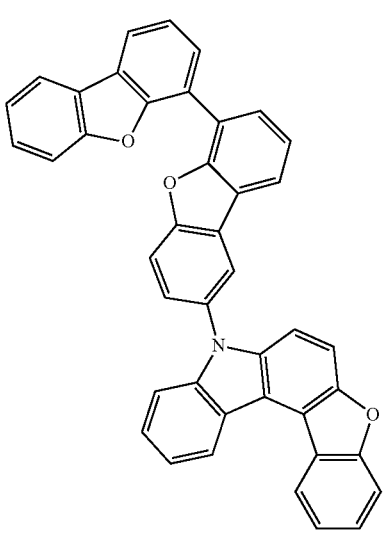
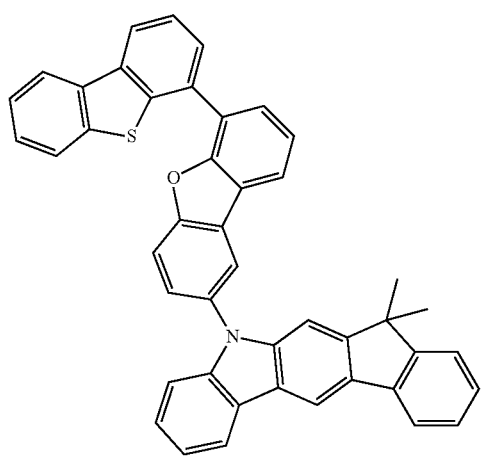
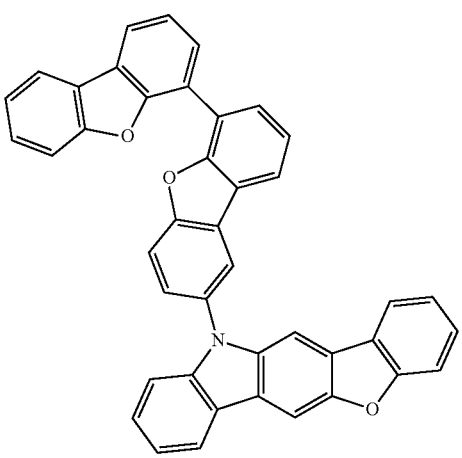

-continued
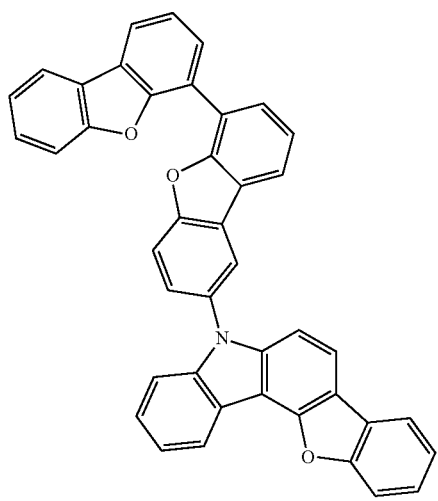
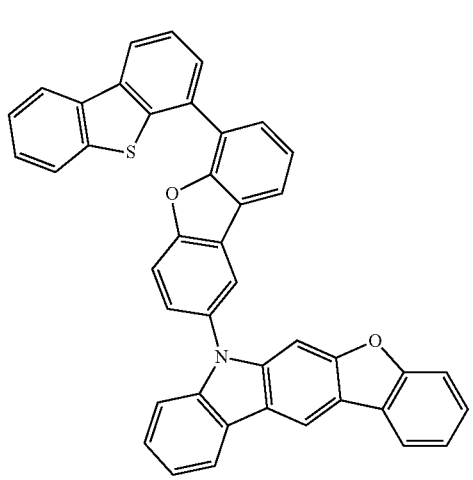
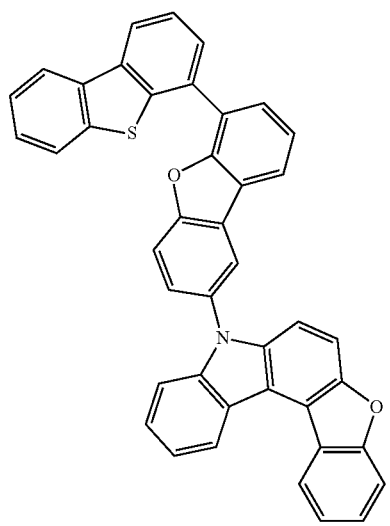
-continued
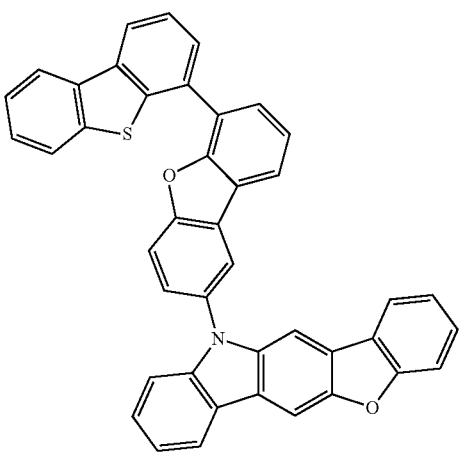
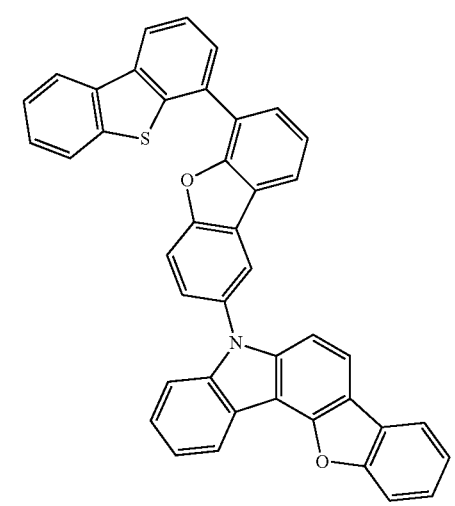

31
-continued
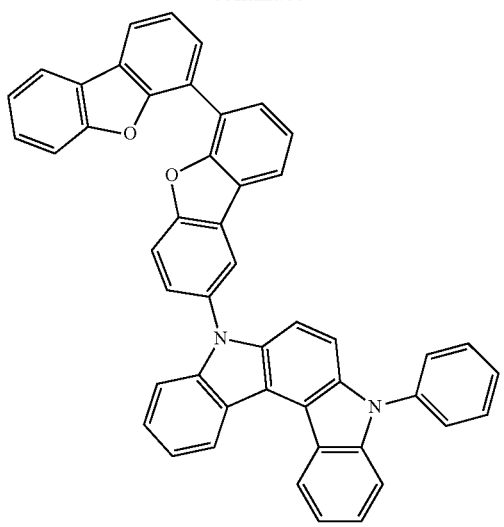
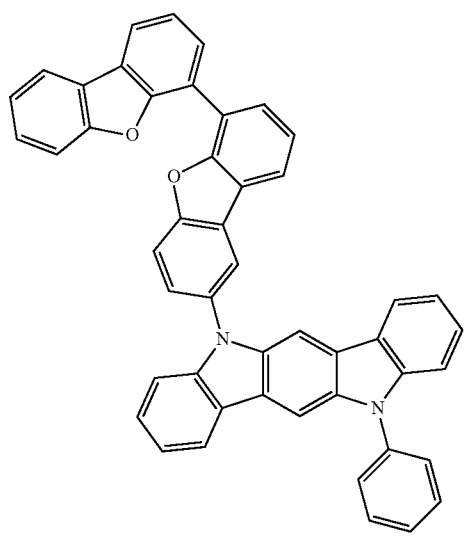
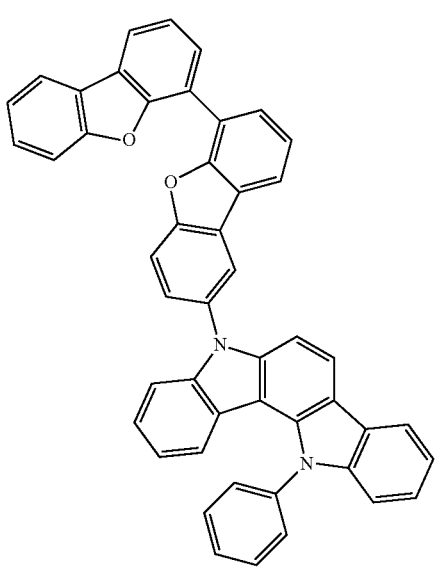
32
-continued
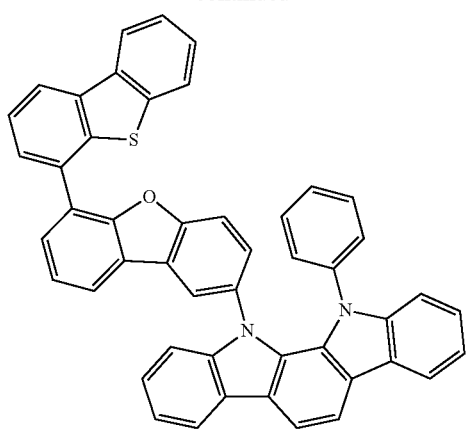
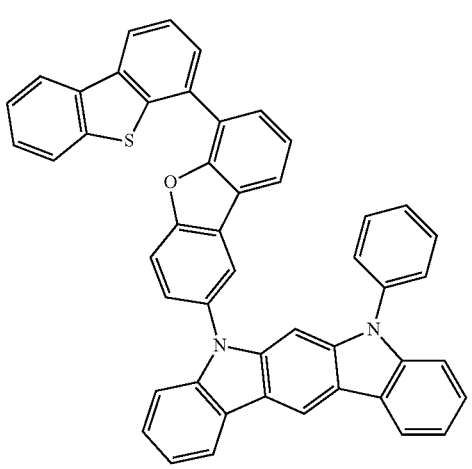
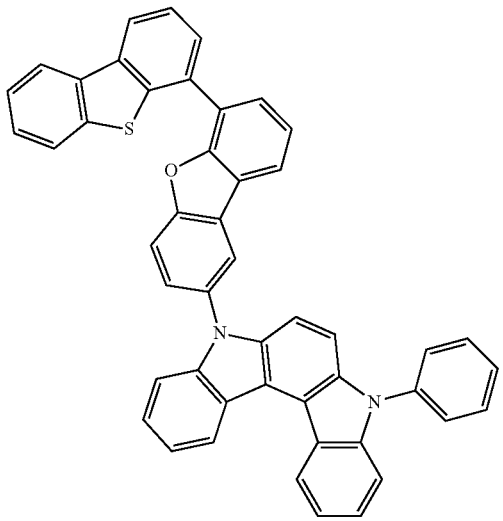

-continued
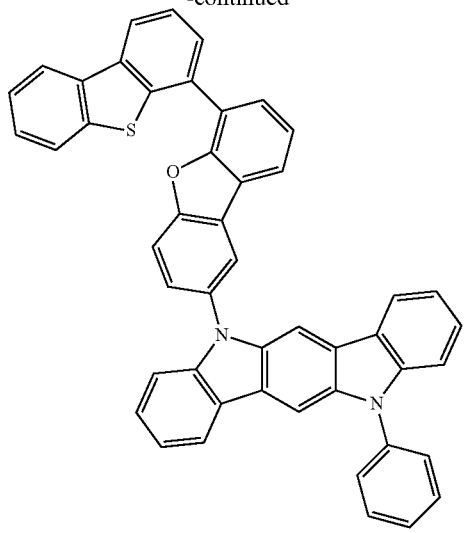
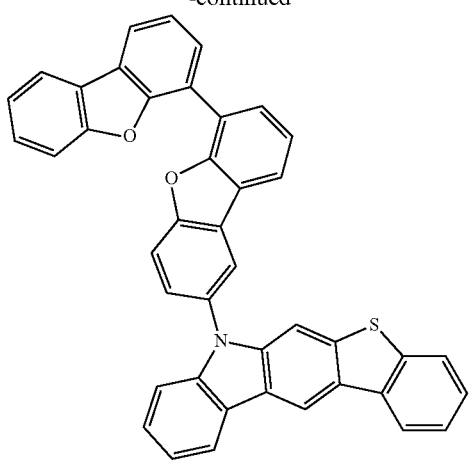
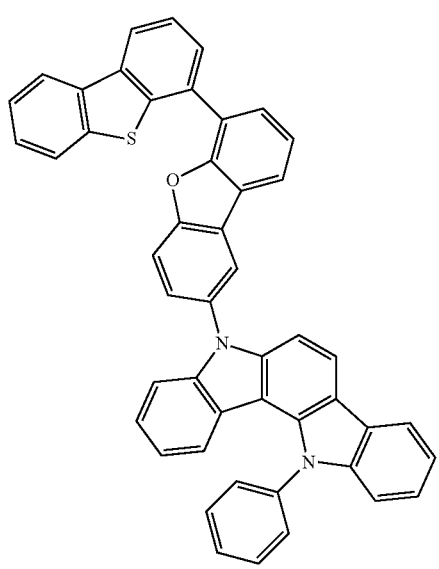
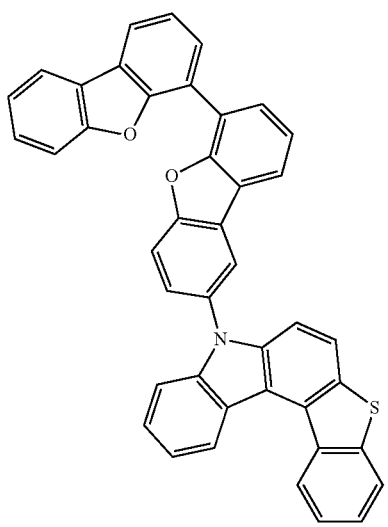
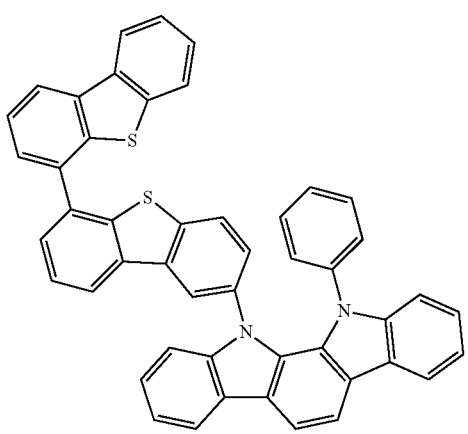
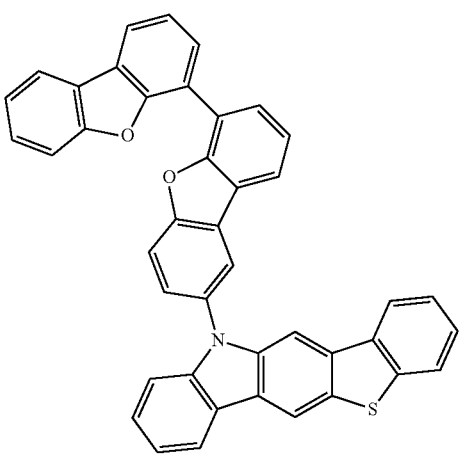

35
-continued
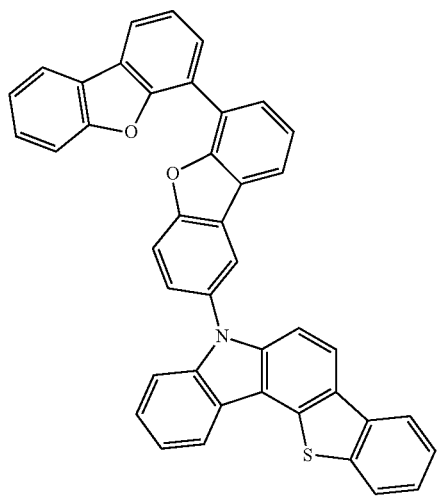
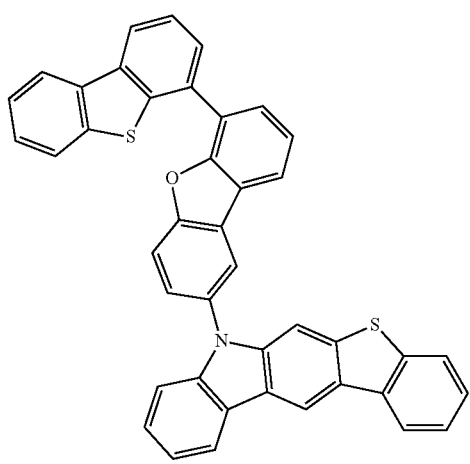
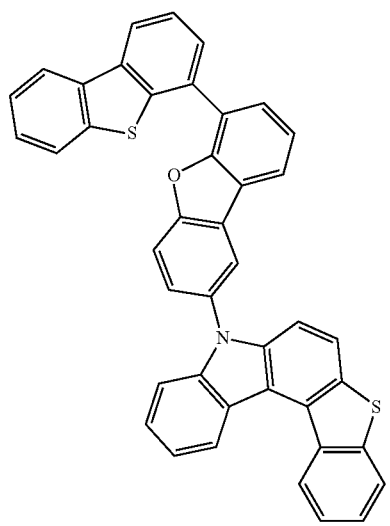
36
-continued
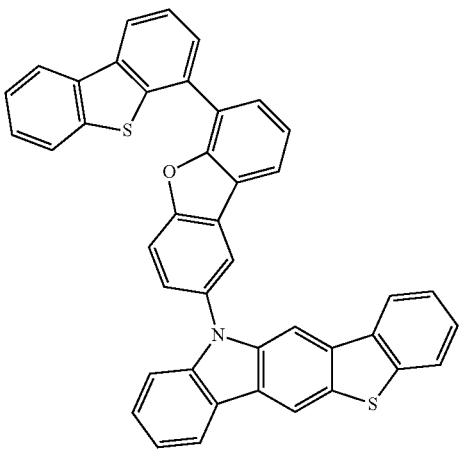
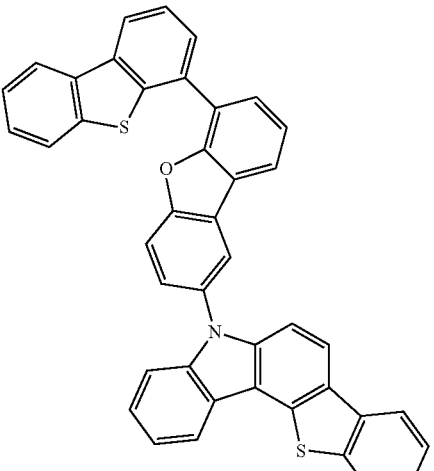
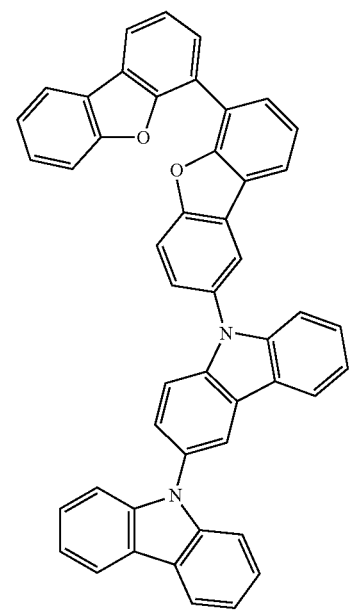

37
-continued
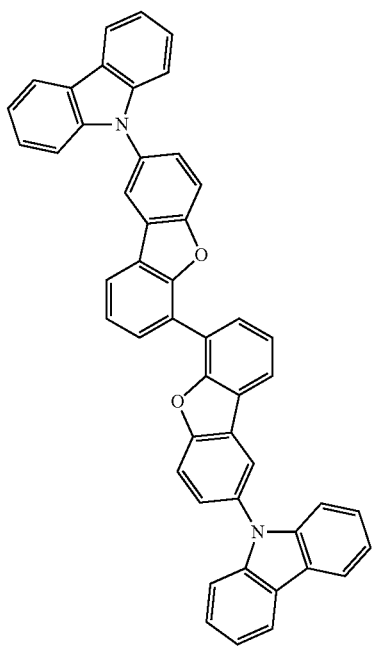
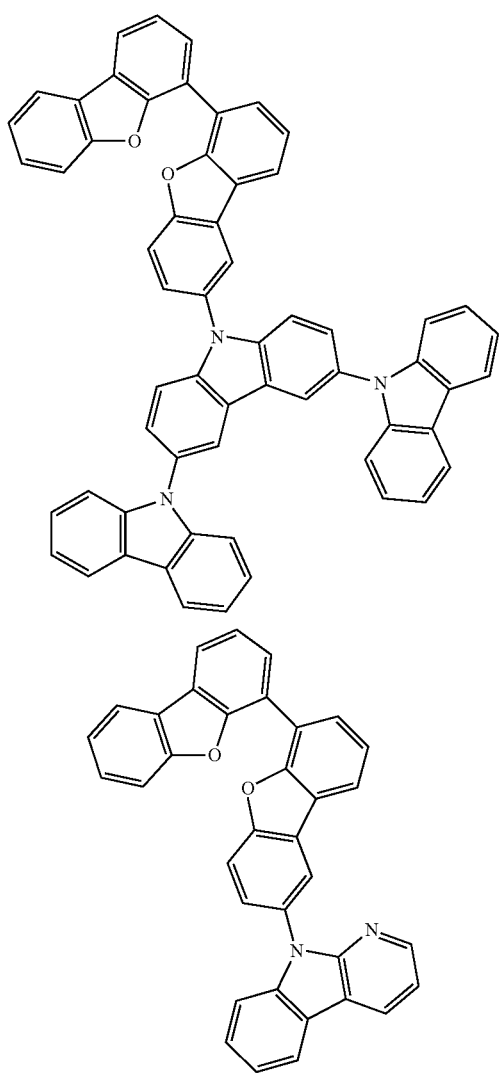
38
-continued
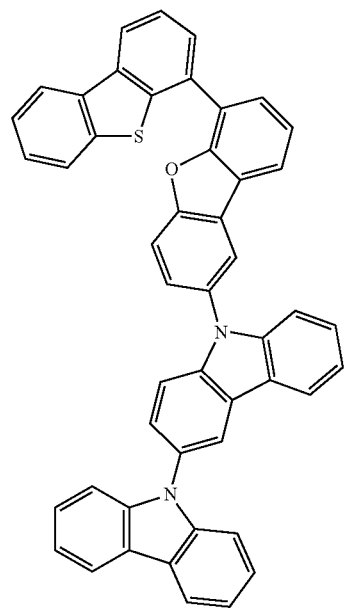
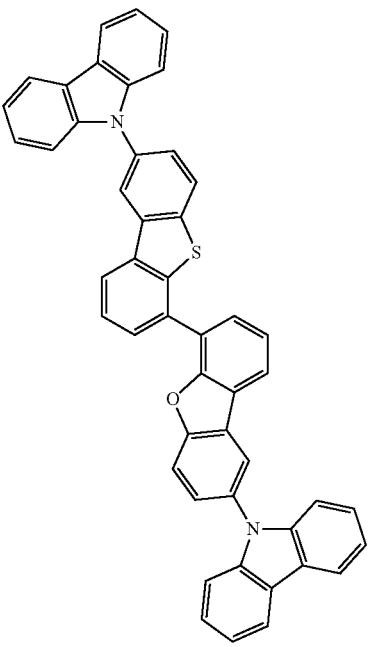

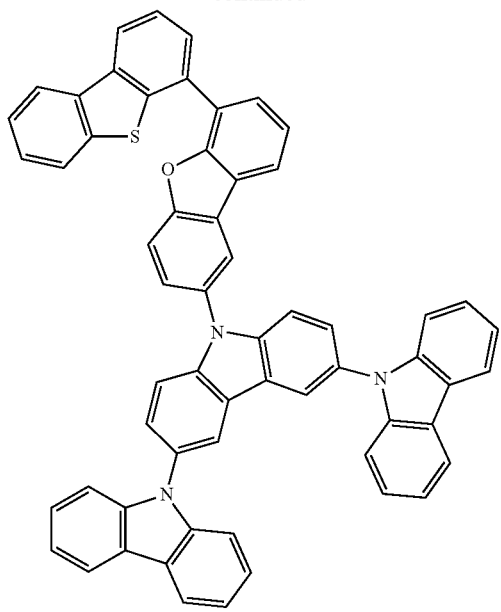
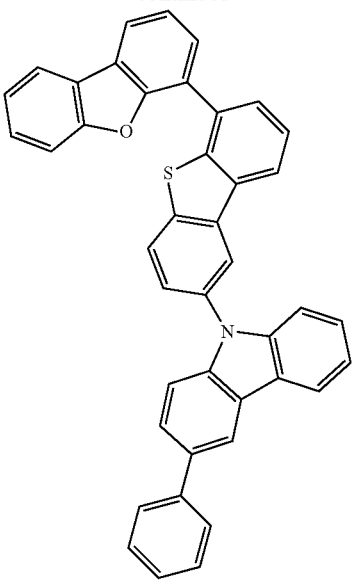
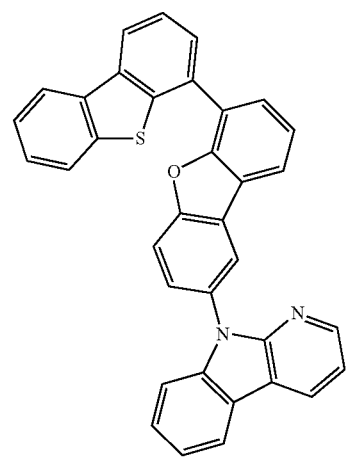
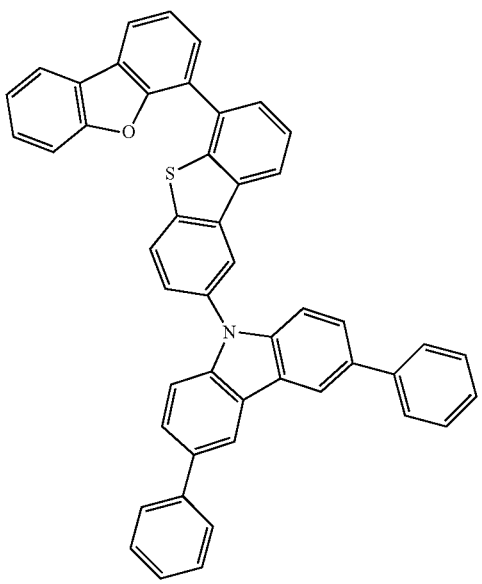
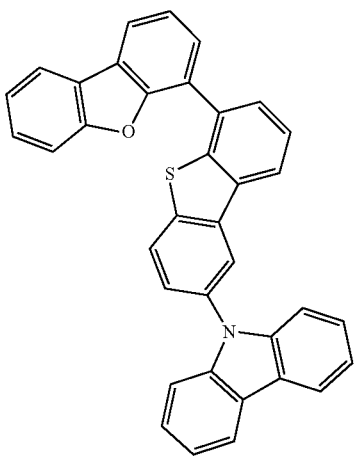
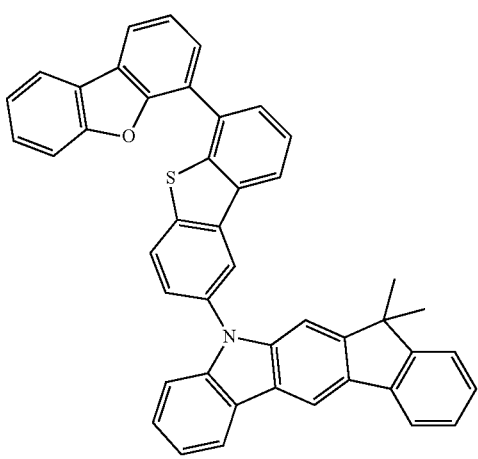

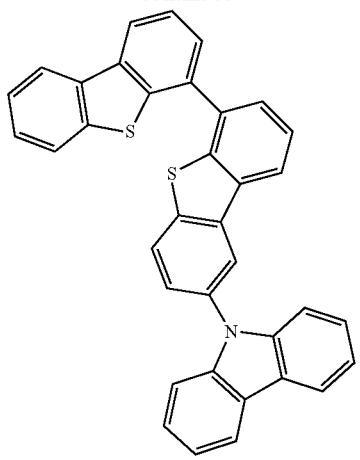
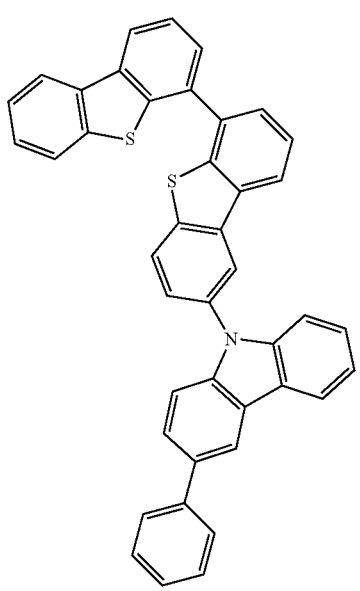
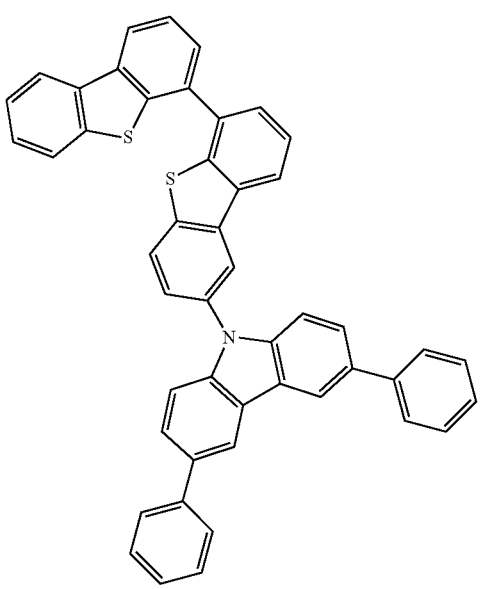
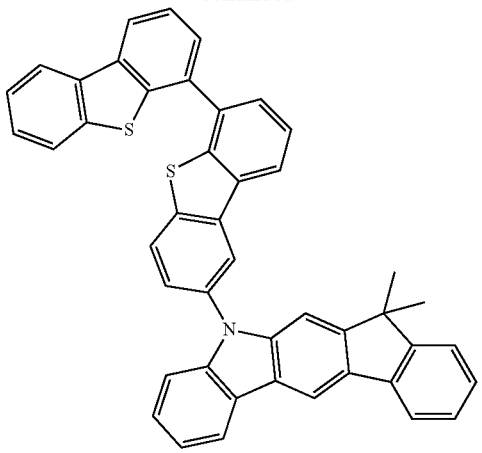
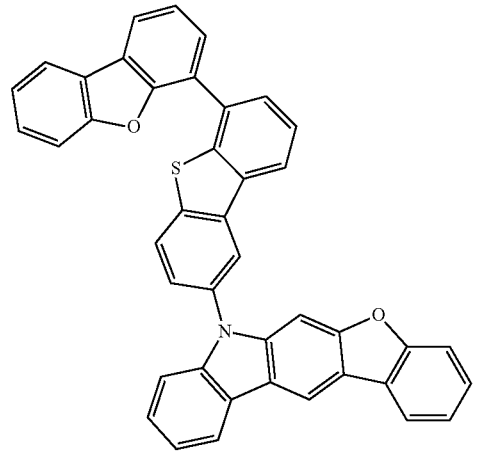
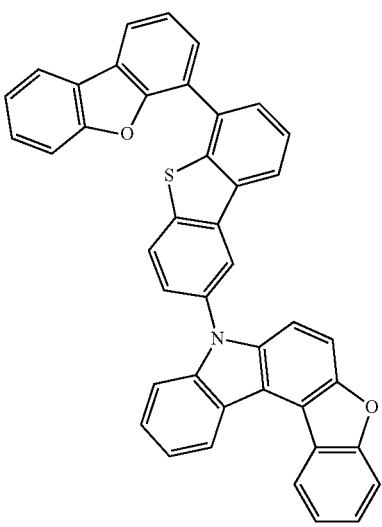

-continued
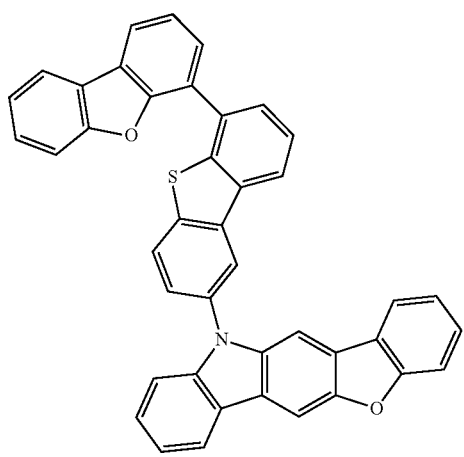
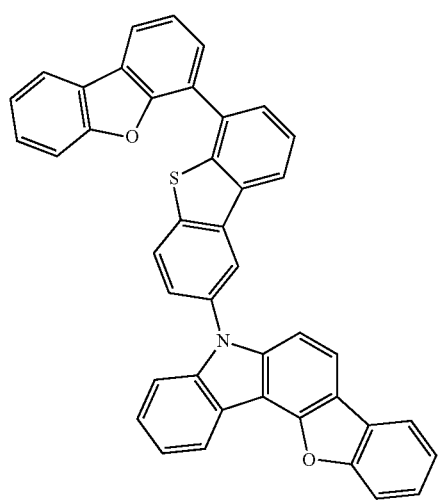
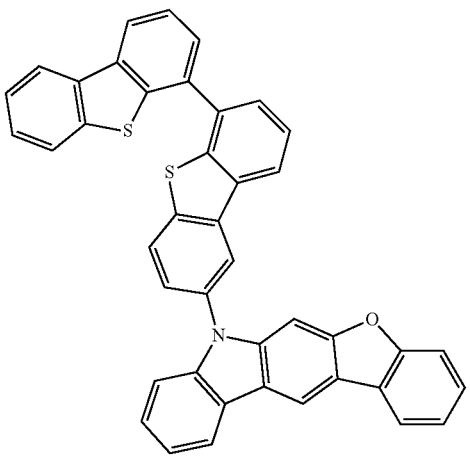
-continued
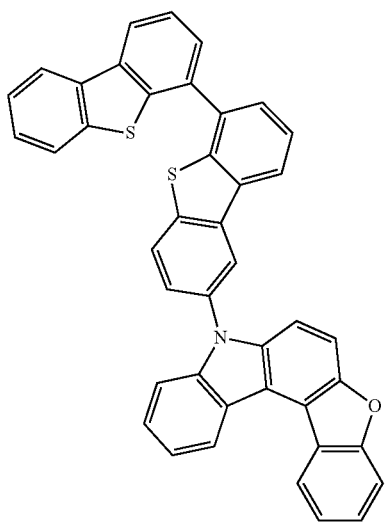
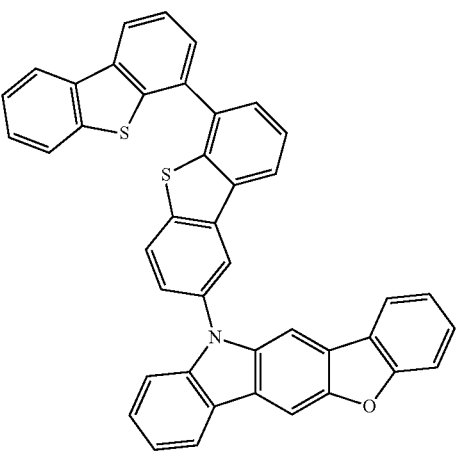
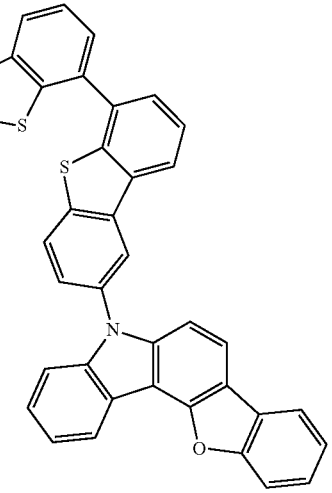

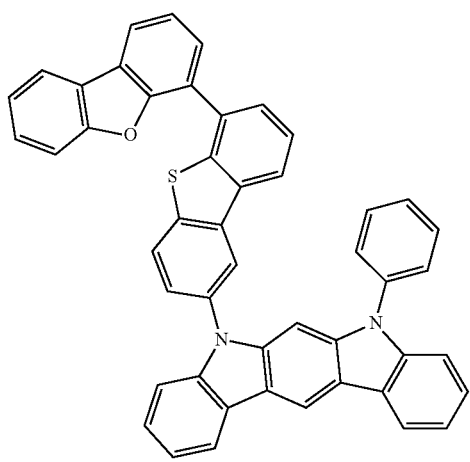
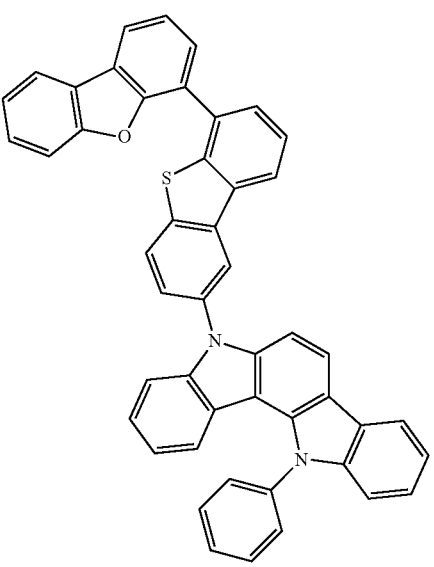
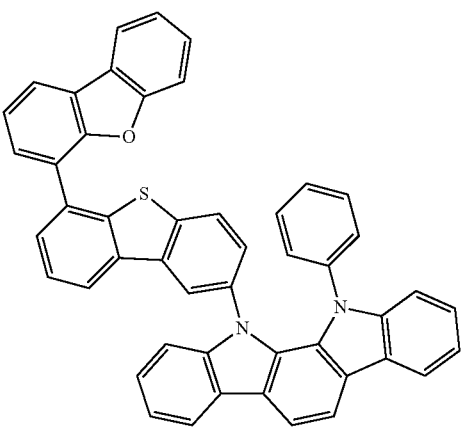
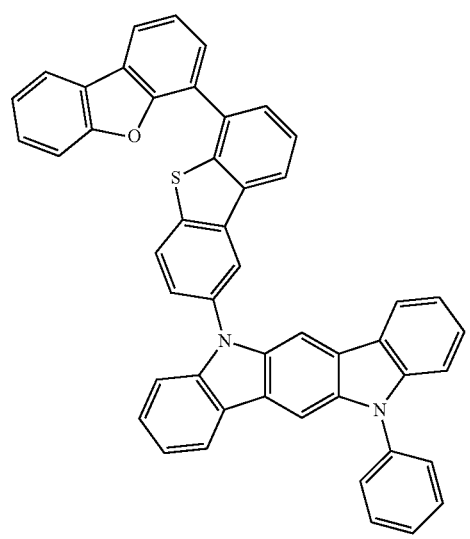

47
-continued
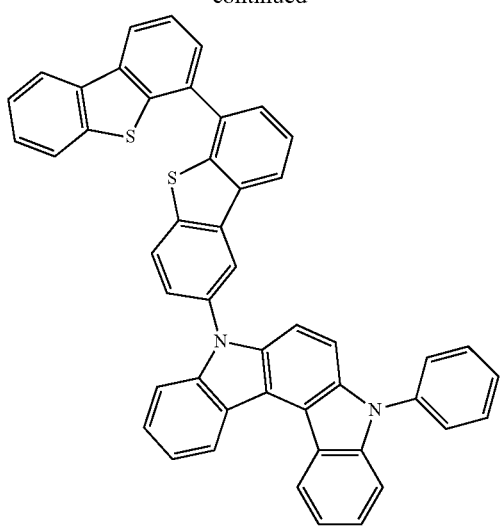
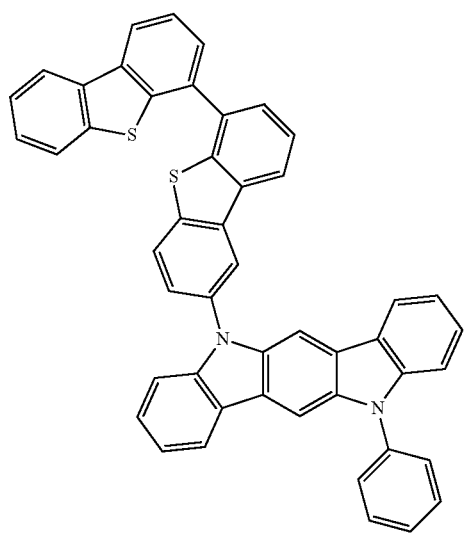
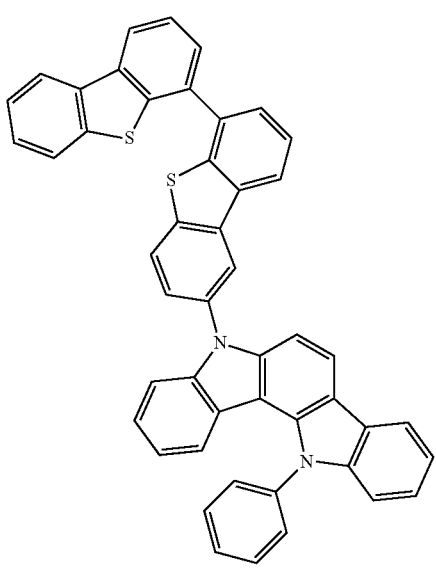
48
-continued
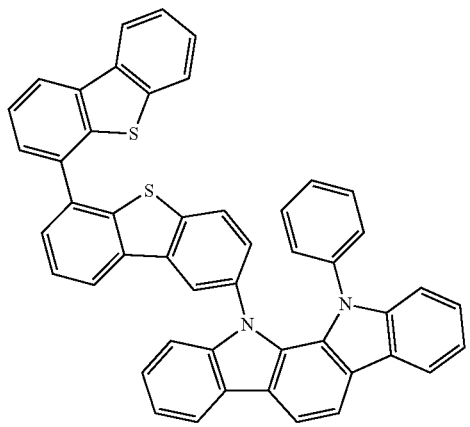
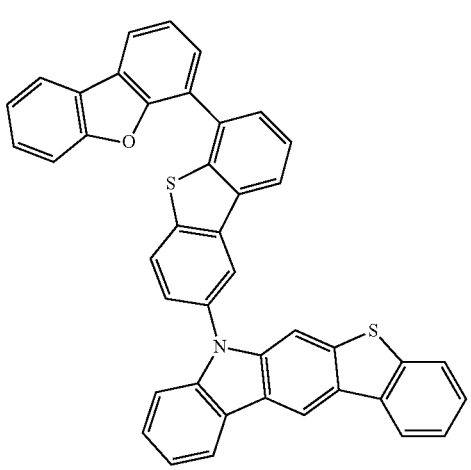
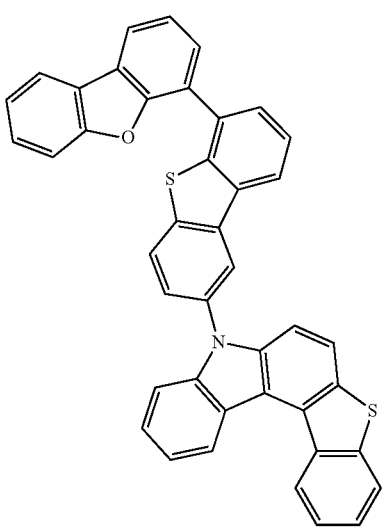

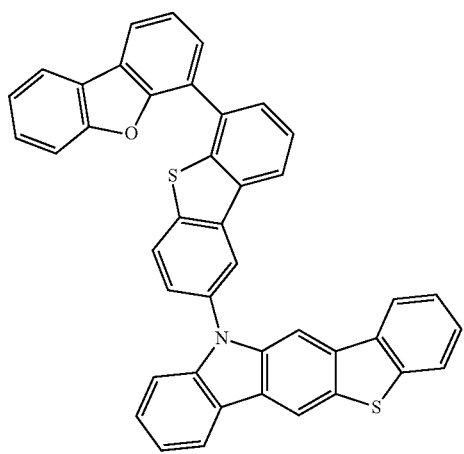
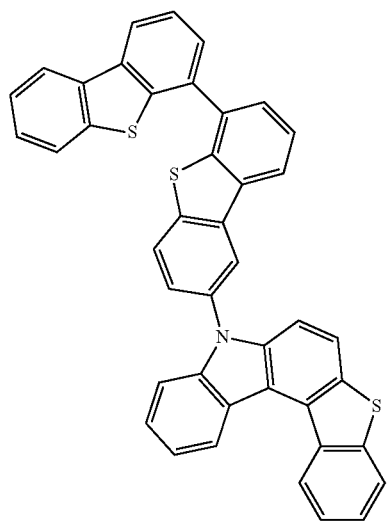
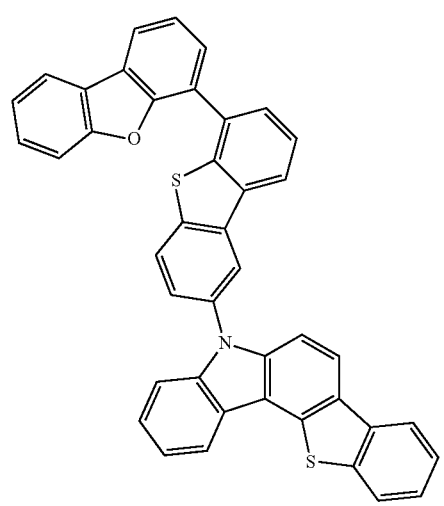
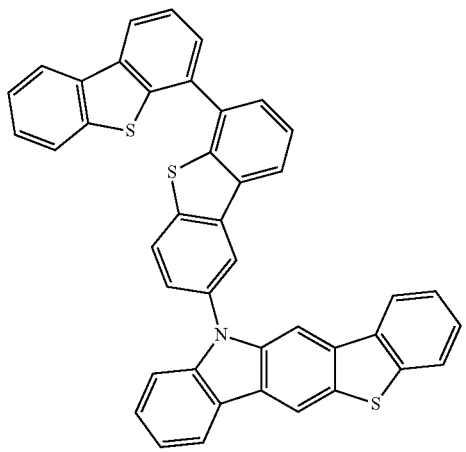
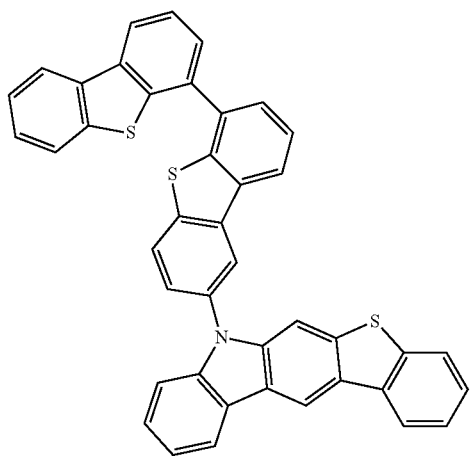
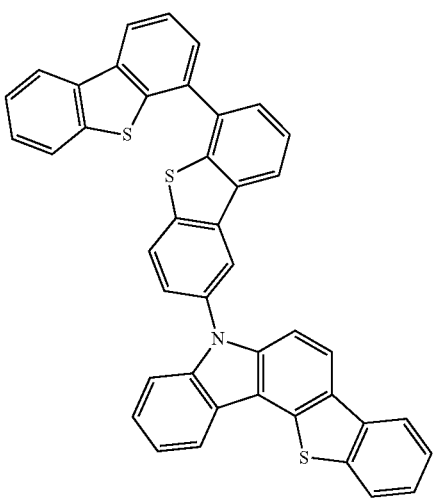

51
-continued
52
-continued
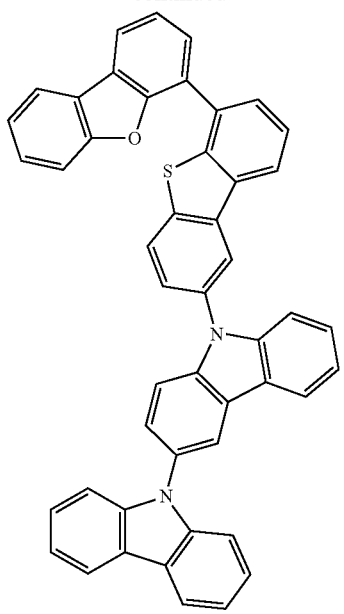
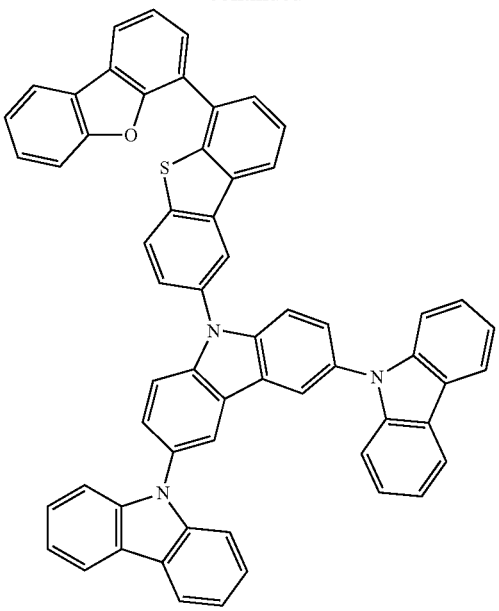
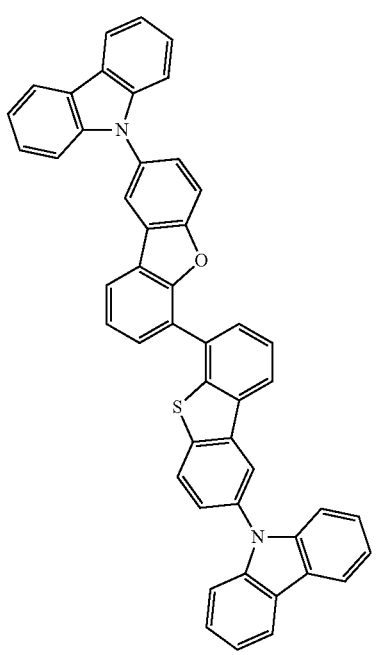
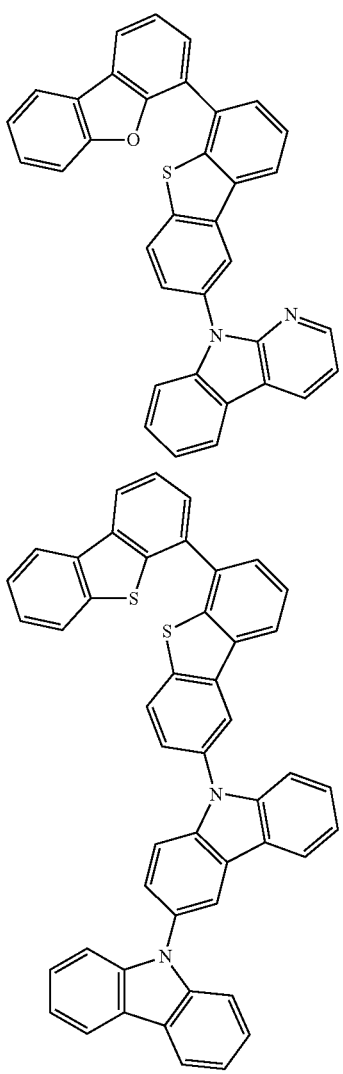

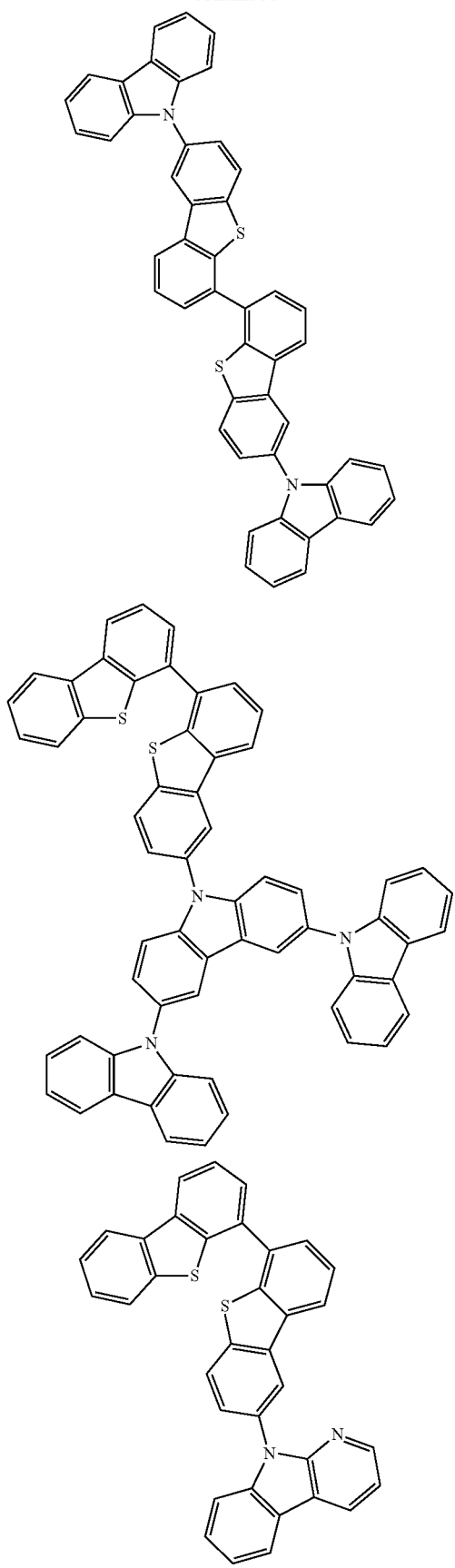
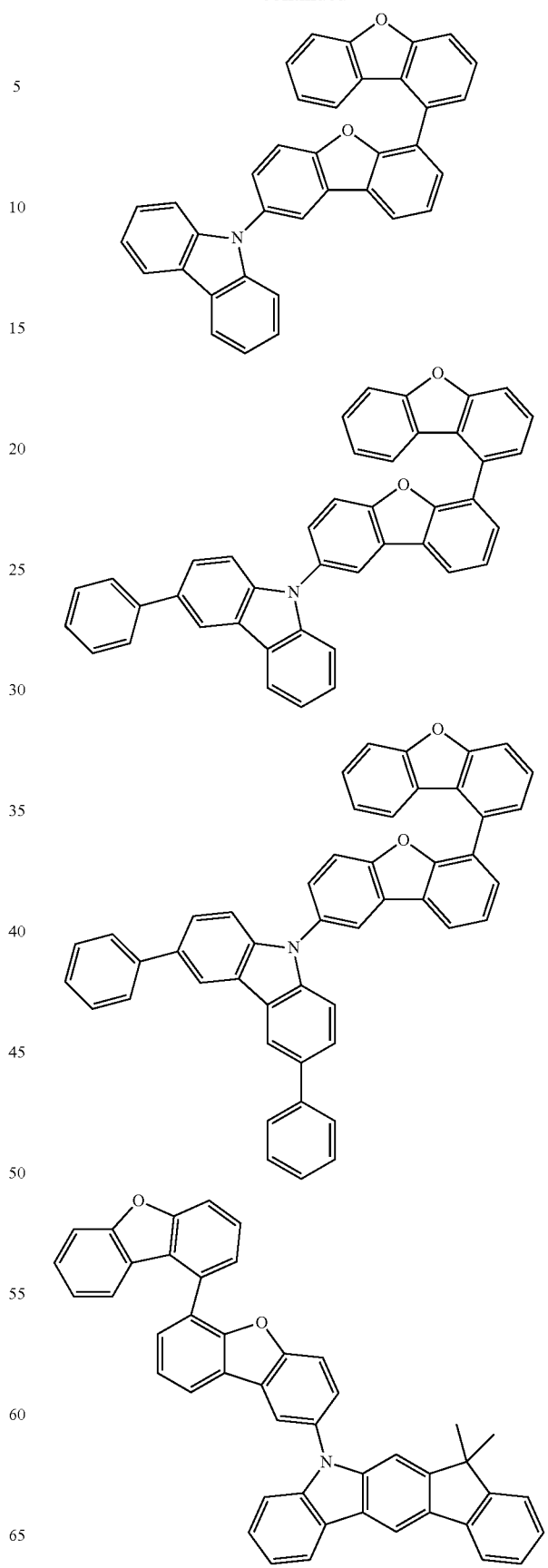

55
-continued
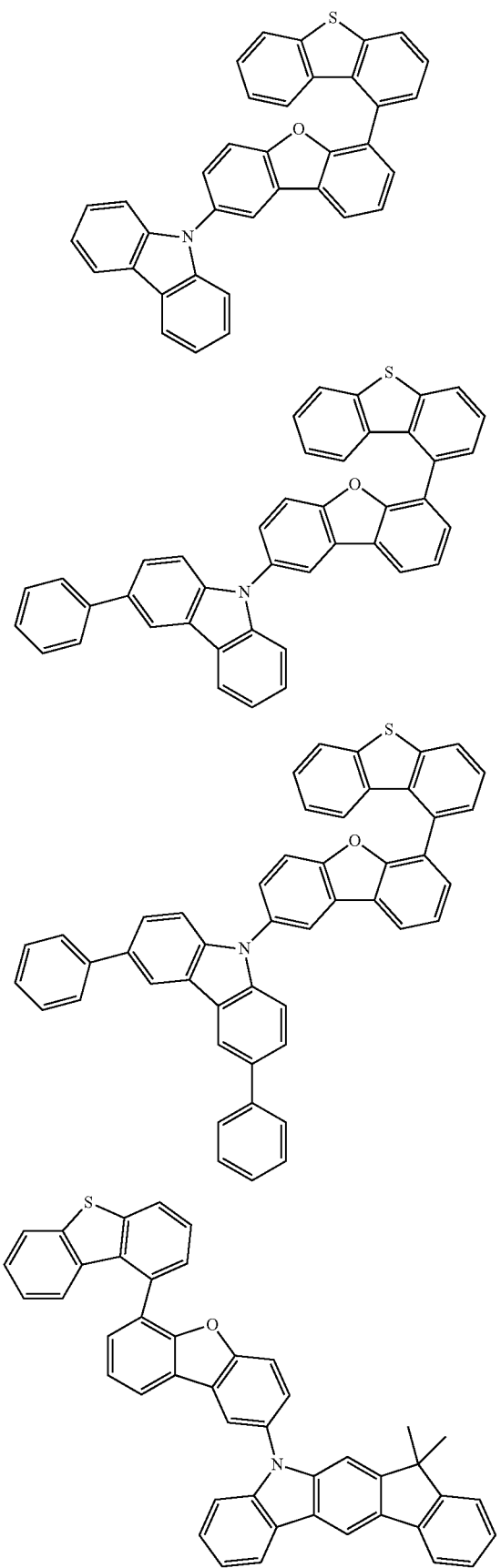
56
-continued
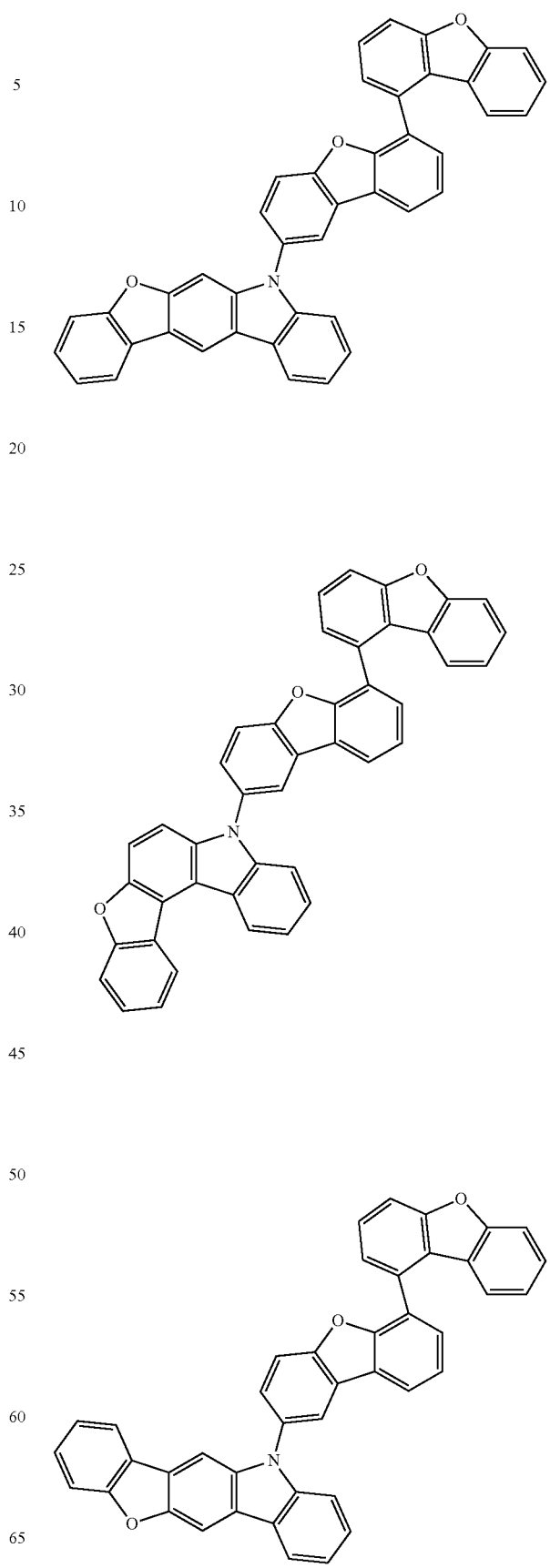

57
-continued
58
-continued
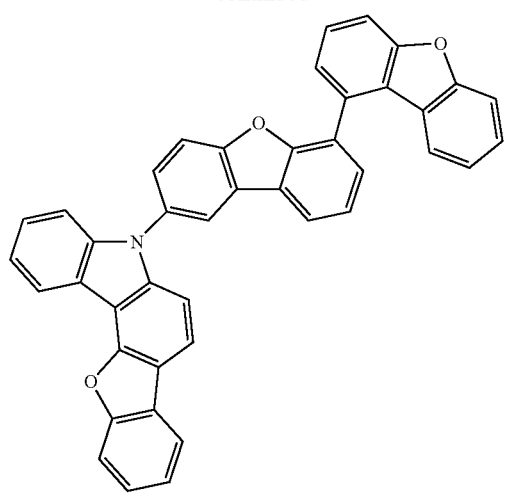
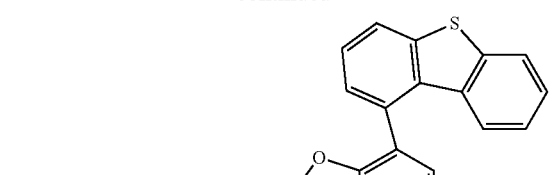
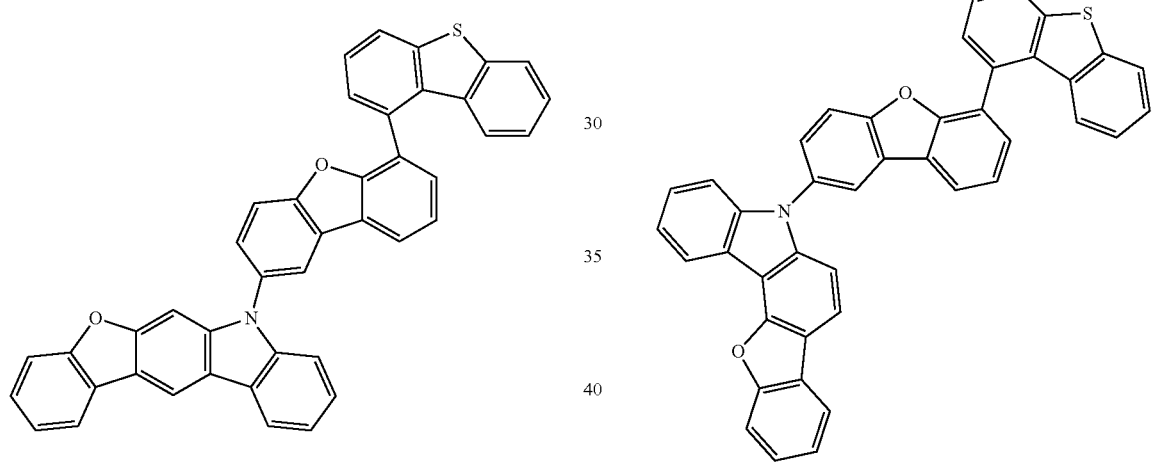
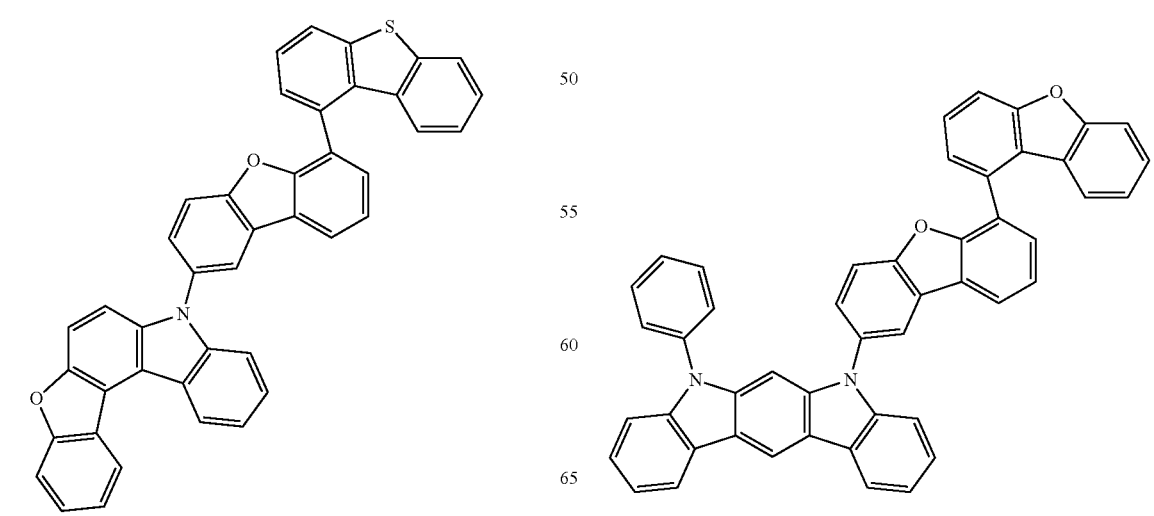

59
-continued
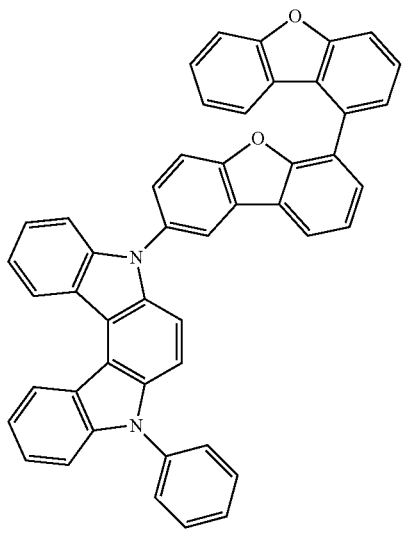
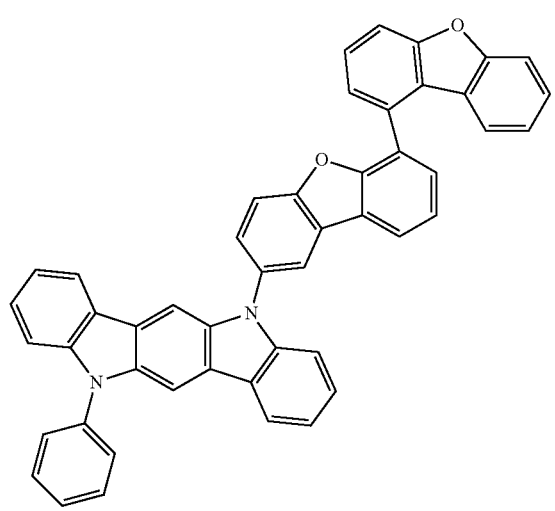
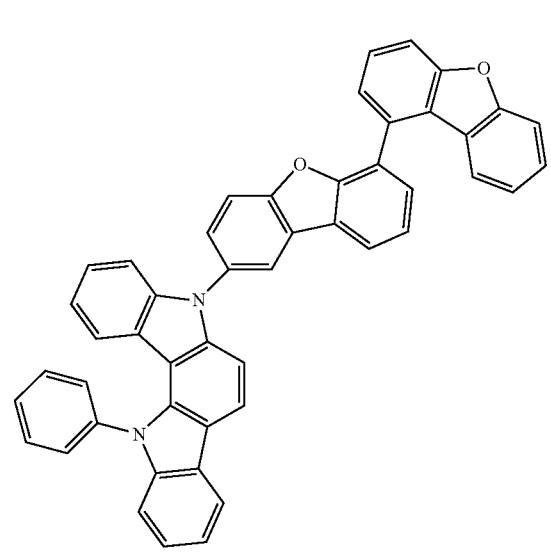
60
-continued
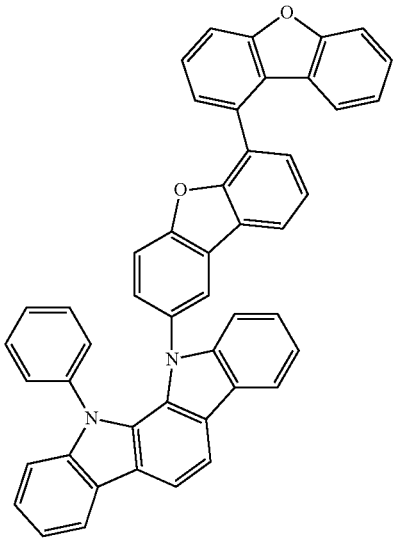
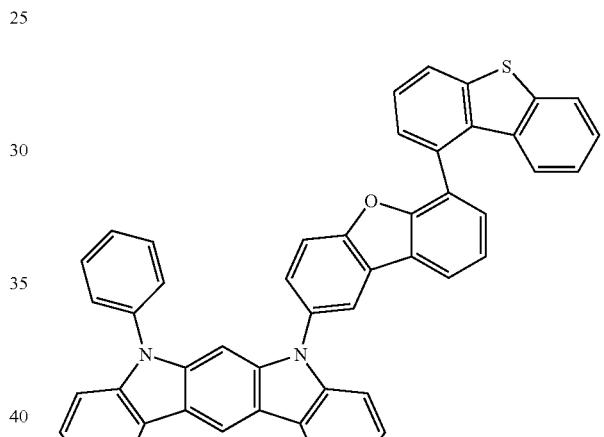
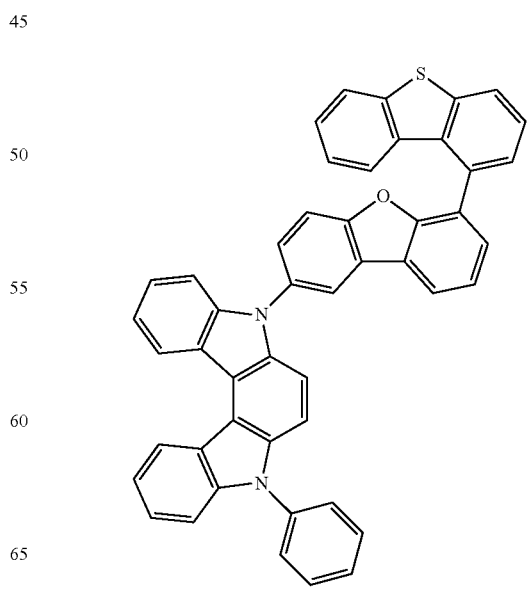

61
-continued
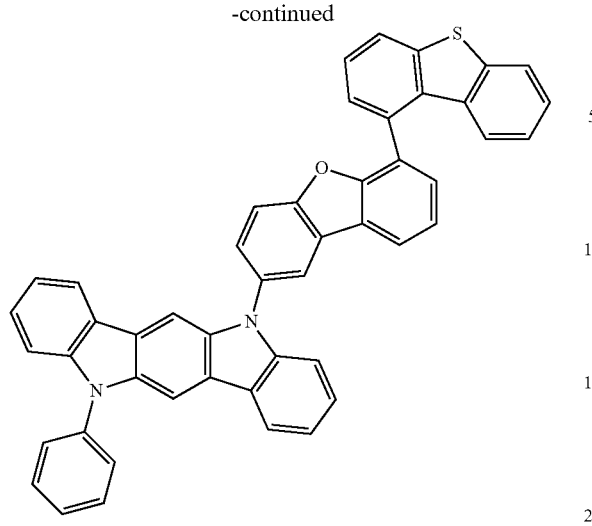
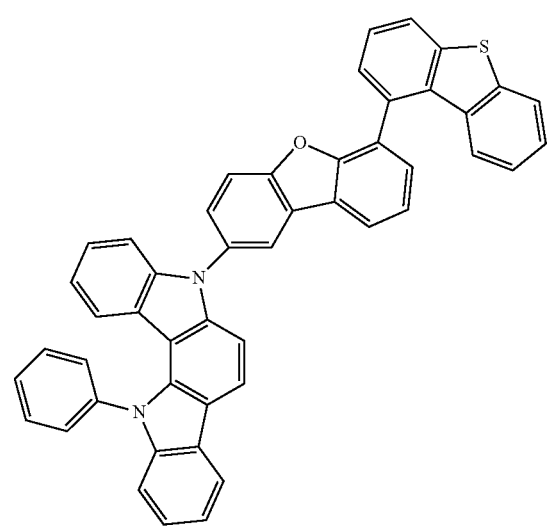
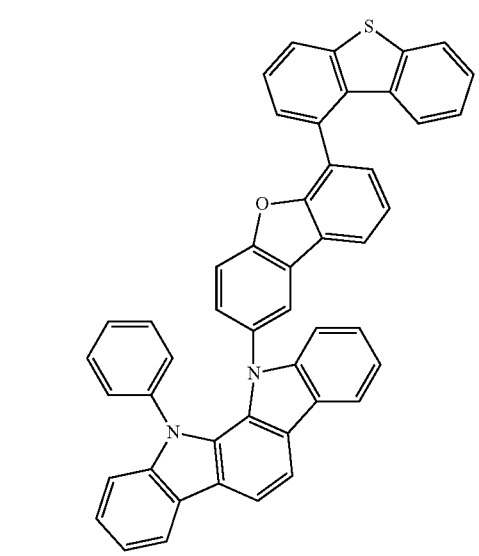
62
-continued
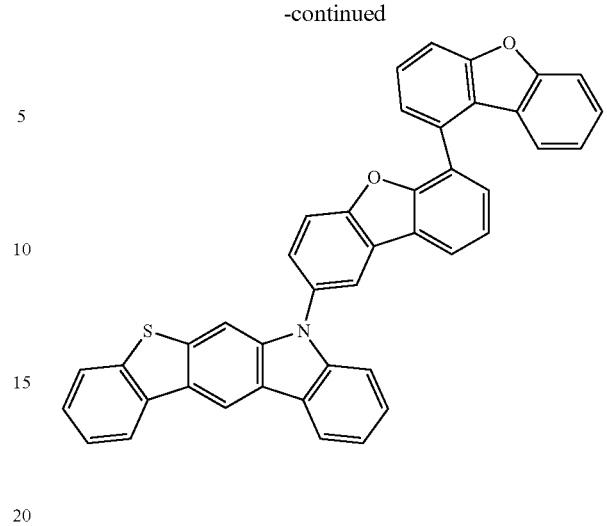
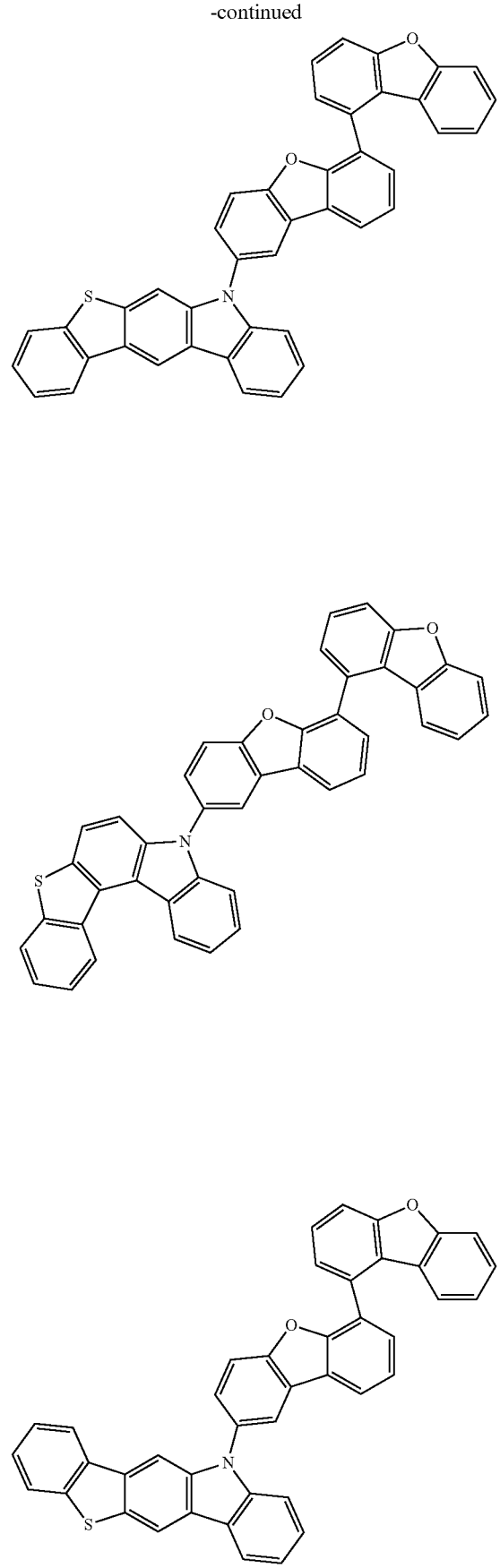

63
-continued
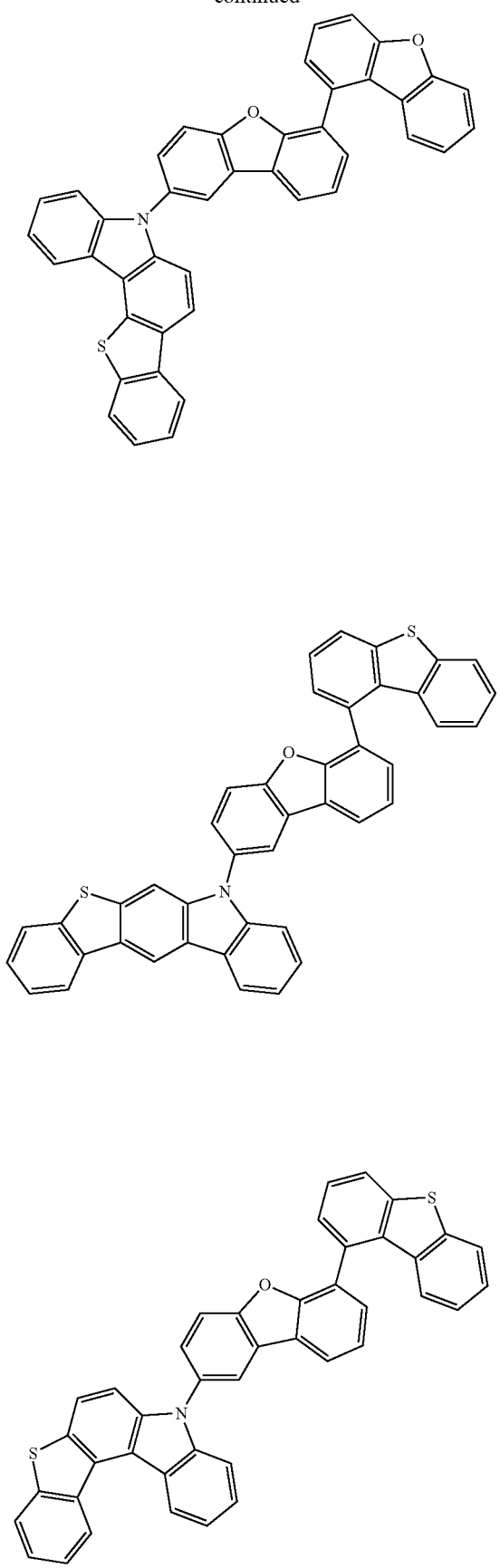
64
-continued
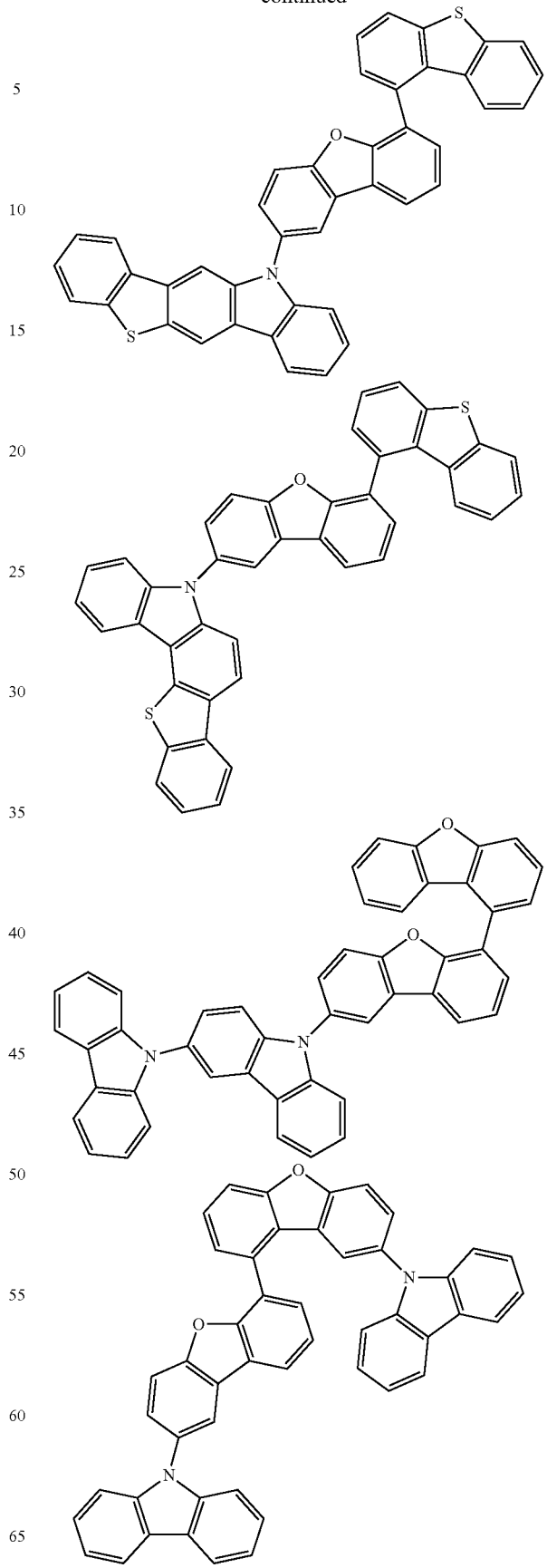

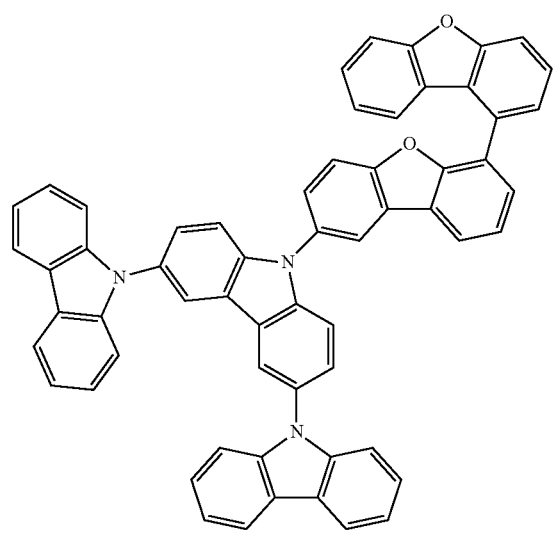
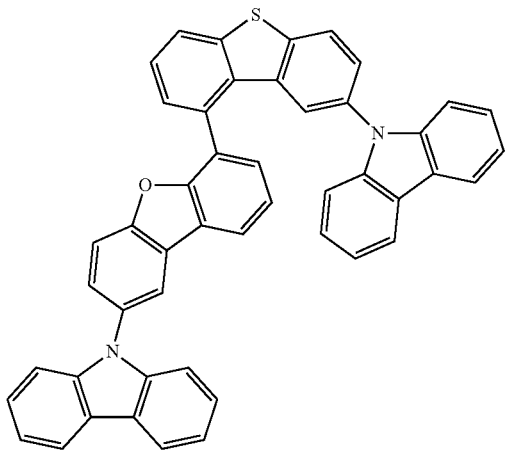
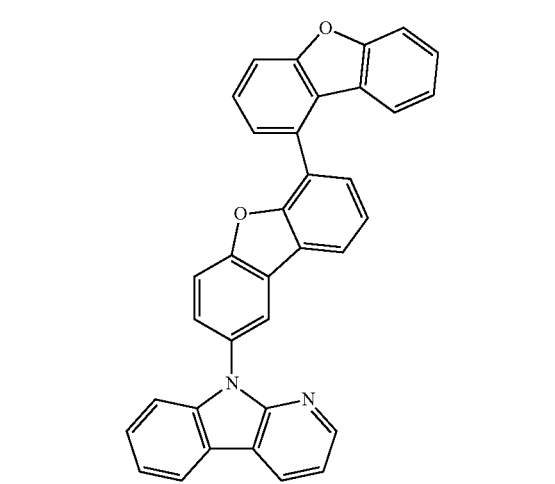
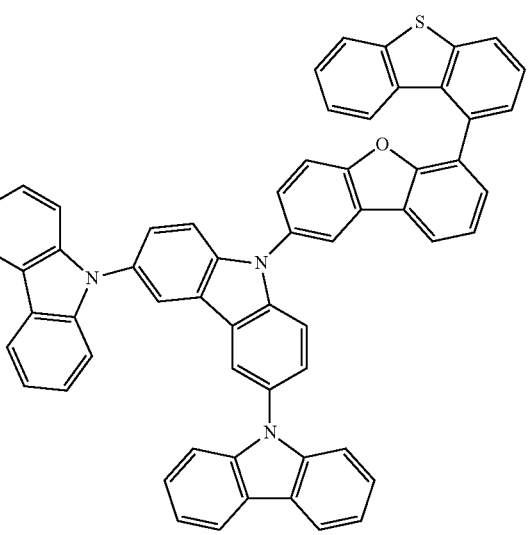
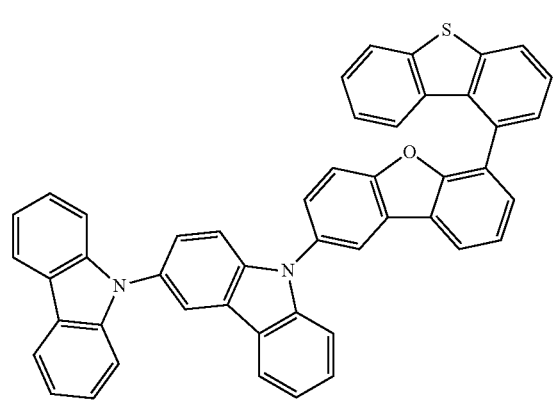
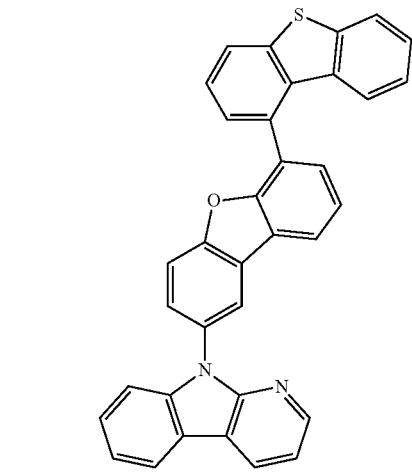

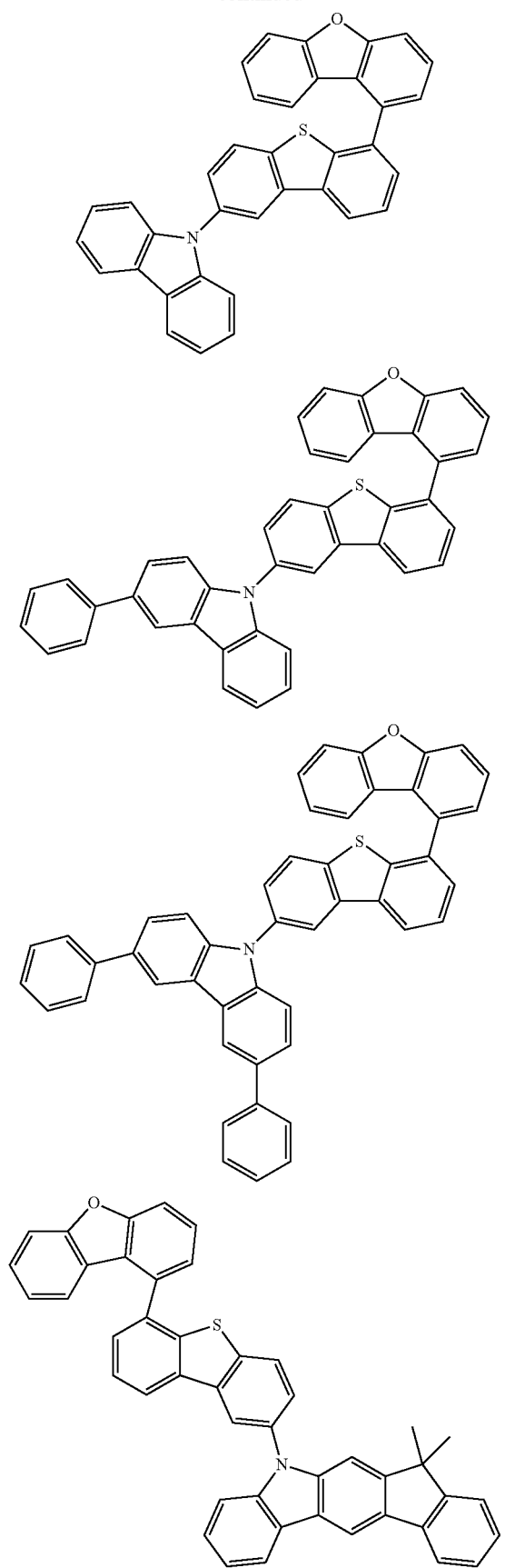
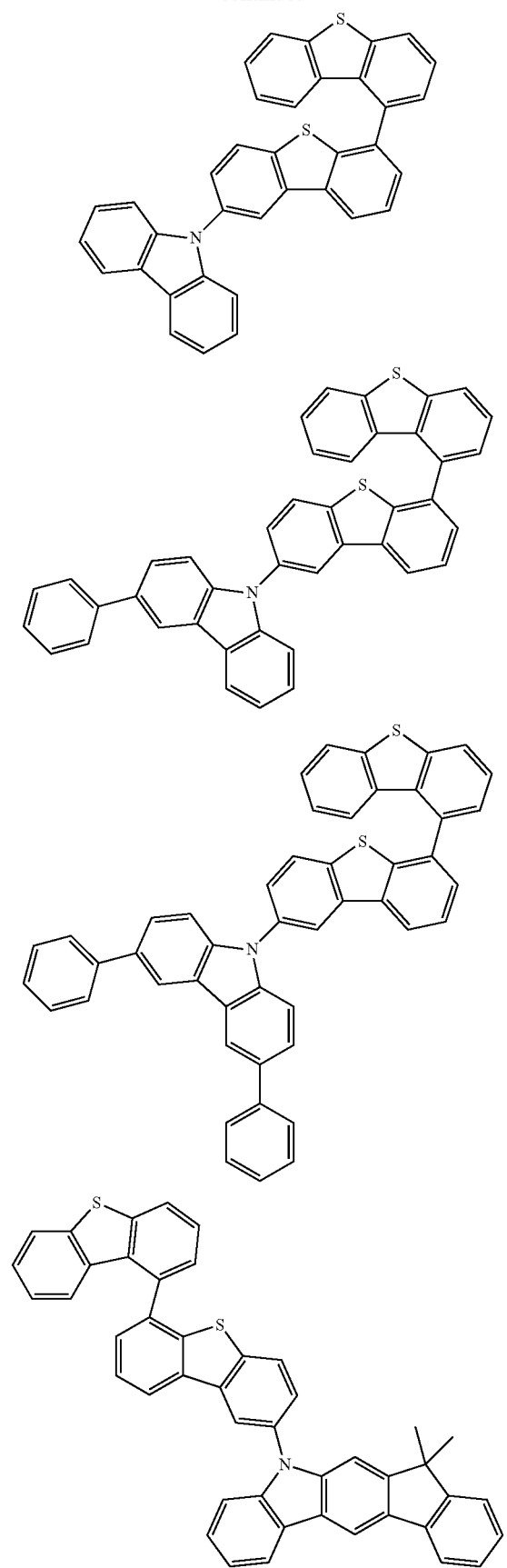

69
-continued
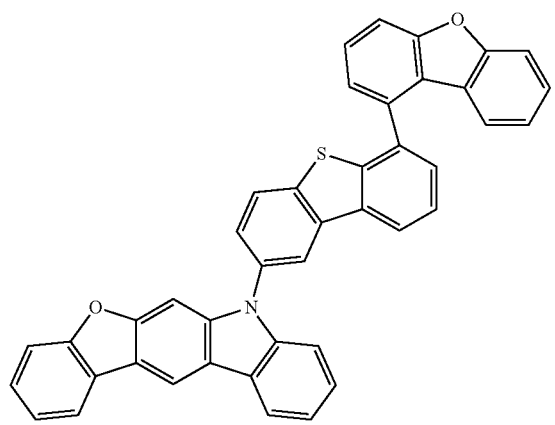
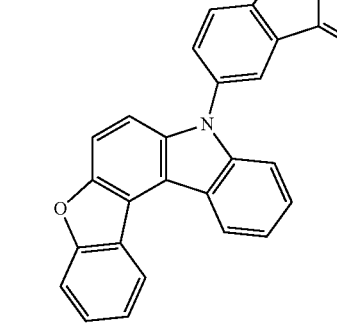
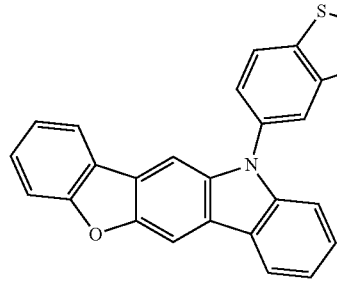
70
-continued
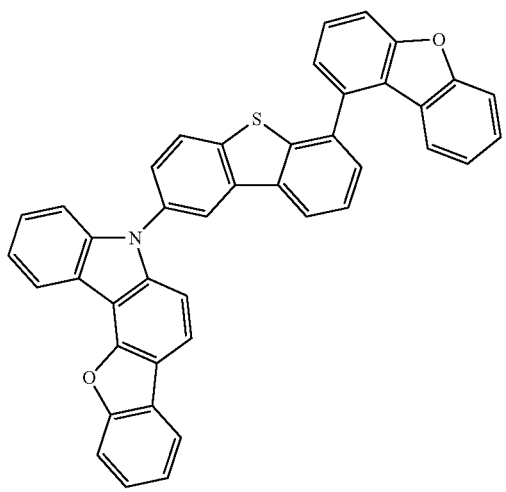
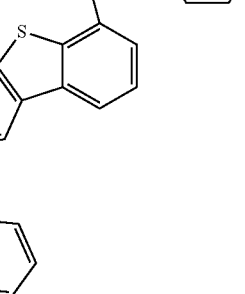

71
-continued
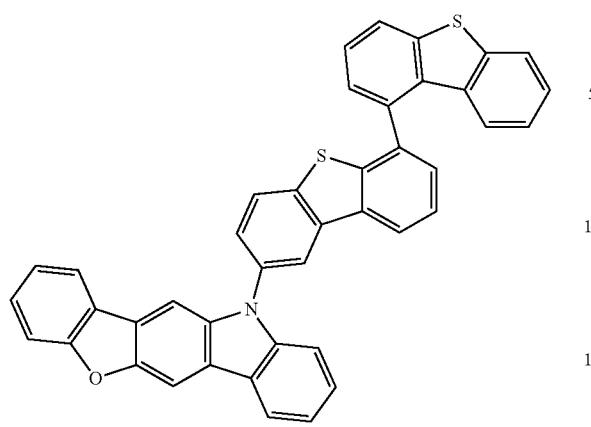
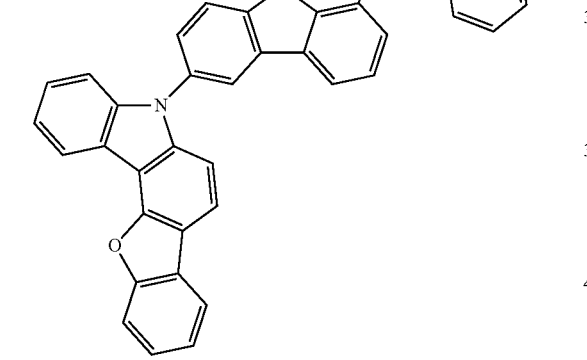
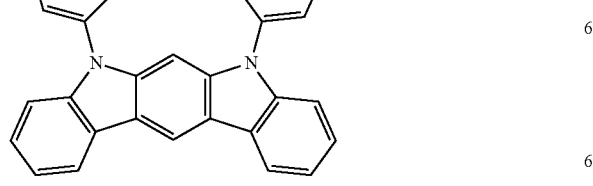
72
-continued
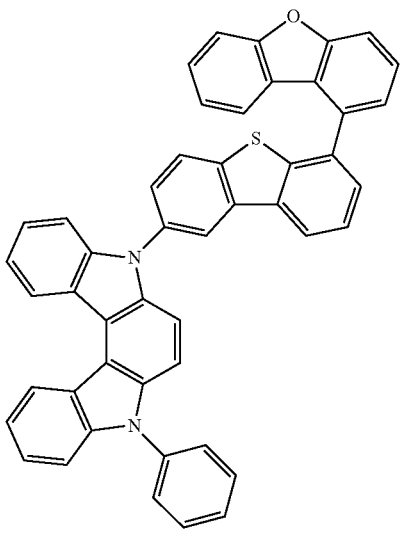
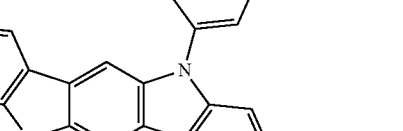
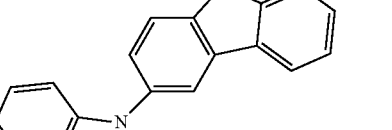

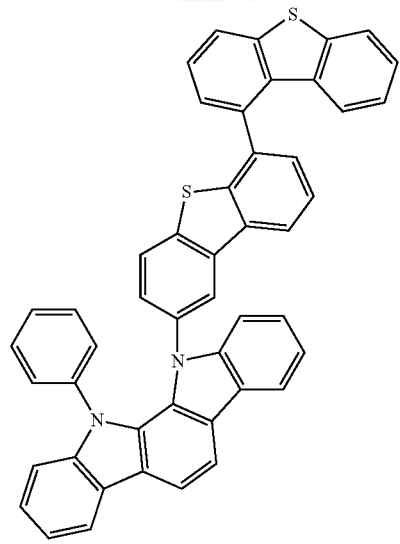
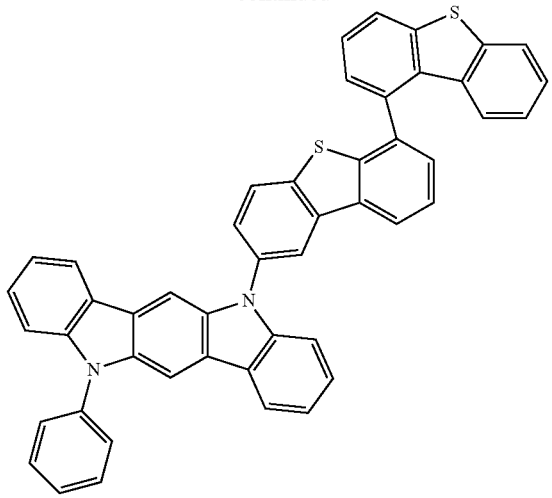
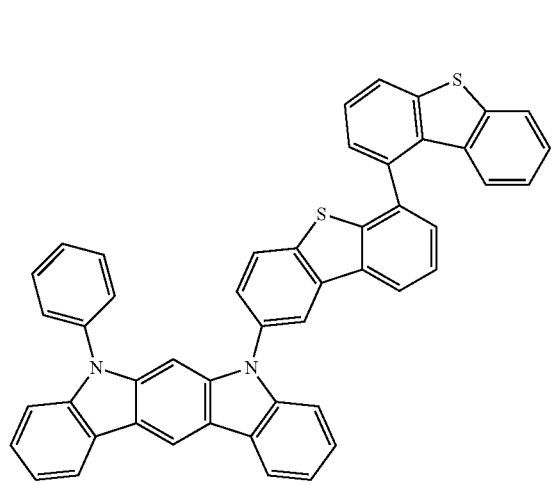
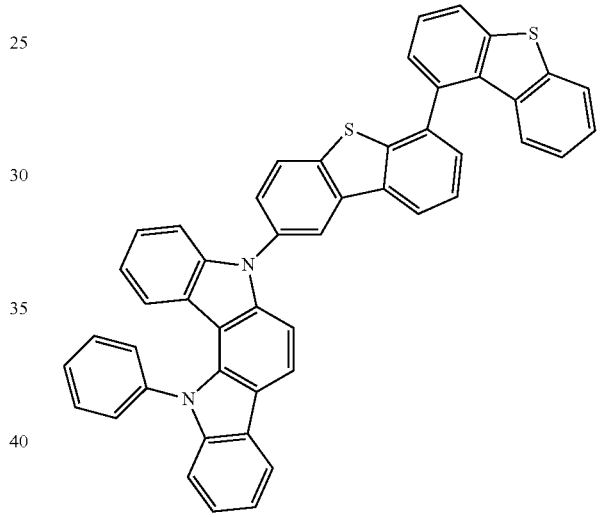
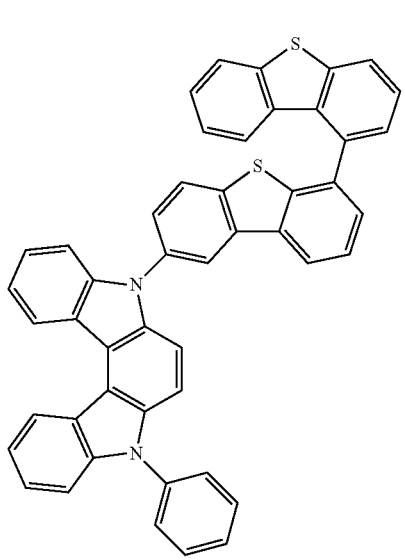
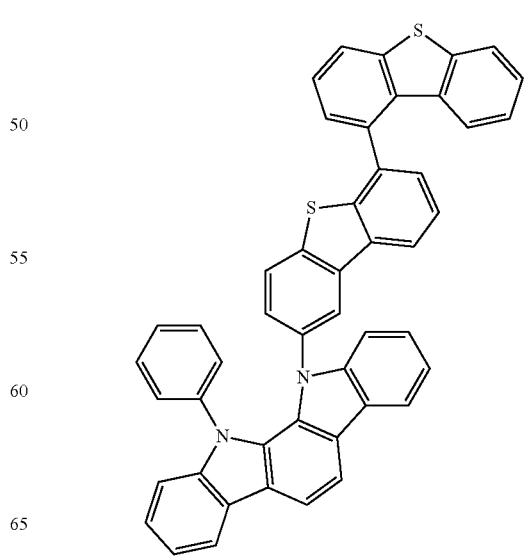

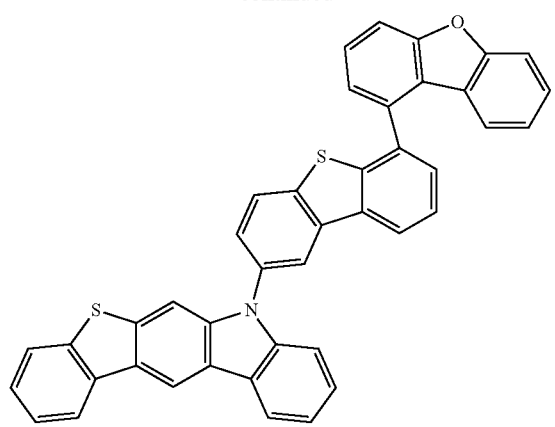
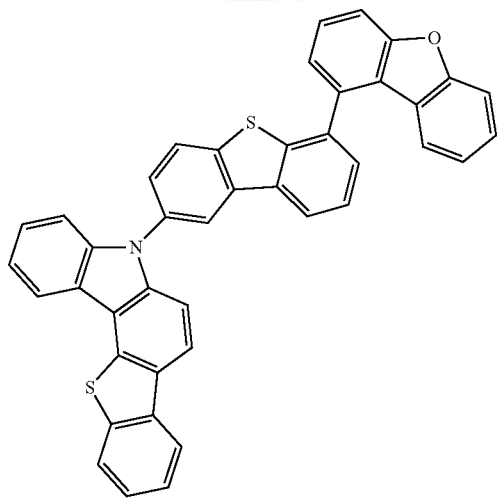
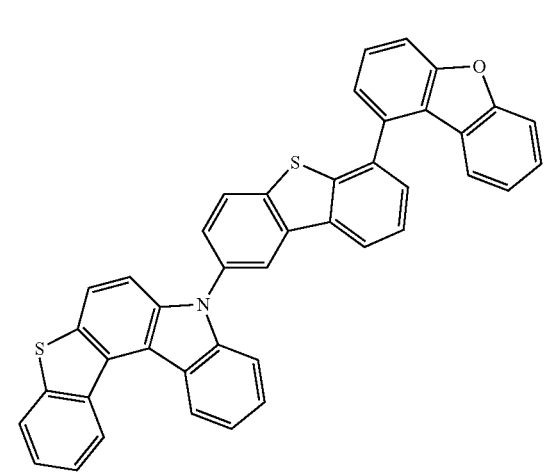
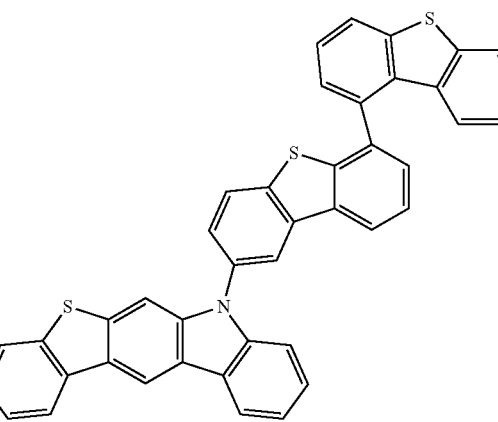
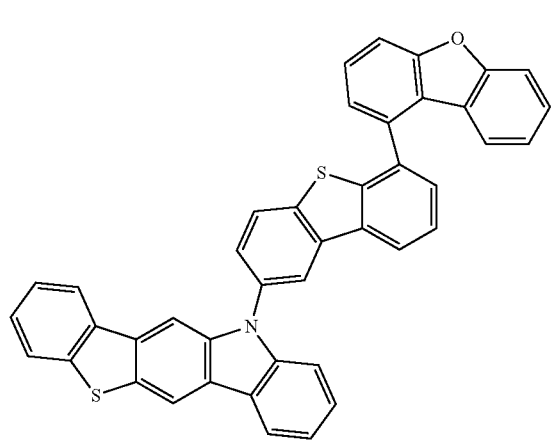
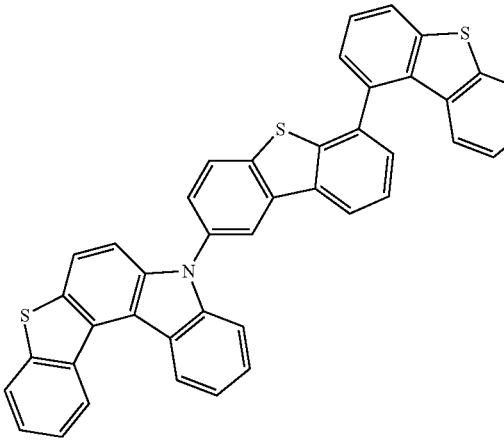

77
-continued
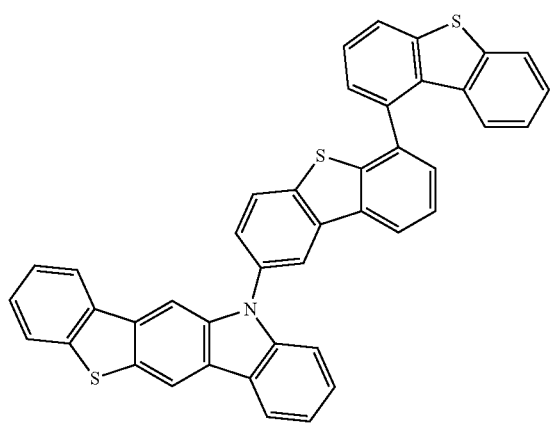
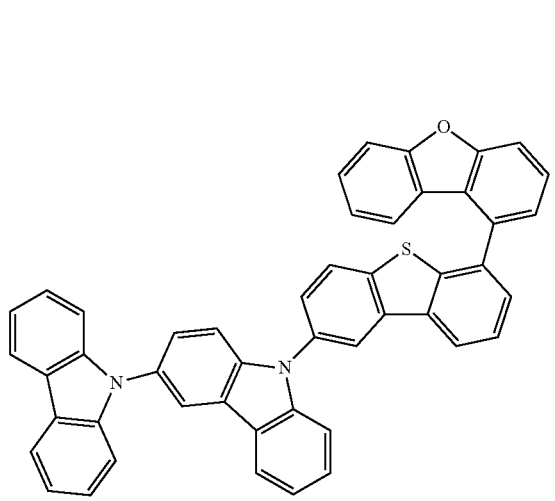
78
-continued
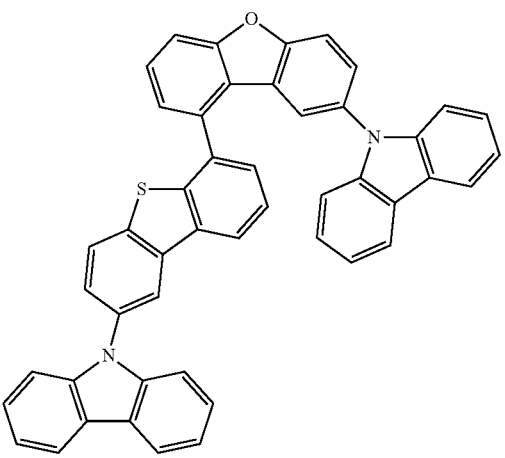
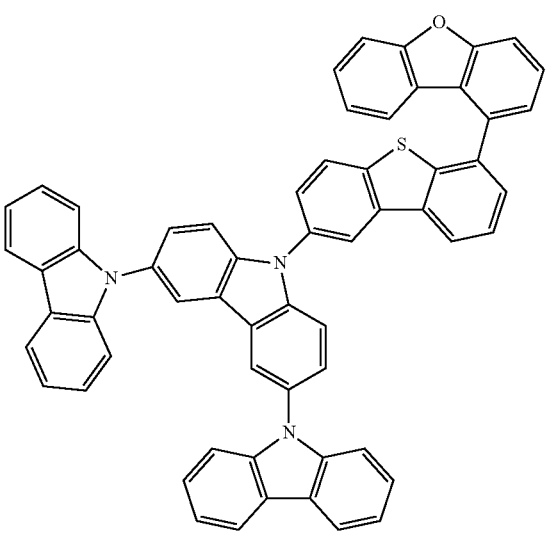
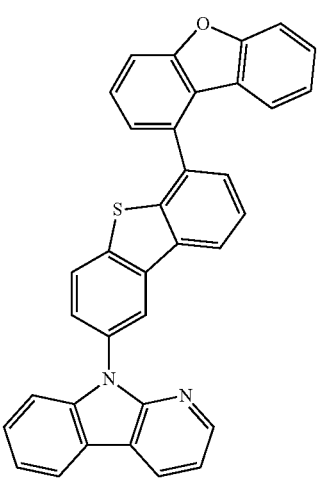

79
-continued
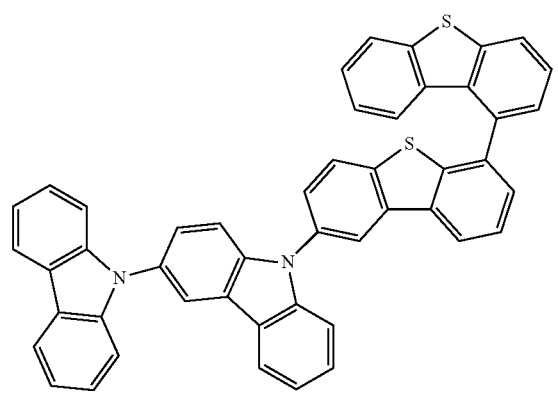
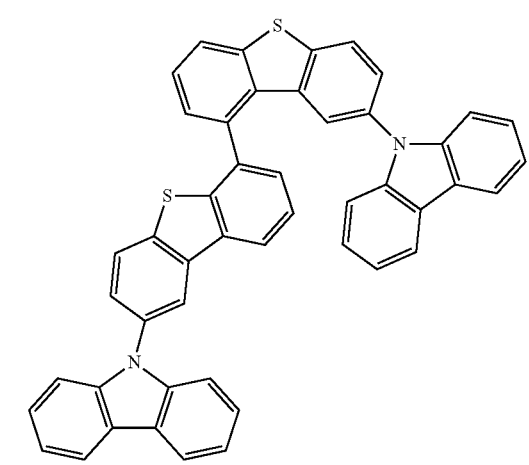
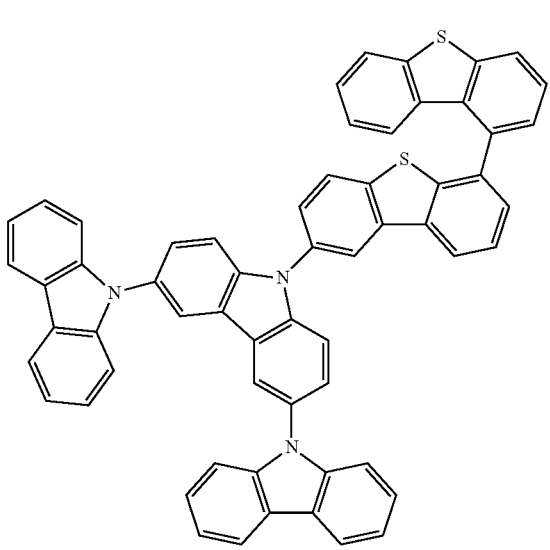
80
-continued
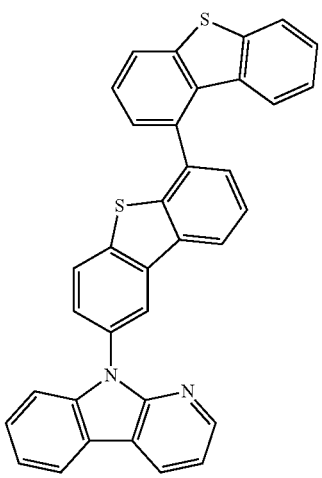
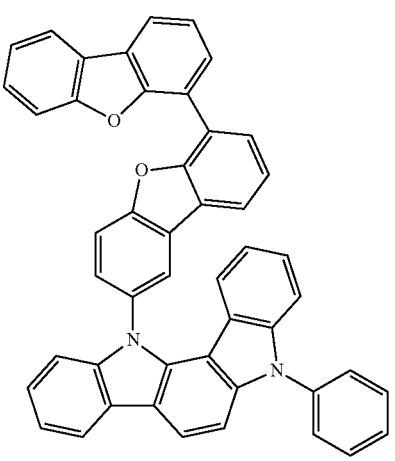
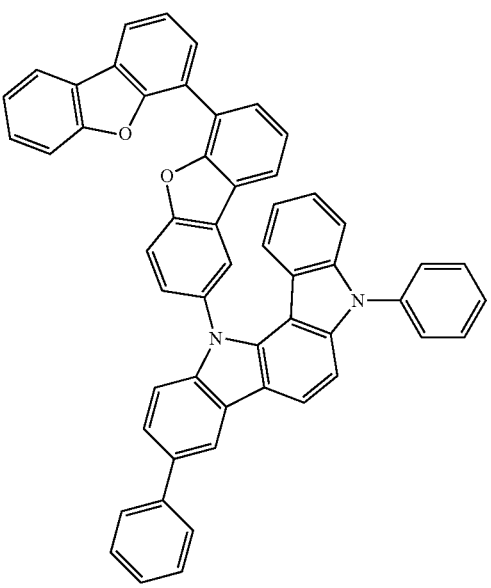

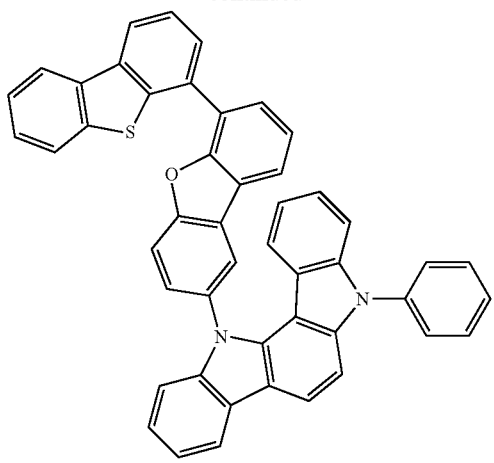
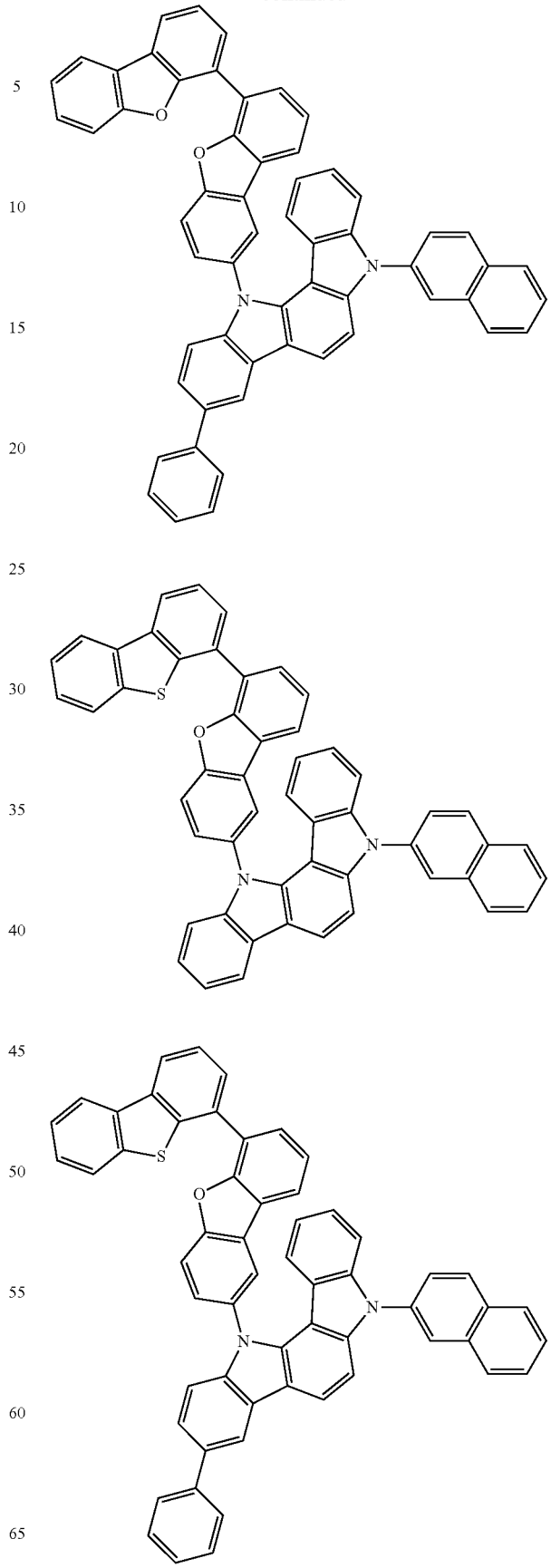

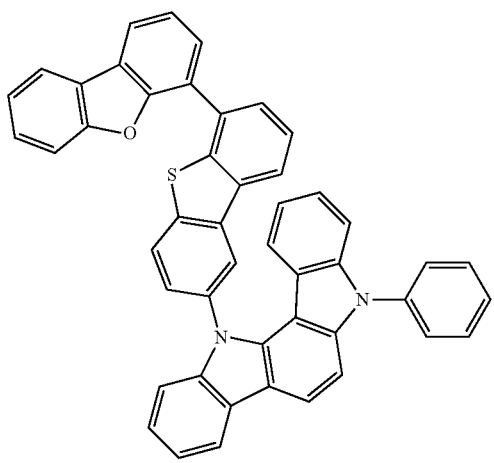
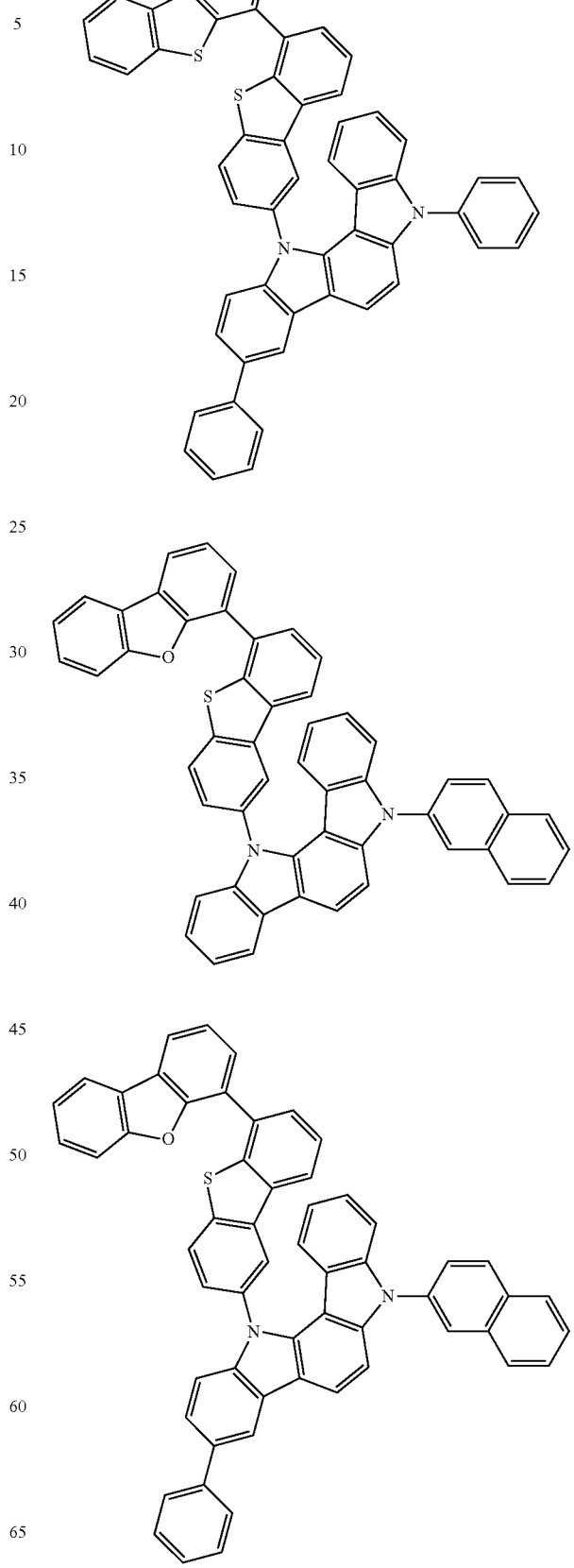

85
-continued
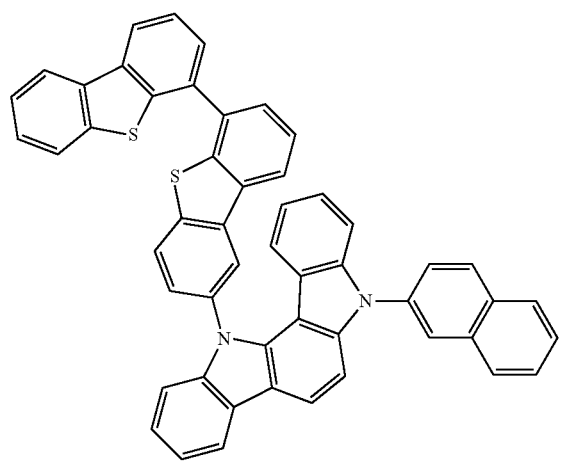
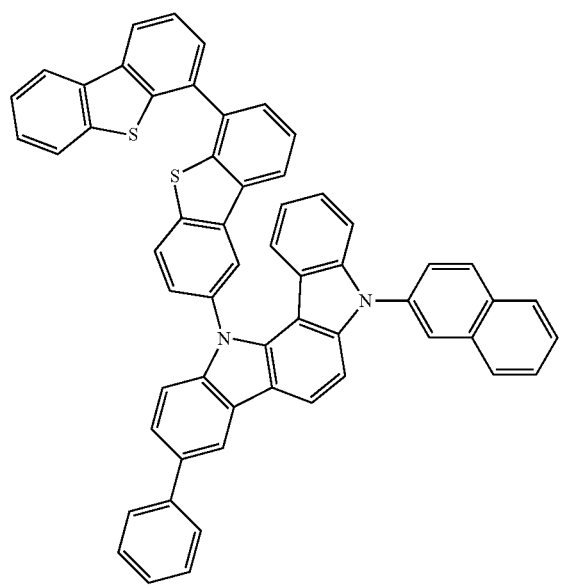
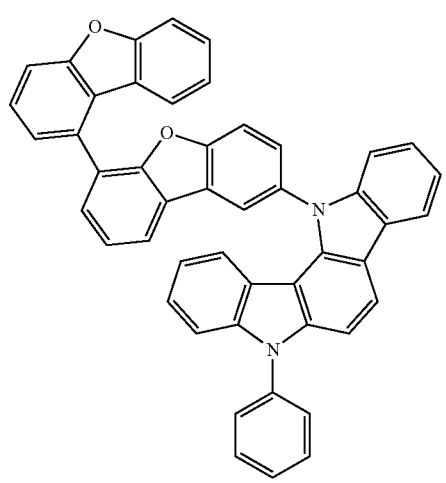
86
-continued
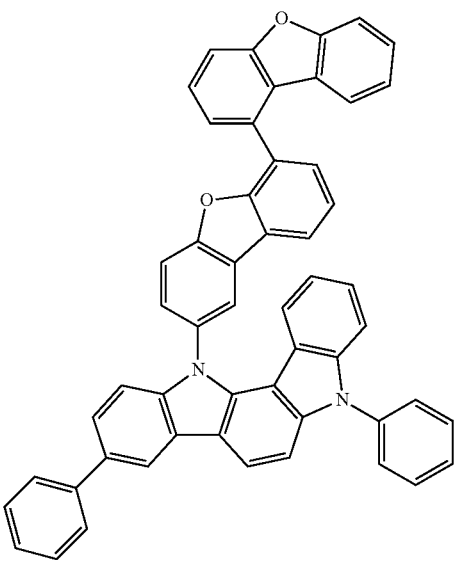
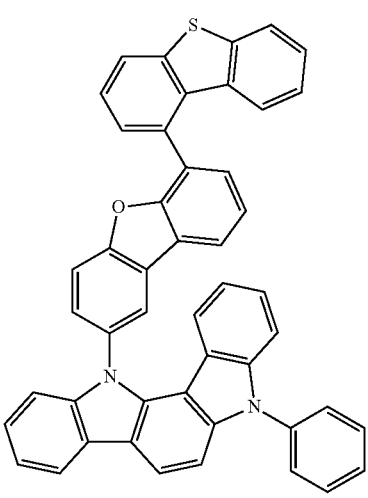
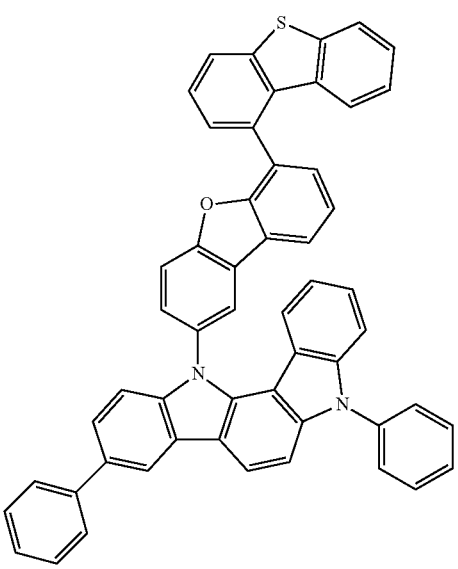

87
-continued
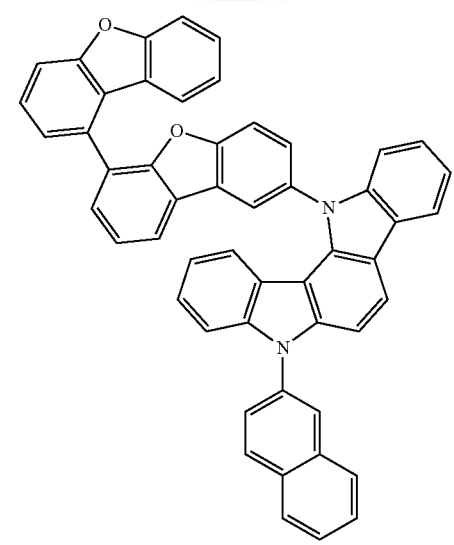
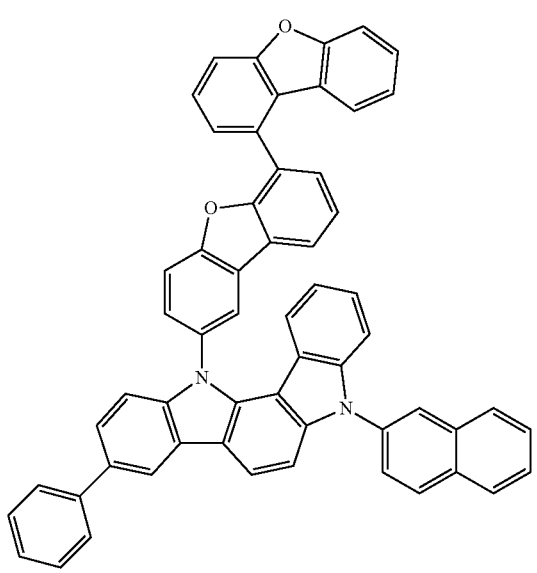
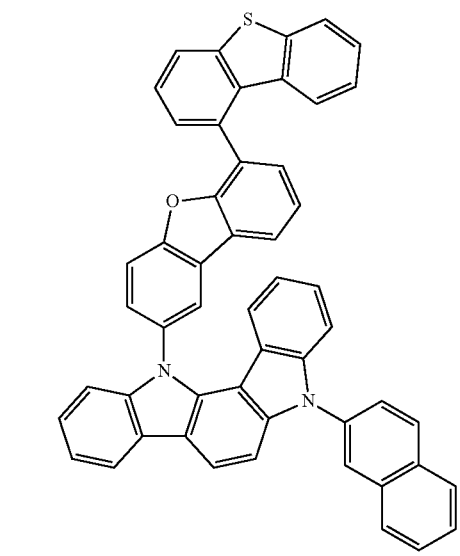
88
-continued
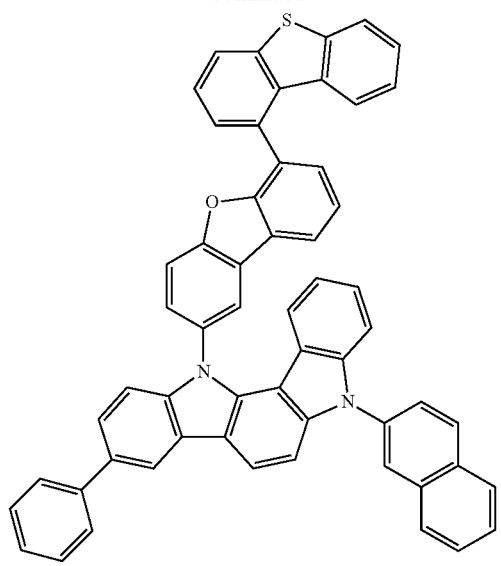
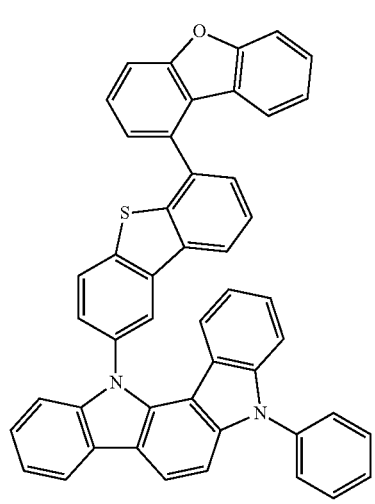
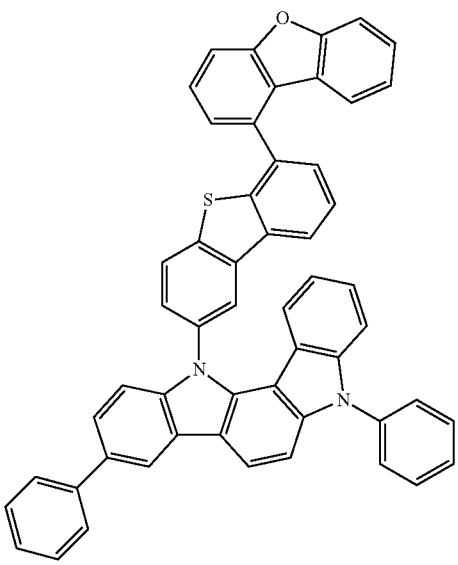

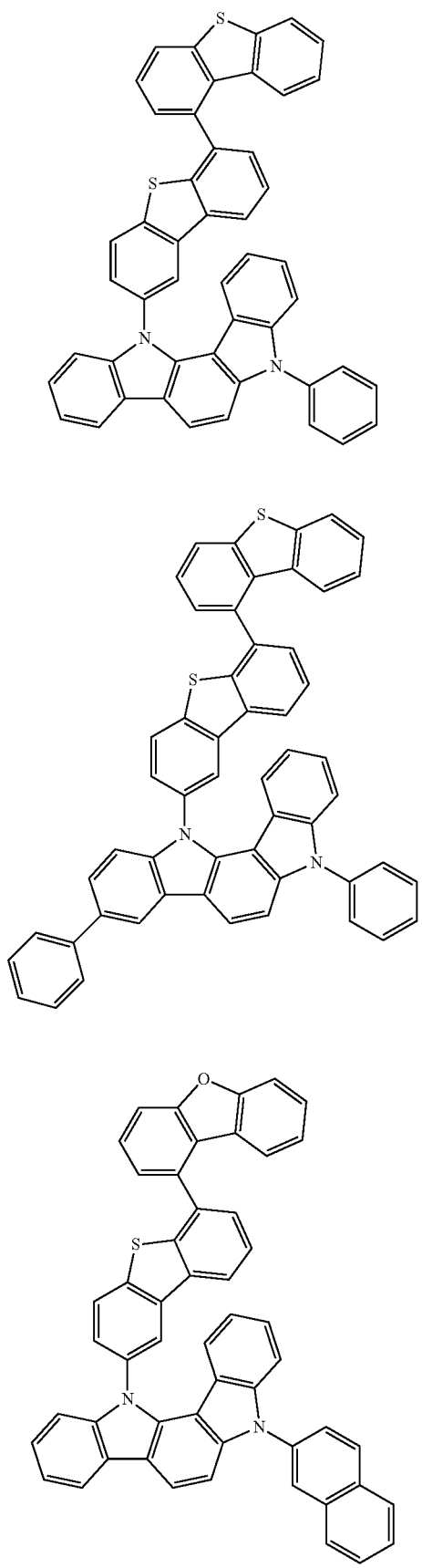
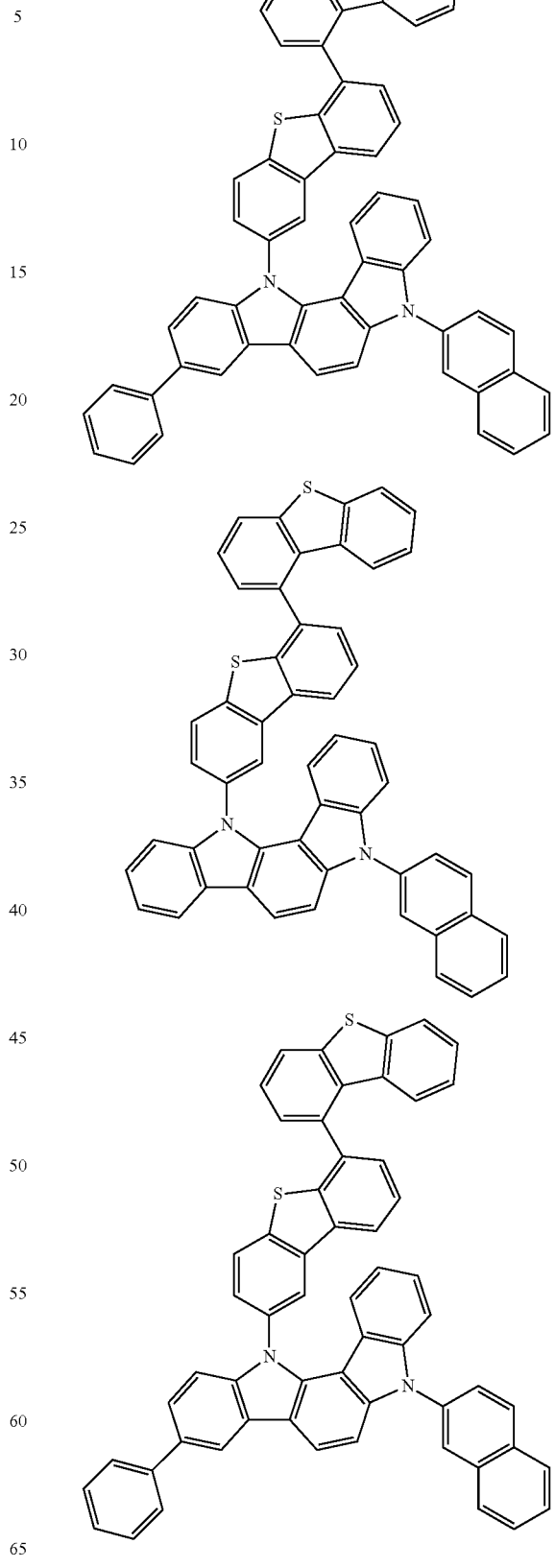

91
-continued
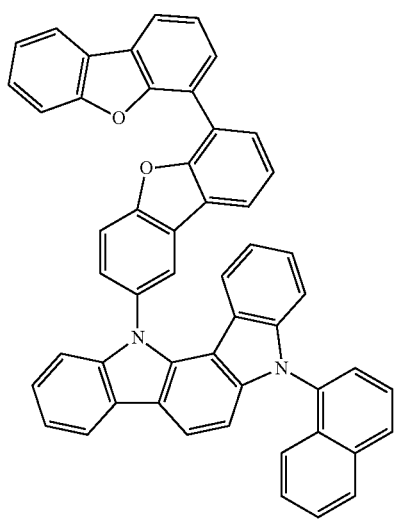
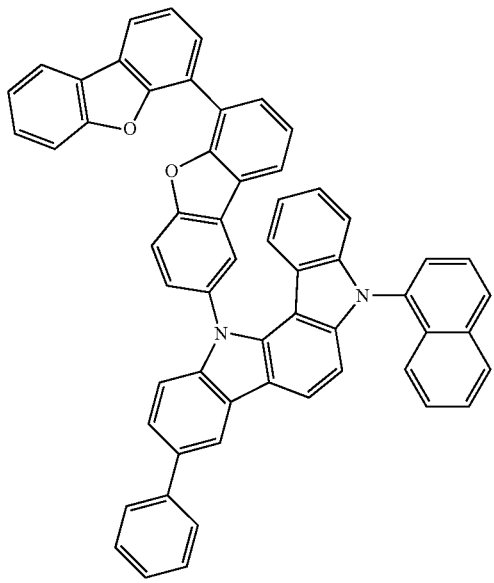
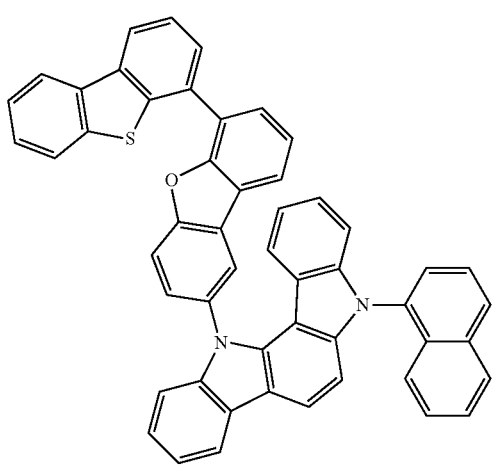
92
-continued
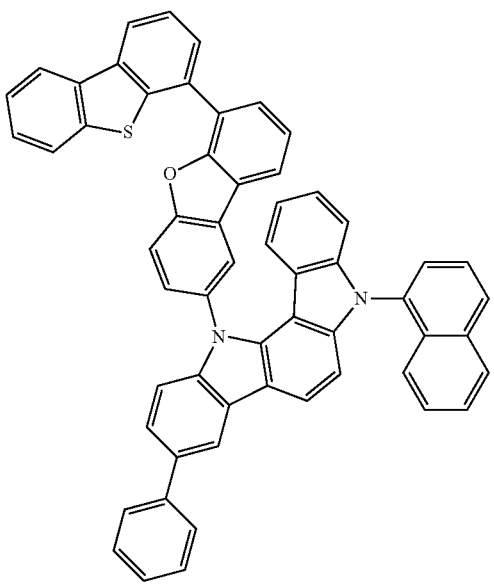
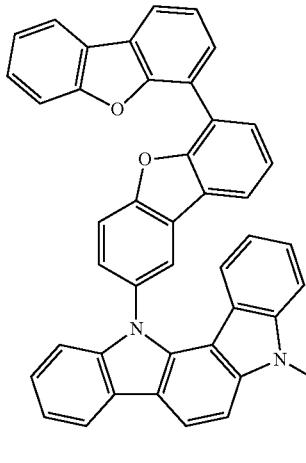
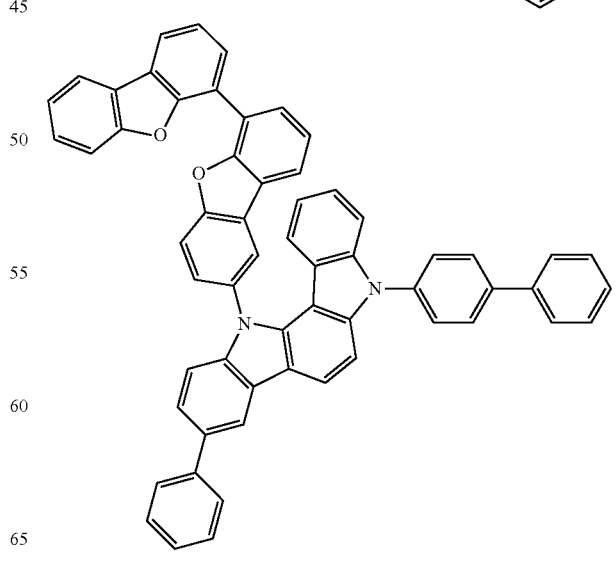

| 93 | 94 |
|---|---|
| -continued | -continued |
| 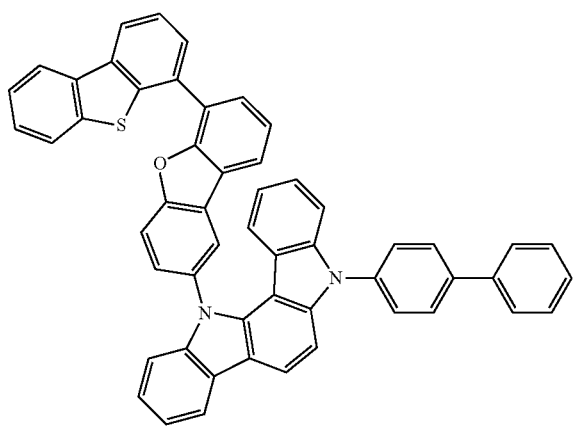 | 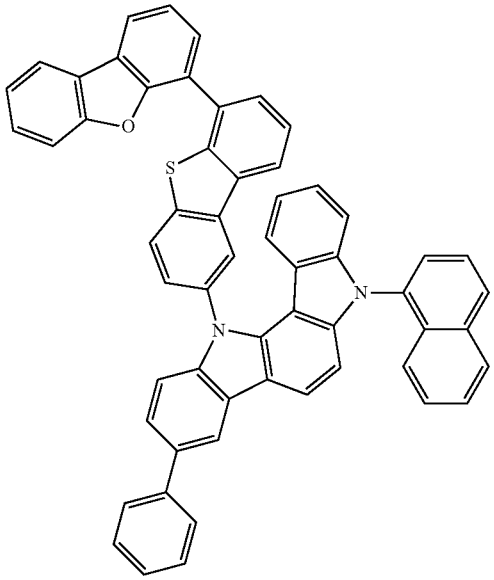 |
| 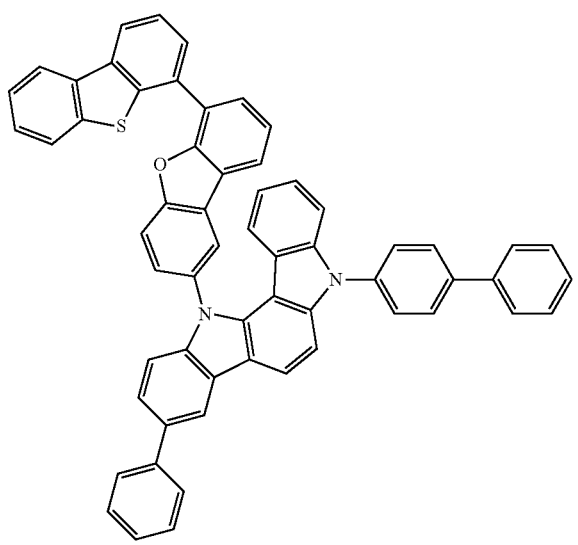 | 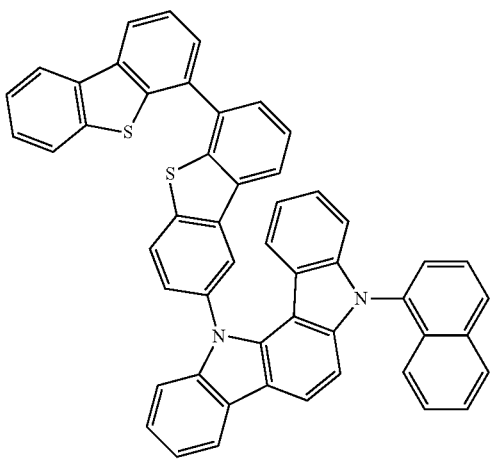 |
| 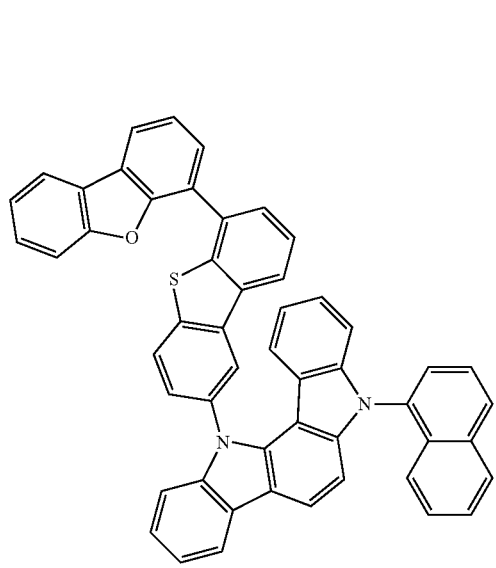 | 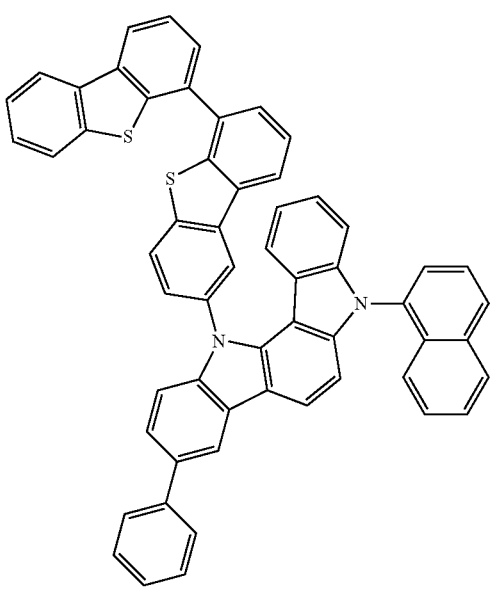 |

95
-continued
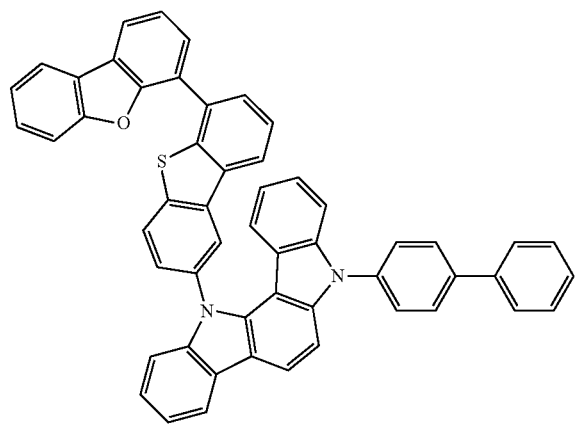
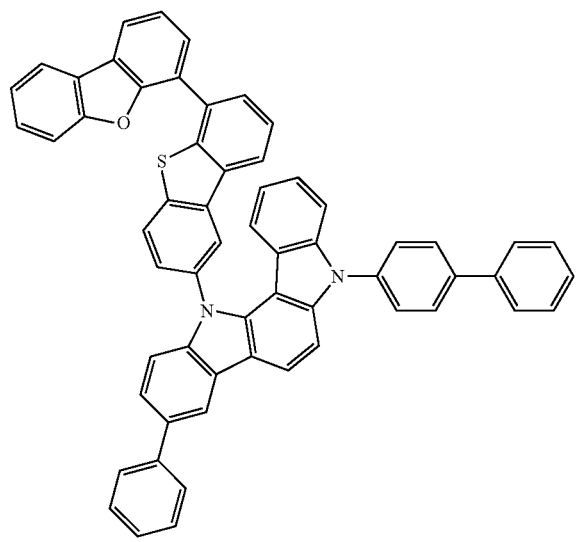
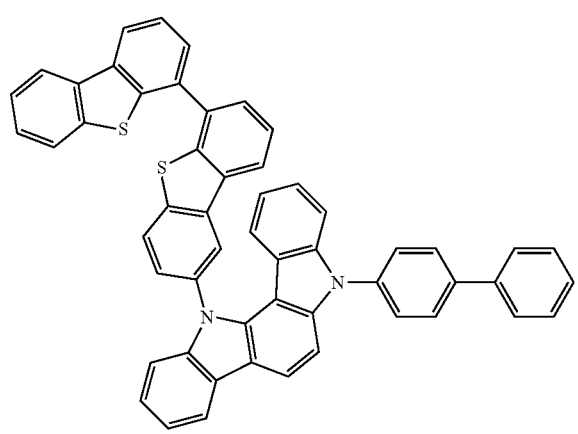
96
-continued
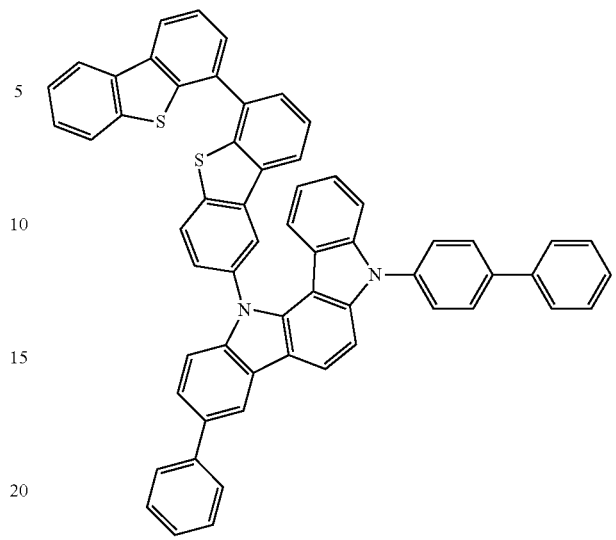
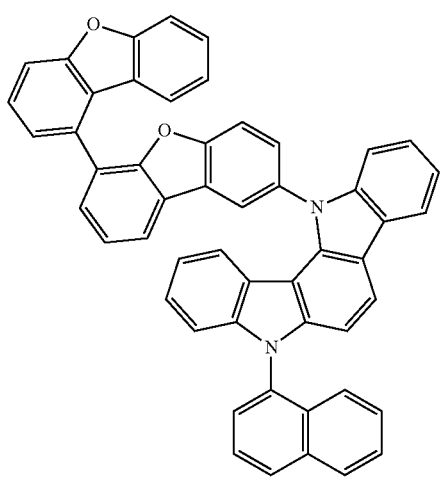
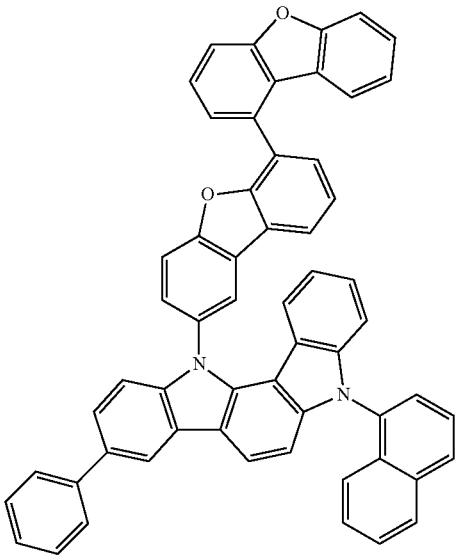

97
-continued
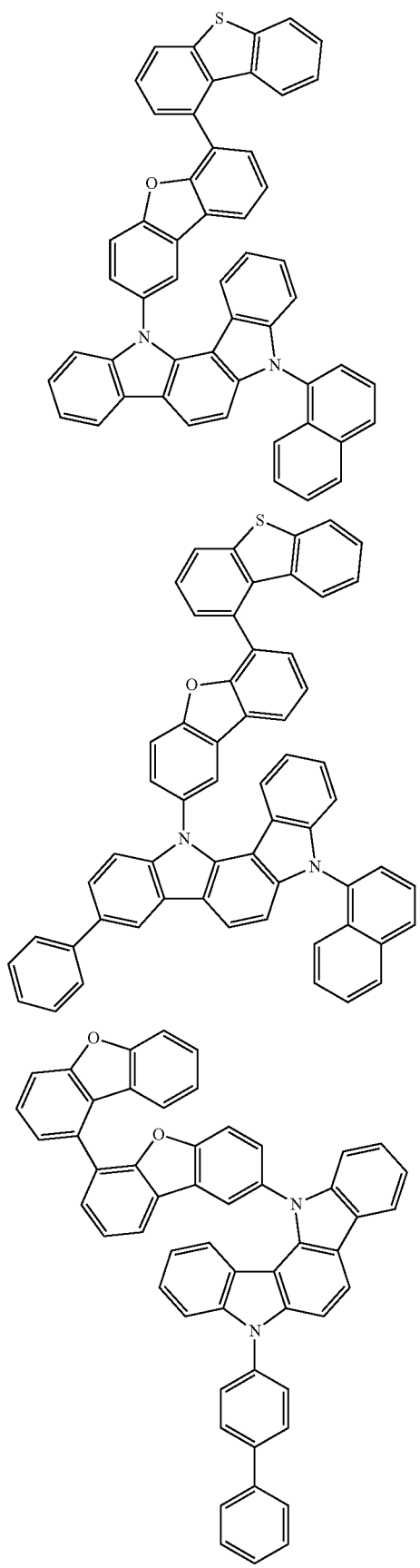
98
-continued
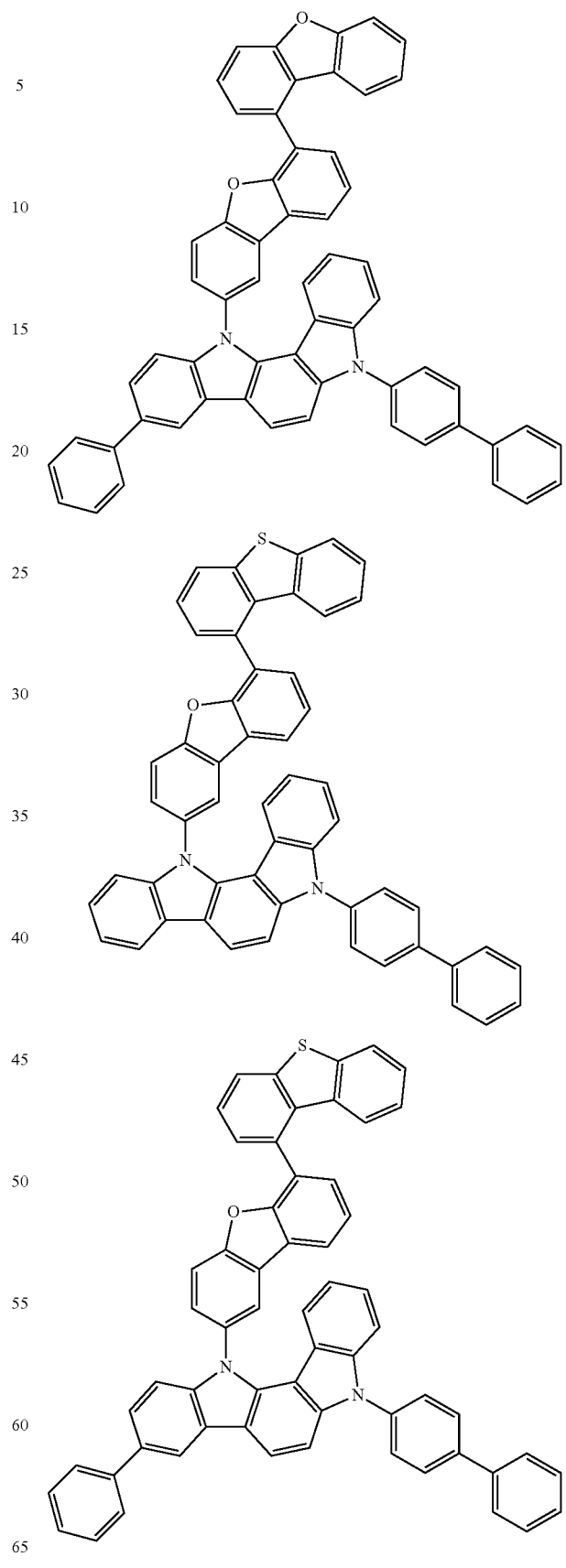

99
-continued
100
-continued
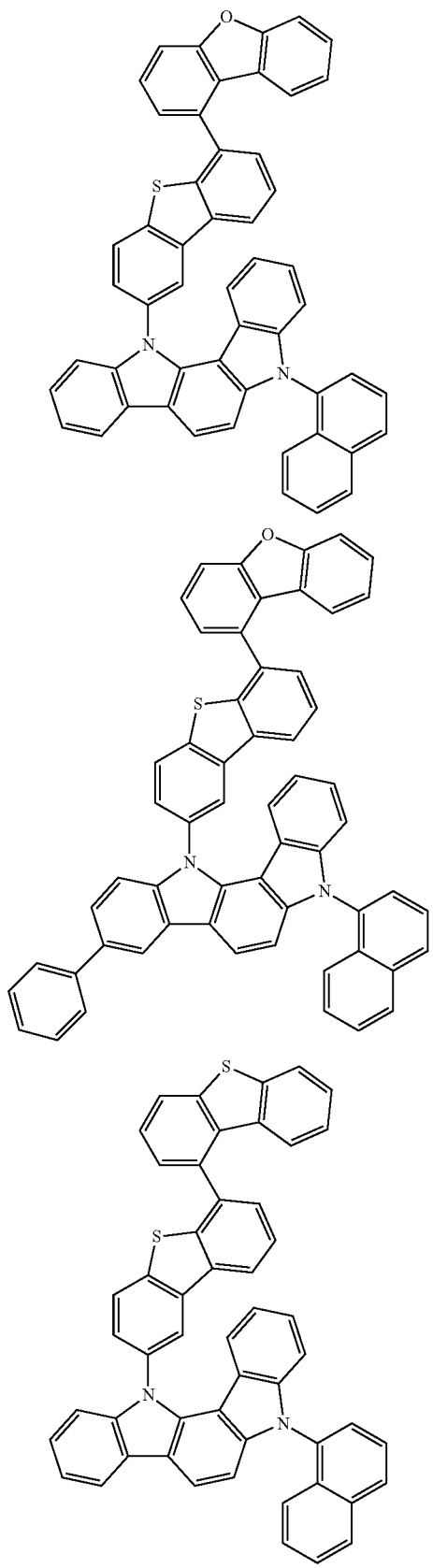
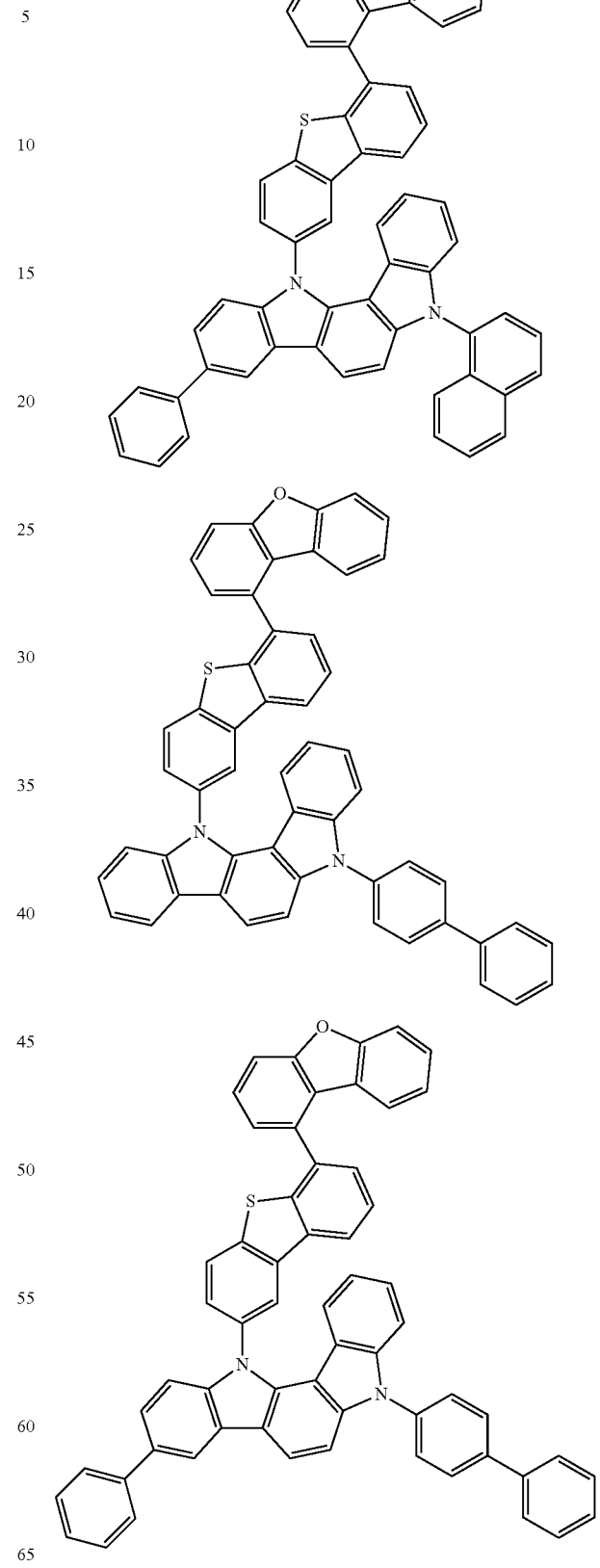

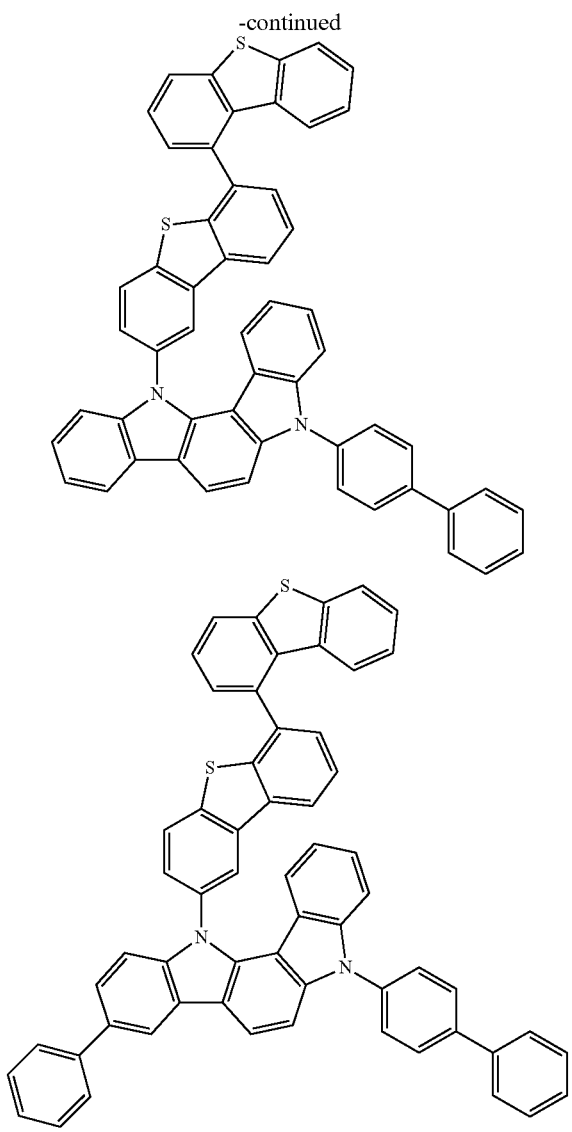

Figure 6:
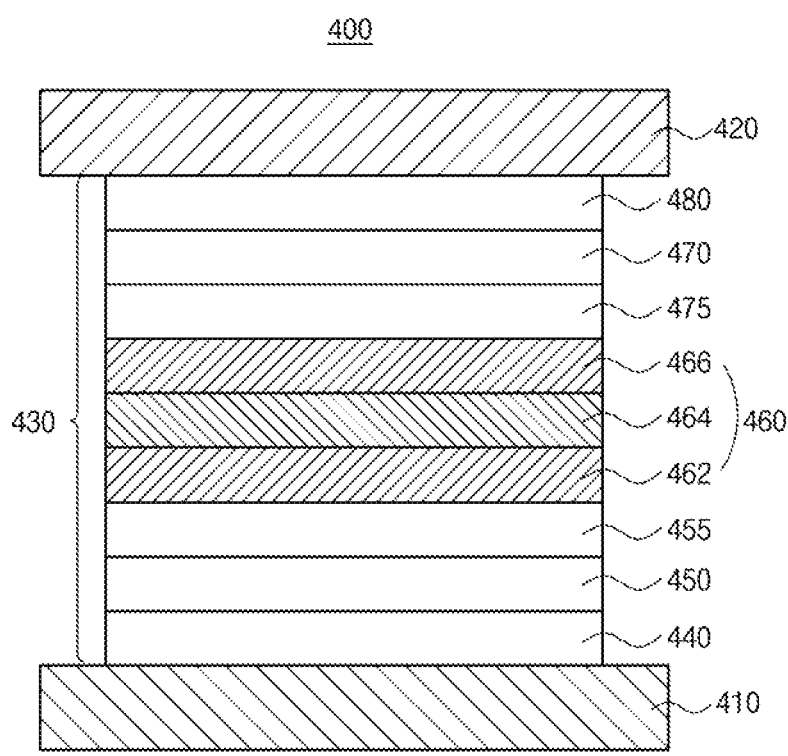
FIG. 6 is a schematic cross-sectional view illustrating an organic light-emitting diode in accordance with an another exemplary embodiment of the present disclosure.

In the above embodiment, the OLED 300 includes a double-layered EML 360. An OLED of the present disclosure may have triple or more-layered EML. FIG. 6 is a cross-sectional view illustrating an OLED in accordance with another embodiment of the present disclosure.

As illustrated in FIG. 6, the OLED 400 in accordance with the second embodiment of the present disclosure includes first and second electrodes 410 and 420 facing each other and an emission layer 430 as an emitting unit disposed between the first and second electrodes 410, 420. In one exemplary embodiment, the emission layer 430 includes a HIL 440, a HTL 450, an EML 460, an ETL 470 and an EIL 480 each of which is laminated sequentially from the first electrode 410. Besides, the emission layer 430 further includes a first exciton blocking layer, i.e. an EBL 455 disposed between the HTL 450 and the EML 460 and/or a second exciton blocking layer, i.e., a HBL 475 disposed between the EML 460 and the ETL 470.

As described above, the first electrode 410 may be an anode and include, but are not limited to, a conductive material having a relatively large work function values such as ITO, IZO, SnO, ZnO, ICO, AZO, and the like. The second electrode 420 may be a cathode and may include, but are not limited to, a conductive material having a relatively small work function values such as Al, Mg, Ca, Ag, alloy thereof or combination thereof. Each of the first and second electrodes 410 and 420 may be laminated with a thickness of, but are not limited to, about 30 nm to about 300 nm.

The HIL 440 is disposed between the first electrode 410 and the HTL 450. The HIL 440 may include, but are not limited to, MTDATA, NATA, 1T-NATA, 2T-NATA, CuPc, TCTA, NPB(NPD), HAT-CN, TDAPB, PEDOT/PSS and/or N-(biphenyl-4-yl)-9,9-dimethyl-N-(4-(9-phenyl-9H-carbazol-3-yl)phenyl)-9H-fluoren-2-amine. The HIL 440 may be omitted in compliance with the structure of the OLED 400.

The HTL 450 is disposed adjacently to the EML 460 between the first electrode 410 and the EML 460. The HTL 450 may include, but are not limited to, aromatic amine derivatives such as TPD, NPD(NPB), CBP, poly-TPD, TFB, TAPC, N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine. In one embodiment, each of the HIL 440 and the HTL 450 may be laminated with a thickness of, but are not limited to, about 5 nm to about 200 nm, preferably about 5 nm to about 100 nm.

The EML 460 includes a first EML (EML1) 462, a second EML (EML2) 464 and a third EML (EML3) 466. The configuration and the luminous mechanism in the EML1 462, the EML2 464 and the EML 466 will be explained in more detail below.

The ETL 470 is disposed between the EML 460 and the EL 480. For example, the ETL 470 may include, but are not limited to, oxadiazole-based compounds, triazole-based compounds, phenanthroline-based compounds, benzoxazole-based compounds, benzothiazole-based compounds, benzimidazole-based compounds, triazine-based compounds, and the like. For example, the ETL 470 may include, but are not limited to, Alq$_3$, PBD, spiro-PBD, Liq, TPBi, BAlq, Bphen, NBphen, BCP, TAZ, NTAZ, TpPyPB, TmPPPyTz, PFNBr, TPQ and/or 10-Di-2-naphthalenyl-2-anthracenyl)phenyl]-1-phenyl-1H-benzimidazole.

The EL 480 is disposed between the second electrode 420 and the ETL 470. The ETL 480 may include, but are not limited to, an alkali halide such as LiF, CsF, NaF, BaF$_2$ and the like, and/or an organic metal compound such as lithium benzoate, sodium stearate, and the like.

As an example, each of the ETL 470 and the EL 480 may be laminated with a thickness of, but are not limited to, about 10 nm to about 200 nm, preferably about 10 nm to about 100 nm.

Moreover, the OLED 400 in accordance with this embodiment of the present disclosure may further include at least one exciton blocking layer such as the EBL 455 and the HBL 475 each of which is disposed adjacently to the EML 460.

The EBL 455 is disposed between the HTL 450 and the EML 460. As an example, the EBL 455 may include, but are not limited to, TCTA, Tris[4-(diethylamino)phenyl]amine, N-(bipnehyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD and/or TDAPB.

The HBL 475 is disposed between the EML 460 and the ETL 470. The HBL 475 may include, but are not limited to, oxadiazole-based compounds, triazole-based compounds, phenanthroline-based compounds, benzoxazole-based compounds, benzothiazole-based compounds, benzimidazole-based compounds, and triazine-based compounds. As an example, the HBL 475 may include, but are not limited to, BCP, BAlq, Alq$_3$, PBD, spiro-PBD, Liq, B3PYMPM, DPEPO and combination thereof.

The OLED 400 includes the EML1 462, the EML2 464 and the EML 466 each of which includes materials whose energy level are controlled. Therefore, the driving voltage of the OLED 400 can be lowered to reduce the power consumption and the luminous efficiency and color continuity of the OLED 400 can be improved.

In the exemplary embodiment, the EML 460 includes the EML1 462 including a first compound and a second compound, the EML2 464 including a third compound and a fourth compound, and the EML3 466 including a fifth compound and a sixth compound. As an example, each of the first and fifth compounds may be a host, each of the second, third and sixth compounds may be a delayed fluorescent material and the fourth compound may be a fluorescent or phosphorescent material. In other words, each of the EML1 462 and the EML3 466 includes the host and the delayed fluorescent material and the EML2 464 includes the delayed fluorescent material and the fluorescent or phosphorescent material. As an example, each of the second and sixth compounds, each of which may be the delayed fluorescent material, may act as a dopant in the EML1 462 and the EML3 466, respectively. The third compound, which may be another delayed fluorescent material, may act as a host in the EML2 464.

Each of the EML1 462 and the EML3 466 includes the second and sixth compounds as the delayed fluorescent material, respectively. Accordingly, when the triplet energies of these delayed fluorescent materials in the EML1 462 and the EML3 466 are converted to the singlet energies by RISC mechanism, the singlet energies of these delayed fluorescent material can be transferred to the fourth compound as the fluorescent or phosphorescent material in the EML2 464, which is disposed adjacently to each of the EML1 462 and the EML3 466, by FRET mechanism. Accordingly, the OLED 400 may have enhanced luminous efficiency and improved color continuity.

Figure 7:
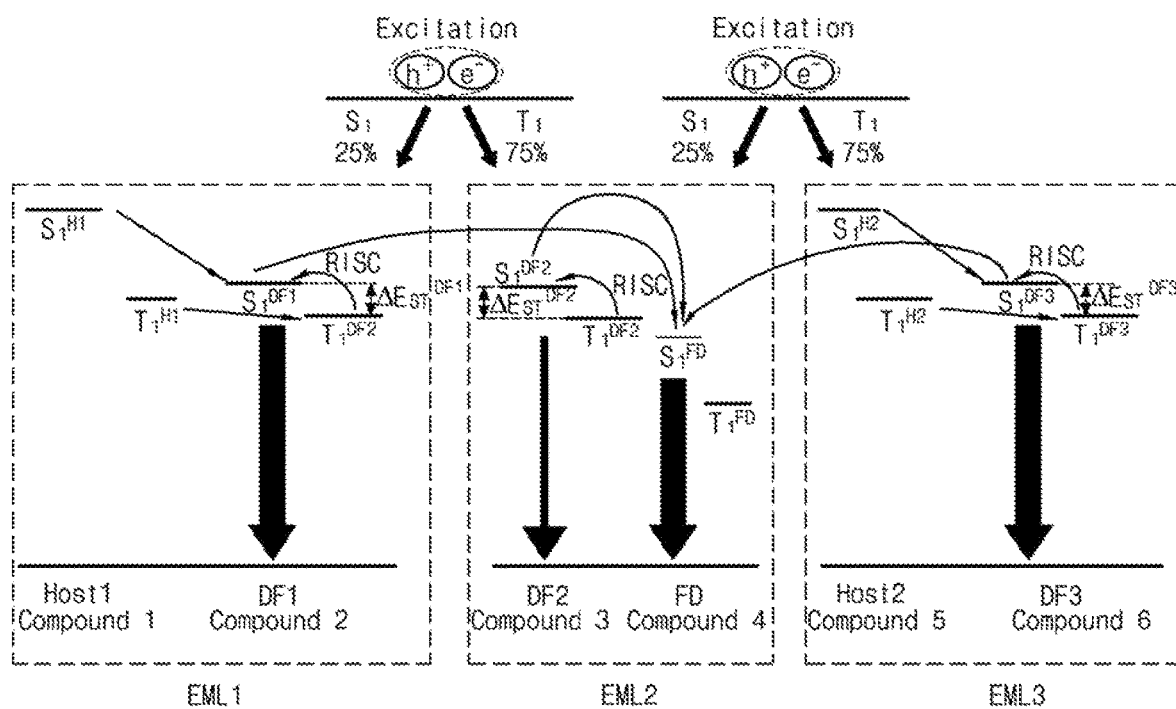
FIG. 7 is a schematic diagram illustrating luminous mechanism by energy levels among luminous materials in a triple-layered EML that includes a fluorescent material in accordance with an exemplary embodiment of the present disclosure.

It is necessary to transfer primarily the exciton energies generated in each of the first and fifth compound, each of which may be the host, to the delayed fluorescent materials and then to transfer exciton energies from the delayed fluorescent materials to the fluorescent or phosphorescent material. FIG. 7 is a schematic diagram illustrating luminous mechanism by energy levels among luminous materials in a triple-layered EML that includes a fluorescent material in accordance with an exemplary embodiment of the present disclosure.

As illustrated in FIG. 7, each of the second, third and sixth compound has an energy level bandgap $\Delta E_{ST}^{DF1}$, $\Delta E_{ST}^{DF2}$ or $\Delta E_{ST}^{DF3}$ between an excited state singlet energy level $S_1^{DF1}$, $S_1^{DF2}$ or $S_1^{DF3}$ and an excited state triplet energy level $T_1^{DF1}$, $T_1^{DF2}$ or $T_1^{DF3}$ of equal to or less than about 0.3 eV, respectively, in order to realize delayed fluorescence. In one embodiment, each of the second, third and sixth compounds may be, but are not limited to, the same materials.

In addition, each of an exited state singlet energy level $S_1^{H1}$ and an excited state triplet energy level $T_1^{H1}$ of the first compound, which may be the first host, is higher than each of the excited state singlet energy level $S_1^{DF1}$ and the excited state triplet energy level $T_1^{DF1}$ of the second compound, which may be the first delayed material, respectively. Similarly, each of an exited state singlet energy level $S_1^{H2}$ and an excited state triplet energy level $T_1^{H2}$ of the fifth compound, which may be the second host, is higher than each of the excited state singlet energy level $S_1^{DF3}$ and the excited state triplet energy level $T_1^{DF3}$ of the sixth compound, which may be the third delayed material, respectively. In an exemplary embodiment, each of the excited state singlet energy levels $S_1^{H1}$ and $S_1^{H2}$ and the excited state triplet energy levels $T_1^{H1}$ and $T_1^{H2}$ of the first and fifth compounds may be higher than each of the excited state singlet energy level $S_1^{DF2}$ and the excited state triplet energy level $T_1^{DF2}$ of the third compound, which may be the second delayed material, respectively.

As an example, when each of the excited state triplet energy levels $T_1^{H1}$ and $T_1^{H2}$ of the first and fifth compounds is not higher than each of the excited state triplet energy levels $T_1^{DF1}$, $T_1^{DF2}$ and $T_1^{DF3}$ of the second, third and sixth compounds, each of which may be the delayed fluorescent material, the triplet state excitons of those delayed fluorescent materials can be reversely transferred to the excited state triplet energy levels $T_1^{H1}$ and $T_1^{H2}$ of the first and fifth compound. Accordingly, the excitons of the triplet state level $T_1^{DF1}$ $T_1^{DF2}$ and $T_1^{DF3}$ of the delayed fluorescent materials may be quenched as a non-emission, i.e. the triplet state excitons of the delayed fluorescent materials cannot be involved in the emission. For example, each of the excited state triplet energy level $T_1^{H1}$ and $T_1^{H2}$ of the first and fifth compounds may be high by at least 0.2 eV compared to the excited state triplet energy levels $T_1^{DF1}$, $T_1^{DF2}$ and $T_1^{DF3}$ of the second, third and sixth compounds, each of which may be delayed fluorescent material.

In one exemplary embodiment, each of the first and fifth compounds, each of which may be the first host and second host, may have the excited state singlet energy levels $S_1^{H1}$ and $S_1^{H2}$ of, but are not limited to, about 3.0 eV to about 3.5 eV, and the excited state triplet energy levels $T_1^{H1}$ and $T_1^{H2}$ of, but are not limited to, about 2.5 eV to about 3.0 eV, respectively. Each of the second, third and sixth compounds, each of which may be the delayed fluorescent material, may have the excited stated singlet energy levels $S_1^{DF1}$, $S_1^{DF2}$ and $S_1^{DF3}$ of, but are not limited to, about 2.3 eV to about 3.0 eV, and the excited state triplet energy levels $T_1^{DF1}$, $T_1^{DF2}$ and $T_1^{DF3}$ of, but are not limited to, about 2.1 eV to about 2.8 eV, respectively.

Besides, it may be necessary to transfer exciton energies from the second, third and sixth compound, each of which may be the delayed fluorescent material and is respectively included in the EML1 462, the EML2 464 and the EML3 466, in which excitons of singlet and triplet energy levels are converted to the ICT state by RISC, to the fourth compound, which may be the fluorescent or phosphorescent material, in the EML2 464. For realizing such exciton energy transfers, each of the excited state singlet energy levels $S_1^{DF1}$ $S_1^{DF2}$ and $S_1^{DF3}$ and the excited state triplet energy levels $T_1^{DF1}$, $T_1^{DF2}$ and $T_1^{DF3}$ of the second, third and sixth compounds, each of which may be the delayed fluorescent materials, respectively, is higher than each of the excited state singlet energy levels $S_1^{FD}$ and the excited stat triplet energy levels $T_1^{FD}$ of the fourth compound, which is the fluorescent material.

Alternatively, each of the excited state singlet energy levels $S_1^{DF1}$, $S_1^{DF2}$ and $S_1^{DF3}$ of the second, third and sixth compounds may not be higher than an excited state singlet energy level of the fourth compound as the phosphorescent material, while each of the excited state triplet energy levels $T_1^{DF1}$, $T_1^{DF2}$ and $T_1^{DF3}$ of the second, third and sixth compounds, each of which may be delayed fluorescent materials, respectively, may be higher than the excited state triplet energy level $T_1^{PD}$ of the fourth compound as the phosphorescent material in the EML2 464.

The triplet state exciton energies generated in the second and sixth compound each of which is included respectively in the EML1 462 and the EML3 466 may be transferred to the fourth compound in the EML2 464 disposed adjacently to the EML1 462 and the EML3 466, via FRET mechanism which occurs very slowly compared to DRET mechanism. As the singlet exciton energy as well as the triplet exciton energy of the second and sixth compounds is transferred to the fourth compound, the OLED 400 can enhance its luminous efficiency. In addition, the color continuity of the OLED 400 can be improved because the light emission occurs in the second and sixth compounds, each of which have different luminescence spectrum form that of the fourth compound, as well as in the fourth compound. Moreover, since the doping concentration of the fourth compound can be increased to 1% by weight or more in the EML2 464, the EML 360 can realize a uniform luminescence spectrum even if the fourth compound is doped with slightly different concentrations across the whole region of the EML2 464.

In an exemplary embodiment, an energy level bandgap ($|HOMO^H-HOMO^{DF}|$) between a HOMO energy level $HOMO^H$ of the first and fifth compound, each of which may be the first host and the second host, and a HOMO energy level $HOMO^{DF}$ of the second and sixth compounds, each of which may be the first delayed fluorescent material and the third delayed fluorescent material, or an energy level bandgap ($|LUMO^H-LUMO^{DF}|$) between a LUMO energy level $LUMO^H$ of the first and fifth compounds and a LUMO energy level $LUMO^{DF}$ of the second and sixth compounds may be equal to or less than about 0.5 eV, for example, between about 0.1 eV to about 0.5 eV.

In one exemplary embodiment, the HOMO energy level $HOMO^{H1}$ of the first compound, which may be the first host, is deeper or lower than the HOMO energy level $HOMO^{DF1}$ of the second compound, which may be the first delayed fluorescent material. In addition, the HOMO energy level $HOMO^{H2}$ of the fifth compound, which may be the second host, is deeper or lower than the HOMO energy level $HOMO^{DF2}$ of the sixth compound, which may be the third delayed fluorescent material. Moreover, the LUMO energy level $LUMO^{H1}$ of the first compound is shallower or higher than the LUMO energy level $LUMO^{DF1}$ of the second compound and the LUMO energy level $LUMO^{H2}$ of the fifth compound is shallower or higher than the LUMO energy level $LUMO^{DF2}$ of the sixth compound. In this case, exciplex formations between the first and second compound and/or between the fifth and sixth compound may be inhibited or minimized so that the OLED 400 may have enhanced luminous efficiency.

In one exemplary embodiment, the first and fifth compounds, each of which may be the host, may have the HOMO energy level $HOMO^H$ of, but are not limited to, about −5.5 eV to about −6.0 eV, preferably about −5.7 eV to about −5.9 eV and have the LUMO energy level $LUMO^H$ of, but are not limited to, about −2.0 eV to about −2.5 eV, preferably about −2.0 eV to about −2.4 eV. Moreover, each of the second, third and sixth compounds, each of which may be the delayed fluorescent materials, may have the HOMO energy level $HOMO^{DF}$ of, but is not limited to, −5.7 eV to about −6.0 eV and have the LUMO energy level LUMODF of, but are not limited to, about −2.8 eV to about −3.5 eV, respectively.

Moreover, the fourth compound, which may be the fluorescent material, may have a HOMO energy level $HOMO^{FD}$ of, but are not limited to, about −5.2 eV to about −5.7 eV, preferably about −5.3 eV to about −5.6 eV and have a LUMO energy level LUMOFD of, but is not limited to, about −3.0 eV to about −3.5 eV. Also, the fourth compound, which may be the phosphorescent material, may have a HOMO energy level $HOMO^{PD}$ of, but are not limited to, about −5.6 eV to about −6.0 eV and have a LUMO energy level LUMOPD of, but are not limited to, about −3.0 eV to about −3.3 eV.

As an example, each of the first and fifth compounds may respectively include, but are not limited to, mCP, mCBP, CBP and/or TmPyPB. In an alternative embodiment, each of the first and fifth compounds may include respectively, but are not limited to, anyone of the organic compounds represented by Chemical Formulae 1 or 2.

In another exemplary embodiment, the first compound may be the same material as the EBL 455. As an example, the material of the EBL 455 usable as the first compound has the HOMO energy level $HOMO^{EBL}$ lower than the HOMO energy level $HOMO^{DF1}$ of the second compound and an excited state triple energy level $T_1^{EBL}$ higher than the excited state triplet energy level $T_1^{DF1}$ of the second compound. In this case, the EML1 462 (See, FIG. 6) may have an electron blocking function as well as an emission function. In other words, the EML1 462 can act as a buffer layer for blocking electrons. In one embodiment, the EBL 455 may be omitted where the EML1 462 may be an electron blocking layer as well as an emitting material layer.

In another exemplary embodiment, the fifth compound of the EML3 466 may be the same material as the HBL 475. As an example, the material of the HBL 475 usable as the fifth compound has a LUMO energy level $LUMO^{HBL}$ higher than the LUMO energy level $LUMO^{DF3}$ of the sixth compound and an excited state triple energy level $T_1^{HBL}$ higher than the excited state triplet energy level $T_1^{DF3}$ of the sixth compound. In this case, the EML3 466 may have a hole blocking function as well as an emission function. In other words, the EML3 466 can act as a buffer layer for blocking hole. In one embodiment, the HBL 475 may be omitted where the EML3 466 may be a hole blocking layer as well as an emitting material layer.

In still another exemplary embodiment, the first compound in the EML1 462 may be the same material as the EBL 455 and the fifth compound of the EML3 466 may be the same material as the HBL 475. As an example, the material of the EBL 455 usable as the first compound has the HOMO energy level $HOMO^{EBL}$ lower than the HOMO energy level $HOMO^{DF1}$ of the second compound and the excited state triple energy level $T_1^{EBL}$ higher than the excited state triplet energy level $T_1^{DF1}$ of the second compound. Moreover, the material of the HBL 475 usable as the fifth compound has the LUMO energy level $LUMO^{HBL}$ higher than the LUMO energy level $LUMO^{DF3}$ of the sixth compound and the excited state triple energy level $T_1^{HBL}$ higher than the excited state triplet energy level $T_1^{DF3}$ of the sixth compound.

In this embodiment, the EML1 462 may have an electron blocking function as well as an emission function and the EML3 466 may have a hole blocking function as well as an emission function. In other words, each of the EML1 462 and the EML3 466 can act as buffer layers for blocking electrons and for blocking holes, respectively. The EBL 455 and the HBL 475 may be omitted where the EML1 462 may be an electron blocking layer as well as an emitting material layer and the EML3 466 may be a hole blocking layer as well as an emitting material layer.

The second, third and sixth compounds, each of which is the delayed fluorescent material, may have the electron acceptor moiety and the electron donor moiety separated from the electron acceptor moiety. As an example, each of the second, third and sixth compound may include, but are not limited to, anyone of the organic compound having the structure of Chemical Formula 3 above, respectively.

The fourth compound as the fluorescent material may be, but are not limited to, anyone of the organic compound having the structure of Chemical Formula 4 above. Alternatively, the fourth compound as the phosphorescent material may be, but are not limited to, anyone of the metal complex having the structure of Chemical Formula 5 above.

In one exemplary embodiment, each of the weight ratios of the first and fifth compounds may be equal to or more than each of the weight ratios of the second and sixth compounds in the EML1 462 and the EML3 466, respectively. As an example, each of the EML1 462 and the EML3 466 may include, but are not limited to, each of the first and fifth compound of about 50 to about 95% by weight, preferably about 60 to about 80% by weight, respectively, and include, but are not limited to, each of the second and sixth compounds of about 5 to about 50% by weight, preferably about 20 to about 40% by weight, respectively. When the contents of the second and sixth compounds as the delayed fluorescent materials is larger than the contents of the first and fifth compound as the host, the self-quenching phenomenon of the delayed fluorescent materials may lower the luminous efficiency of the OLED 400.

In another embodiment, the weight ratio of the third compound may be more than the weight ratio of the fourth compound. As an example, the EML2 464 may include, but is not limited to, the third compound of about 90 to about 99% by weight, preferably about 95 to about 99% by weight, and the fourth compound of about 1 to about 10% by weight, preferably about 1 to about 5% by weight.

In an alternative embodiment, each of the weight ratios of the second and sixth compound as the delayed fluorescent material in the EML1 462 and the EML3 466 may be more than the weight ratio of the fourth compound as the fluorescent or phosphorescent material in the EML2 464, respectively. Accordingly, exciton energy can be transferred sufficiently to the fourth compound as the fluorescent or phosphorescent material in the EML2 464 from the second and sixth compound as the delayed fluorescent material in the EML1 462 and the EML3 466 through FRET mechanism.

In one exemplary embodiment, each of the EML1 462, the EML2 464 and the EML3 466 may be laminated with a thickness of, but are not limited to, about 5 nm to about 100 nm, preferably about 10 nm to about 30 nm, and more preferably about 10 nm to about 20 nm.

The triplet exciton energies generated in the second and sixth compounds, which may be the delayed fluorescent material, in the EML1 462 and the EML3 466 not converted to the singlet energy of the second and sixth compounds, may be transferred to the triplet energy of the fourth compound, which may be the fluorescent or phosphorescent material in the EML2 464, and as a result, the luminous efficiency of the OLED 400 may be decreased. With regard to preventing or minimizing the decrease in the quantum efficiency, a first energy control layer may be disposed between the EML1 462 and the EML2 464 and a second energy control layer may be disposed between the EML2 464 and the EML3 466. Each of the first and second energy control layers may include a material having an excited state triplet energy level higher than the excited state triplet energy levels of the delayed fluorescent materials. As an example, each of the first and second energy control layers may include, but are not limited to, anyone of the organic compound having the structure of anyone of Chemical Formulae 6 to 8 above.

In the second embodiment, each of the EML1 462 and the EML3 466 includes the first and fifth compound as the hosts and the second and sixth compound as the delayed fluorescent material, respectively. Besides, the EML2 464 includes the third compound as the delayed fluorescent material and the fourth compound as the fluorescent or phosphorescent material. In other words, the EML2 464 including the delayed fluorescent material and the fluorescent or phosphorescent material is disposed in the middle of the EML 460, and each of the EML1 462 and the EML3 466, each of which includes the host and the delayed fluorescent material, is disposed under or on the EML2 464. Alternatively, each of emitting material layers including the delayed fluorescent material and the fluorescent or phosphorescent material may be disposed on a top side or a bottom side, and another emitting material layer including the host and the delayed fluorescent material may be disposed between the top and bottom sides.

Figure 8:
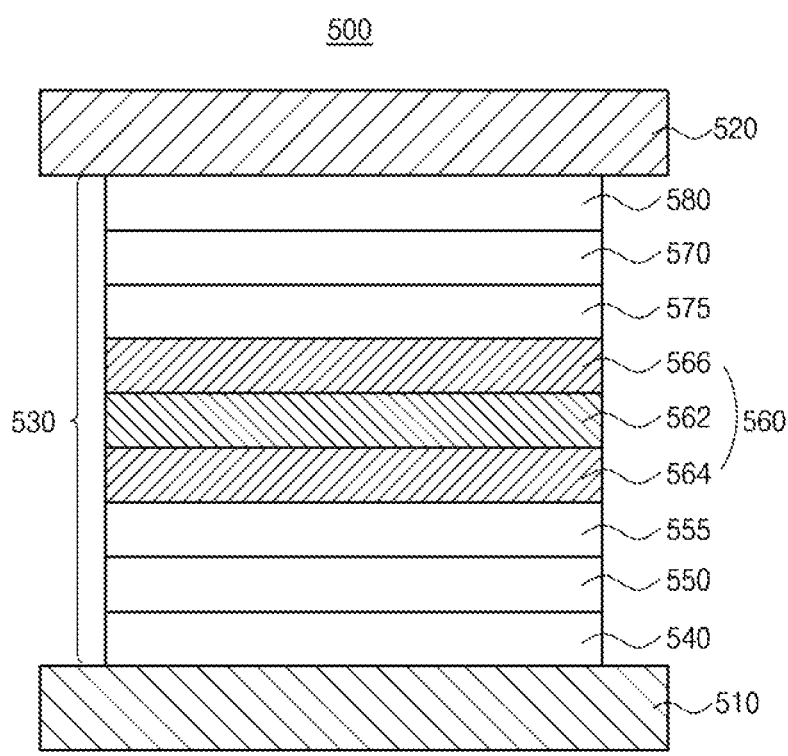
FIG. 8 is a schematic cross-sectional view illustrating an organic light-emitting diode having a triple-layered EML in accordance with still another exemplary embodiment of the present disclosure.

FIG. 8 is a schematic cross-sectional view illustrating an OLED in accordance with still another exemplary embodiment of the present disclosure. As illustrated in FIG. 8, the OLED 500 in accordance with the third embodiment of the present disclosure includes first and second electrodes 510 and 520 facing each other and an emission layer 530 as an emitting unit disposed between the first and second electrodes 510, 520. In one exemplary embodiment, the emission layer 530 includes a HIL 540, a HTL 550, an EML 560, an ETL 570 and an EIL 580 each of which is laminated sequentially from the first electrode 510. Besides, the emission layer 530 further includes a first exciton blocking layer, i.e. an EBL 555 disposed between the HTL 550 and the EML 560 and/or a second exciton blocking layer, i.e., a HBL 575 disposed between the EML 560 and the ETL 570.

As described above, the first electrode 510 may be an anode and include, but are not limited to, a conductive material having a relatively large work function values such as ITO, IZO, SnO, ZnO, ICO, AZO, and the like. The second electrode 520 may be a cathode and may include, but are not limited to, a conductive material having a relatively small work function values such as Al, Mg, Ca, Ag, alloy thereof or combination thereof. Each of the first and second electrodes 510 and 520 may be laminated with a thickness of, but are not limited to, about 30 nm to about 300 nm.

The HIL 540 is disposed between the first electrode 510 and the HTL 550. The HIL 540 may include, but are not limited to, MTDATA, NATA, 1T-NATA, 2T-NATA, CuPc, TCTA, NPB(NPD), HAT-CN, TDAPB, PEDOT/PSS and/or N-(biphenyl-4-yl)-9,9-dimethyl-N-(4-(9-phenyl-9H-carbazol-3-yl)phenyl)-9H-fluoren-2-amine. The HIL 540 may be omitted in compliance with the structure of the OLED 500.

The HTL 550 is disposed adjacently to the EML 560 between the first electrode 510 and the EML 560. The HTL 550 may include, but is not limited to, aromatic amine derivatives such as TPD, NPD(NPB), CBP, poly-TPD, TFB, TAPC, N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine. In one embodiment, each of the HIL 540 and the HTL 550 may be laminated with a thickness of, but are not limited to, about 5 nm to about 200 nm, preferably about 5 nm to about 100 nm.

The EML 560 includes a first EML (EML1) 562, a second EML (EML2) 564 and a third EML (EML3) 566. The configuration and the luminous mechanism in the EML1 562, the EML2 564 and the EML3 566 will be explained in more detail below.

The ETL 570 is disposed between the EML 560 and the EIL 580. For example, the ETL 570 may include, but are not limited to, oxadiazole-based compounds, triazole-based compounds, phenanthroline-based compounds, benzoxazole-based compounds, benzothiazole-based compounds, benzimidazole-based compounds, triazine-based compounds, and the like. For example, the ETL 570 may include, but are not limited to, Alq$_3$, PBD, spiro-PBD, Liq, TPBi, BAlq, Bphen, NBphen, BCP, TAZ, NTAZ, TpPyPB, TmPPPyTz, PFNBr, TPQ and/or 10-Di-2-naphthalenyl-2-anthracenyl)phenyl]-1-phenyl-1H-benzimidazole.

The EIL 580 is disposed between the second electrode 520 and the ETL 570. The ETL 580 may include, but are not limited to, an alkali halide such as LiF, CsF, NaF, BaF$_2$ and the like, and/or an organic metal compound such as lithium benzoate, sodium stearate, and the like.

As an example, each of the ETL 570 and the EIL 580 may be laminated with a thickness of, but are not limited to, about 10 nm to about 200 nm, preferably about 10 nm to about 100 nm.

Moreover, the OLED 500 in accordance with this embodiment of the present disclosure may further include at least one exciton blocking layer such as the EBL 555 and the HBL 575 each of which is disposed adjacently to the EML 460.

As an example, the EBL 555 may include, but are not limited to, TCTA, Tris[4-(diethylamino)phenyl]amine, N-(bipnehyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD and/or TDAPB.

The HBL 575 may include, but are not limited to, oxadiazole-based compounds, triazole-based compounds, phenanthroline-based compounds, benzoxazole-based compounds, benzothiazole-based compounds, benzimidazole-based compounds, and triazine-based compounds. As an example, the HBL 575 may include, but are not limited to, BCP, BAlq, Alq$_3$, PBD, spiro-PBD, Liq, B3PYMPM, DPEPO and combination thereof.

The OLED 500 includes the EML1 562, the EML2 564 and the EML 566 each of which includes materials whose energy level are controlled. Therefore, the driving voltage of the OLED 500 can be lowered to reduce the power consumption and the luminous efficiency and color continuity of the OLED 500 can be improved.

In the third embodiment of the present disclosure, the EML 560 includes the EML1 562 including a first compound and a second compound, the EML2 564 including a third compound and a fourth compound, and the EML3 566 including a fifth compound and a sixth compound. As an example, the first compound may be a host, each of the second, third and fifth compounds may be a delayed fluorescent material and each of the fourth and sixth compounds may be a fluorescent or phosphorescent material.

In other words, the EML1 562 includes the host and the delayed fluorescent material and each of the EML2 564 and the EML3 566 includes the delayed fluorescent material and the fluorescent or phosphorescent material. As an example, the second compound, which may be the delayed fluorescent material, may act as a dopant in the EML1 562. Each of the third and fifth compounds, each of which may be another delayed fluorescent material, may act as a host in the EML2 564 and the EML3 566, respectively.

The EML1 562 includes the second compound as the delayed fluorescent material. Accordingly, when the triplet energies of the delayed fluorescent materials in the EML1 562 are converted to the singlet energies by RISC mechanism, the singlet energies of the delayed fluorescent material can be transferred to the fourth and sixth compound as the fluorescent or phosphorescent material in the EML2 564 and the EML3 566, each of which is disposed adjacently to the EML1 562, by FRET mechanism. Accordingly, the OLED 500 may have enhanced luminous efficiency and improved color continuity.

Figure 9:
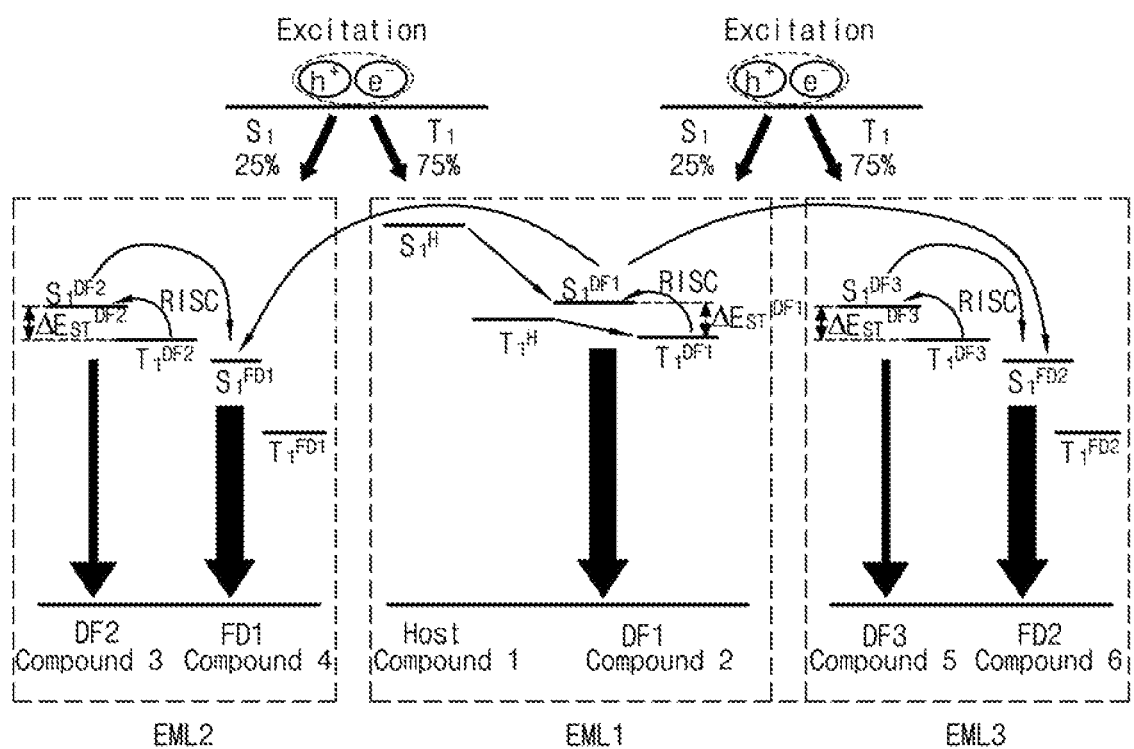
FIG. 9 is a schematic diagram illustrating luminous mechanism by energy levels among luminous materials in a triple-layered EML that includes a fluorescent material in accordance with still another exemplary embodiment of the present disclosure.

It is necessary to adjust appropriately the constructions and energy levels among the luminous compounds included in the EML 560 of the OLED 500 in accordance with the third embodiment of the present disclosure. Particularly, it is necessary to transfer primarily the exciton energies generated in the first compound, which may be the host, to the delayed fluorescent materials and then to transfer exciton energies from the delayed fluorescent materials to the fluorescent or phosphorescent material. FIG. 9 is a schematic diagram illustrating luminous mechanism by energy levels among luminous materials in a triple-layered EML that includes a fluorescent material in accordance with an exemplary embodiment of the present disclosure.

As illustrated in FIG. 9, each of the second, third and fifth compound has an energy level bandgap $\Delta E_{ST}^{DF1}$, $\Delta E_{ST}^{DF2}$ or $\Delta E_{ST}^{DF3}$ between an excited state singlet energy level $S_1^{DF1}$, $S_1^{DF2}$ or $S_1^{DF3}$ and an excited state triplet energy level $T_1^{DF1}$, $T_1^{DF2}$ or $T_1^{DF3}$ of equal to or less than about 0.3 eV, respectively, in order to realize delayed fluorescence. In one embodiment, each of the second, third and fifth compounds may be, but are not limited to, the same materials.

Accordingly, the triplet exciton energy of the second compound, which may be the first delayed fluorescent material and is included in the EML1 562, is converted to the singlet energy of its own by RISC mechanism, the singlet energy of the second compound can be transferred to the fourth and sixth compounds, each of which is the fluorescent or phosphorescent material, in the EML2 564 and the EML3 566, each of which is disposed adjacently to the EML1 562, by FRET mechanism. Besides, each of the triplet exciton energy of the third and fifth compounds, each of which is the second or third delayed fluorescent material and included in the EML2 564 and the EML3 566, is converted to each of the singlet energies of their own by RISC mechanism, each of the singlet energies of the third and fifth compounds can be transferred to the fourth and sixth compounds, each of which is the fluorescent or phosphorescent material, in the same EMLs by DRET mechanism.

In order to realize such energy transfers, each of an exited state singlet energy level $S_1^H$ and an excited state triplet energy level $T_1^H$ of the first compound, which may be the host, is higher than each of an excited state singlet energy level $S_1^{DF1}$ and an excited state triplet energy level $T_1^{DF1}$ of the second compound, which may be the first delayed material, respectively. In one exemplary embodiment, each of the exited state singlet energy level $S_1^H$ and the excited state triplet energy level $T_1^H$ of the first compound may be higher than each of excited state singlet energy levels $S_1^{DF2}$ and $S_1^{DF3}$ and excited state triplet energy levels $T_1^{DF2}$ and $T_1^{DF3}$ of the third and fifth compound, each of which may be the second and third delayed materials, respectively.

As an example, when the excited state triplet energy level $T_1^H$ of the first compound is not higher enough than each of the excited state triplet energy levels $T_1^{DF1}$ $T_1^{DF2}$ and $T_1^{DF3}$ of the second, third and fifth compounds, each of which may be the delayed fluorescent material, the triplet state excitons of those delayed fluorescent materials can be reversely transferred to the excited state triplet energy levels $T_1^H$ of the first compound. Accordingly, the excitons of the triplet state level $T_1^{DF1}$, $T_1^{DF2}$ and $T_1^{DF3}$ of the delayed fluorescent materials may be quenched as a non-emission, i.e. the triplet state excitons of those delayed fluorescent materials cannot be involved in the emission. For example, the excited state triplet energy level $T_1^H$ of the first compound may be high by at least 0.2 eV compared to the excited state triplet energy levels $T_1^{DF1}$, $T_1^{DF2}$ and $T_1^{DF3}$ of the second, third and fifth compounds, each of which may be delayed fluorescent material.

In one exemplary embodiment, the first compound, which may be the host, may have the excited state singlet energy levels $S_1^H$ of, but are not limited to, about 3.0 eV to about 3.5 eV, and the excited state triplet energy levels $T_1^H$ of, but are not limited to, about 2.5 eV to about 3.0 eV, respectively. Each of the second, third and fifth compounds, each of which may be the delayed fluorescent material, may have the excited stated singlet energy levels $S_1^{DF1}$, $S_1^{DF2}$ and $S_1^{DF3}$ of, but are not limited to, about 2.3 eV to about 3.0 3V, and the excited state triplet energy levels $T_1^{DF1}$, $T_1^{DF2}$ and $T_1^{DF3}$ of, but are not limited to, about 2.1 eV to about 2.8 eV, respectively.

Besides, it may be necessary to transfer exciton energies to the fourth and sixth compounds, each of which may be the fluorescent or phosphorescent material, in the EML2 564 and the EML 566 from the second compound, which may be the first delayed fluorescent material and is included in the EML1 562, in which excitons of singlet and triplet energy levels are converted to the ICT state by RISC, as well as from the third and fifth compounds, each of which may be the second and third delayed fluorescent materials and is included in the EML2 564 and the EML3 566, in which excitons of singlet and triplet energy levels are converted to the ICT state by RISC. For realizing such exciton energy transfers, each of the excited state singlet energy levels $S_1^{DF1}$, $S_1^{DF2}$ and $S_1^{DF3}$ and the excited state triplet energy levels $T_1^{DF1}$, $T_1^{DF2}$ and $T_1^{DF3}$ of the second, third and fifth compounds, each of which may be the delayed fluorescent materials, respectively, is higher than each of the excited state singlet energy levels $S_1^{FD1}$ and $S_1^{FD2}$ and the excited state triplet energy levels $T_1^{FD1}$ and $T_1^{FD2}$ of the fourth and sixth compounds, each of which is the fluorescent material.

Alternatively, each of the excited state singlet energy levels $S_1^{DF1}$, $S_1^{DF2}$ and $S_1^{DF3}$ of the second, third and fifth compounds may not be higher than an excited state singlet energy level of the fourth and sixth compound as the phosphorescent material, while each of the excited state triplet energy levels $T_1^{DF1}$, $T_1^{DF2}$ and $T_1^{DF3}$ of the second, third and fifth compounds, each of which may be delayed fluorescent materials, respectively, may be higher than the excited state triplet energy levels of the fourth and sixth compound as the phosphorescent material in the EML2 564 and the EML3 566.

The triplet state exciton energies generated in the second compound, which is the first delayed fluorescent material and included in the EML1 562, may be transferred to the fourth and sixth compounds, each of which is fluorescent or phosphorescent material and included in the EML2 564 and the EML3 566 disposed adjacently to the EML1 562, via FRET mechanism which is done very slowly compared to DRET mechanism. As the singlet exciton energy as well as the triplet exciton energy of the second compound is transferred to the fourth and sixth compounds, the OLED 500 can enhance its luminous efficiency. In addition, the color continuity of the OLED 500 can be improved because the light emission occurs in the second compound, which have different luminescence spectrum form that of the fourth and sixth compounds, as well as in the fourth and sixth compounds. Moreover, since the doping concentration of the fourth and sixth compounds can be increased to 1% by weight or more in the EML2 564 and the EML3 566, the EML 560 can realize a uniform luminescence spectrum even if the fourth and sixth compounds are doped with slightly different concentrations across the whole region of the EML2 564 and the EML3 566.

In an exemplary embodiment, an energy level bandgap ($HOMO^H$-$HOMO^{DF}$|) between a HOMO energy level $HOMO^H$ of the first compound, each of which may be the host, and a HOMO energy level $HOMO^{DF}$ of the second compounds, which may be the first delayed fluorescent material, or an energy level bandgap (|$LUMO^H$-$LUMO^{DF}$|) between a LUMO energy level $LUMO^H$ of the first compounds and a LUMO energy level $LUMO^{DF}$ of the second compounds may be equal to or less than about 0.5 eV, for example, between about 0.1 eV to about 0.5 eV.

In one exemplary embodiment, the HOMO energy level $HOMO^H$ of the first compound, which may be the host, is deeper or lower than the HOMO energy level $HOMO^{DF1}$ of the second compound, which may be the first delayed fluorescent material. Moreover, the LUMO energy level $LUMO^H$ of the first compound is higher or shallower than the LUMO energy level $LUMO^{DF1}$ of the second compound. In this case, exciplex formations between the first and second compound may be inhibited or minimized so that the OLED 500 may have enhanced luminous efficiency.

In one exemplary embodiment, the first compound, which may be the host, may have the HOMO energy level $HOMO^H$ of, but are not limited to, about −5.5 eV to about −6.0 eV, preferably about −5.7 eV to about −5.9 eV and have the LUMO energy level $LUMO^H$ of, but are not limited to, about −2.0 eV to about −2.5 eV, preferably about −2.0 eV to about −2.4 eV. Moreover, each of the second, third and fifth compounds, each of which may be the delayed fluorescent materials, may have the HOMO energy level $HOMO^{DF}$ of, but are not limited to, −5.7 eV to about −6.0 eV and have the LUMO energy level $LUMO^{DF}$ of, but are not limited to, about −2.8 eV to about −3.5 eV, respectively.

Moreover, the fourth and sixth compounds, each of which may be the fluorescent material, may have a HOMO energy level $HOMO^{FD}$ of, but are not limited to, about −5.2 eV to about −5.7 eV, preferably about −5.3 eV to about −5.6 eV and have a LUMO energy level LUMOFD of, but are not limited to, about −3.0 eV to about −3.5 eV. Also, the fourth and sixth compounds, each of which may be the phosphorescent material, may have a HOMO energy level $HOMO^{PD}$ of, but are not limited to, about −5.6 eV to about −6.0 eV and have a LUMO energy level LUMOPD of, but are not limited to, about −3.0 eV to about −3.3 eV.

As an example, the first compound may include, but are not limited to, mCP, mCBP, CBP and/or TmPyPB. In an alternative embodiment, the first compound may include, but are not limited to, anyone of the organic compounds represented by Chemical Formula 1 or 2.

The second, third and fifth compounds, each of which is the delayed fluorescent material, may have the electron acceptor moiety and the electron donor moiety separated from the electron acceptor moiety. As an example, each of the second, third and fifth compound may include, but are not limited to, anyone of the organic compound having the structure of Chemical Formula 3 above, respectively.

The fourth and sixth compounds as the fluorescent material may be, but are not limited to, anyone of the organic compound having the structure of Chemical Formula 4 above. Alternatively, the fourth and sixth compounds as the phosphorescent material may be, but are not limited to, anyone of the metal complex having the structure of Chemical Formula 5 above.

In one exemplary embodiment, the weight ratio of the first compound may be equal to or more than the weight ratio of the second compound in the EML1 562. As an example, the EML1 562 may include, but are is limited to, the first compound of about 50 to about 95% by weight, preferably about 60 to about 80% by weight and include, but are not limited to, the second compound of about 5 to about 50% by weight, preferably about 20 to about 40% by weight. When the contents of the second compound as the delayed fluorescent materials is larger than the contents of the first compound as the host, the self-quenching phenomenon of the delayed fluorescent material may lower the luminous efficiency of the OLED 500.

In another embodiment, each of the weight ratios of the third and fifth compounds, each of which may be the delayed fluorescent material, in the EML2 564 and the EML3 566 may be more than each of the weight ratios of the fourth and sixth compounds, each of which may be the fluorescent or phosphorescent material, in the same EML. As an example, each of the EML2 564 and the EML3 566 may include, but are not limited to, each of the third and fifth compound of about 90 to about 99% by weight, preferably about 95 to about 99% by weight, respectively, and include, but are not limited to, each of the fourth and sixth compounds of about 1 to about 10% by weight, preferably about 1 to about 5% by weight, respectively.

In an alternative embodiment, the weight ratio of the second compound as the delayed fluorescent material in the EML1 562 may be more than each of the weight ratios of the fourth and sixth compounds as the fluorescent or phosphorescent material in the EML2 564 and the EML3 566, respectively. Accordingly, exciton energy can be transferred sufficiently to the fourth and sixth compounds as the fluorescent or phosphorescent material in the EML2 564 and the EML3 566 from the second compound as the delayed fluorescent material in the EML1 562 through FRET mechanism.

In one exemplary embodiment, each of the EML1 562, the EML2 564 and the EML3 566 may be laminated with a thickness of, but are not limited to, about 5 nm to about 100 nm, preferably about 10 nm to about 30 nm, and more preferably about 10 nm to about 20 nm.

With regard to preventing or minimizing the decrease in the quantum efficiency, a first energy control layer may be disposed between the EML2 564 and the EML1 562 and a second energy control layer may be disposed between the EML1 562 and the EML3 566. Each of the first and second energy control layers may include a material having an excited state triplet energy level higher than the excited state triplet energy levels of the delayed fluorescent materials. As an example, each of the first and second energy control layers may include, but are not limited to, anyone of the organic compound having the structure of anyone of Chemical Formula 6 to 8 above.

Example 1: Manufacture of Organic Light-Emitting Diode (OLED)

An organic light-emitting diode including a first emitting material layer (EML1), having a first host and a first delayed fluorescent material, and a second EML (EML2), having a second delayed fluorescent material and a first fluorescent material, each of which laminated sequentially, between first and second electrodes, was fabricated. The first host is mCPB, the first and second delayed fluorescent material is 4CzIPN and the first fluorescent material is DCJTB.

A glass substrate attaching ITO was patterned to have an illumination area of 3 mm×3 mm and washed by UV-Ozone. The substrate was transferred to a vacuum chamber for depositing emission layer, the chamber was set to have base pressure of 1×10$^{-6}$ Torr, and emission layer and a cathode were deposited as the following order: A hole injection layer (HIL) (HAT-CN; 7 nm); a hole transport layer (HTL) (NPB, 78 nm); an electron blocking layer (EBL) (TAPC; 15 nm); an EML1 (mCBP (host): 4CzIPN (delayed fluorescent dopant)=70:30 by weight ratio; 25 nm); a second EML (4CzIPN: DCJTB=99:1 by weight ratio; 10 nm); a hole blocking layer (HBL) (B3PYMP; 10 nm); an electron transport layer (ETL) (TPBi; 25 nm); an electron injection layer (EIL) (LiF; 1 nm); and a cathode (Al; 100 nm).

And then, cappling layer (CPL) was deposited over the cathode and the device was encapsulated by glass. After deposition of emissive layer and the cathode, the OLED was transferred from the depostion chamber to a dry box for film formation, followed by encapsulation using UV-curable epoxy and moisture getter. The manufacture organic light-emitting diode had an emission area of 9 mm$^2$.

Example 2: Manufacture of OLED

An organic light-emitting diode was manufactured as the same process and the same materials as Example 1 except EML2 includes 4CzIPN and DCJTB with a weight ratio of 97:3.

Example 3 Manufacture of OLED

An organic light-emitting diode was manufactured as the same process and the same materials as Example 1 except EML2 includes 4CzIPN and DCJTB with a weight ratio of 95:5.

Example 4: Manufacture of OLED

An organic light-emitting diode was manufactured as the same process as Example 1 except EML2 includes 4CzIPN and a phosphorescent material Ir(piq)$_3$ in place of DCJTB with a weight ratio of 99:1.

Example 5: Manufacture of OLED

An organic light-emitting diode was manufactured as the same process as Example 1 except EML2 includes 4CzIPN and a phosphorescent material Ir(piq)$_3$ in place of DCJTB with a weight ratio of 97:3.

Example 6: Manufacture of OLED

An organic light-emitting diode was manufactured as the same process as Example 1 except EML2 includes 4CzIPN and a phosphorescent material Ir(piq)$_3$ in place of DCJTB with a weight ratio of 95:5.

Example 7: Manufacture of OLED

An organic light-emitting diode was manufactured as the same process as Example 1 except EML1 has a thickness of 20 nm and EML2 includes 4CzIPN and a phosphorescent material Ir(piq)$_3$ in place of DCJTB with a weight ratio of 97:3 and has a thickness of 15 nm.

Example 8: Manufacture of OLED

An organic light-emitting diode was manufactured as the same process as Example 1 except EML1 has a thickness of 30 nm and EML2 includes 4CzIPN and a phosphorescent material Ir(piq)₃ in place of DCJTB with a weight ratio of 97:3 and has a thickness of 5 nm.

Comparative Example 1: Manufacture of OLED

An organic light-emitting diode was manufactured as the same process as Example 1 except laminating a single-layered EML that includes mCBP as a host (69.5% by weight), 4CzIPN as a delayed fluorescent material (30% by weight) and DCJTB as a fluorescent material (0.5% by weight) and that has a thickness of 35 nm.

Comparative Example 2: Manufacture of OLED

An organic light-emitting diode was manufactured as the same process as Example 1 except laminating a single-layered EML that includes mCBP as a host (69.5% by weight), 4CzIPN as a delayed fluorescent material (30% by weight) and Ir(piq)₃ as a phosphorescent material (0.5% by weight) and that has a thickness of 35 nm.

Experimental Example: Measurement of Luminous Properties of OLED

Figure 10:
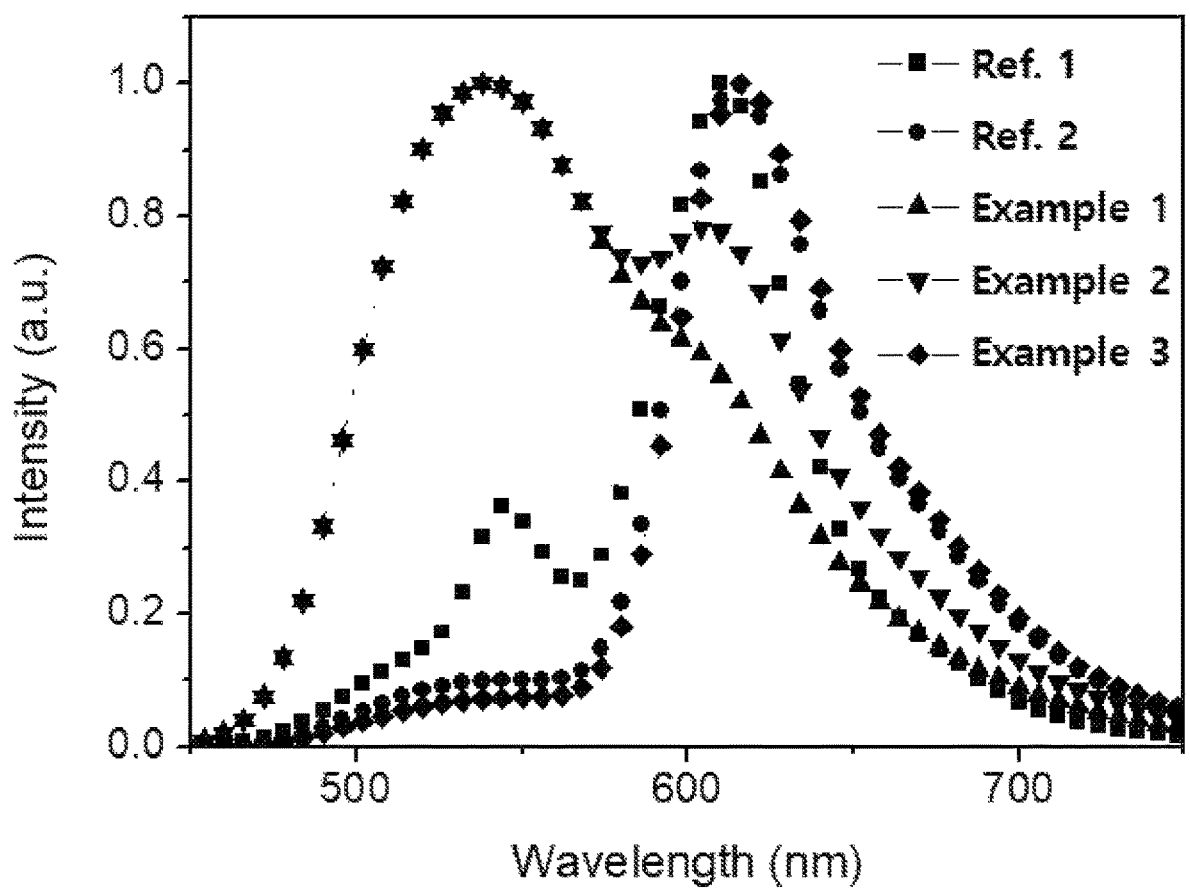
FIG. 10 illustrates electroluminescence (EL) spectra of Reference Examples 1 and 2; and Examples 1-3 OLEDs measured in accordance with Examples of the present disclosure.
Figure 11:
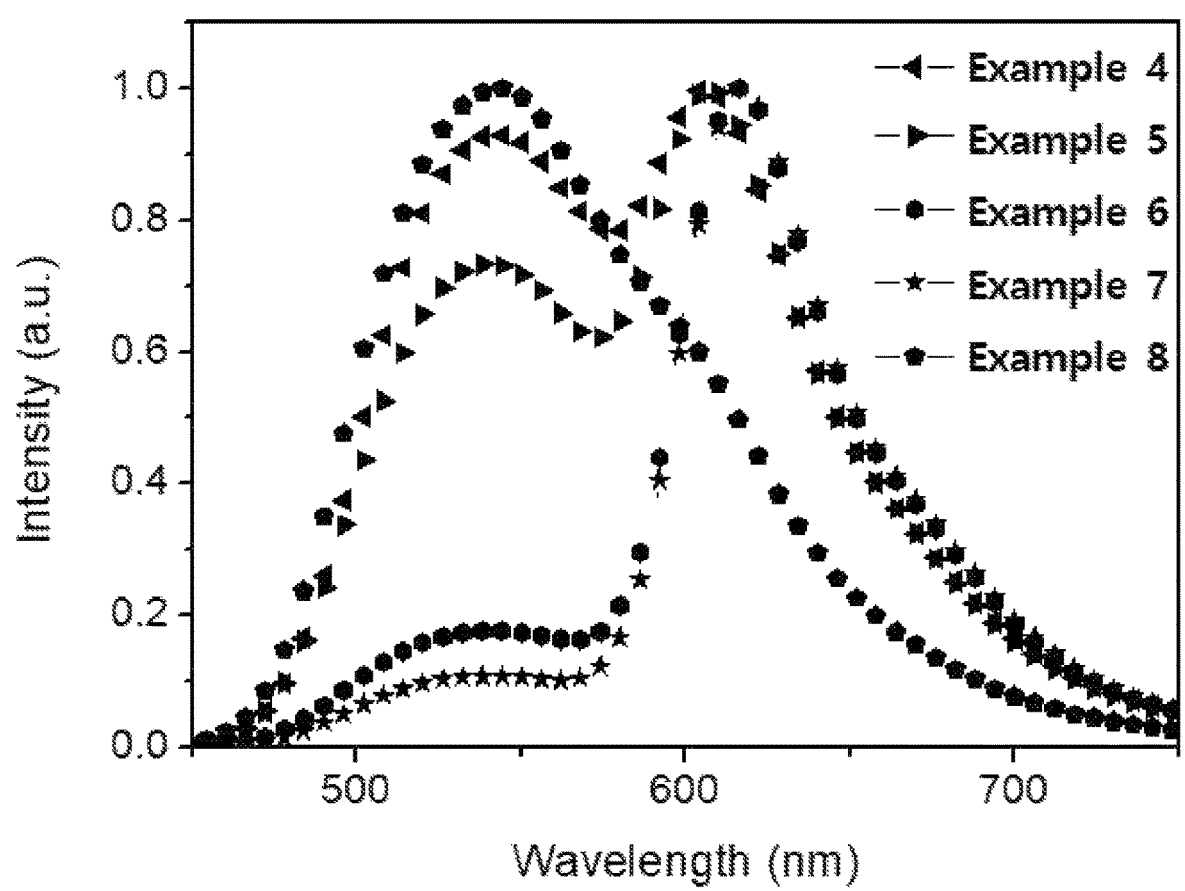
FIG. 11 illustrates electroluminescence (EL) spectra of Examples 4-8 OLEDs measured in accordance with Examples of the present disclosure.

Each of the organic light-emitting diode manufactured by Examples 1 to 8 and Comparative Examples 1 and 2 was connected to an external power source and luminous properties for all the diodes were evaluated using a constant current source (KEITHLEY) and a photometer PR650 at room temperature. In particular, driving voltage (V), current efficiency (Cd/A), power efficiency (lm/W), external quantum efficiency (EQE; %), luminance (cd/m²), color coordinates and FWHM at a current density of 10 mA/cm² of the light-emitting diodes of Examples 1 to 8 and Comparative Examples 1 and 2 were measured. The results thereof are shown in the following Table 1 and FIGS. 10 and 11.

TABLE 1

| Luminous Properties of OLED | | | | | | | |
|---|---|---|---|---|---|---|---|
| Sample | V | cd/A | lm/W | EQE (%) | cd/m² | CIEx | CIEy | FWHM (nm) |
| Comparative Example 1 | 3.3 | 20 | 19 | 9 | 199 | 0.54 | 0.44 | 50 |
| Comparative Example 2 | 2.8 | 33 | 37 | 22 | 399 | 0.61 | 0.38 | 61 |
| Example 1 | 2.9 | 44 | 48 | 16 | 533 | 0.42 | 0.53 | 121 |
| Example 2 | 2.9 | 49 | 53 | 16 | 592 | 0.39 | 0.55 | 140 |
| Example 3 | 3.4 | 22 | 20 | 8 | 342 | 0.58 | 0.40 | 61 |
| Example 4 | 2.9 | 51 | 56 | 20 | 612 | 0.45 | 0.53 | 144 |
| Example 5 | 3.0 | 52 | 54 | 21 | 627 | 0.46 | 0.49 | 140 |
| Example 6 | 3.4 | 34 | 31 | 22 | 364 | 0.59 | 0.39 | 58 |
| Example 7 | 3.4 | 35 | 32 | 22 | 417 | 0.58 | 0.40 | 58 |
| Example 8 | 3.6 | 57 | 50 | 19 | 685 | 0.39 | 0.55 | 119 |

As indicated in Table 1, compared to the OLED including the single-layered EML having the host, the delayed fluorescent material, and a fluorescent or phosphorescent material as the Comparative Examples, the OLED including double-layered EML comprising a first EML having the host and the first delayed fluorescent material and a second EML having the second delayed fluorescent material and the fluorescent or phosphorescent material as the Examples 1 to 8 decreased their driving voltages maximally by 12.1%, and enhanced current efficiency maximally by 185.0%, power efficiency maximally by 184.2%, EQE maximally 144.4% and luminance maximally by 244.2%. Also, the OLED in the Comparative Examples showed FWHM of 50 to 61, while the OLED in the Examples showed FWHM of 121 to 144, indicating that the OLED in the Example enhanced color continuity. Particularly, in case the EML2 includes the fluorescent or phosphorescent material doped with a level of 3% by weight, the EML1 has a thickness of 25 nm and the EML2 has thickness of 10 nm, the OLED showed the best color continuity.

While the present disclosure has been described with reference to exemplary embodiments and examples, these embodiments and examples are not intended to limit the scope of the present disclosure. Rather, it will be apparent to those skilled in the art that various modifications and variations can be made in the present disclosure without departing from the spirit or scope of the invention. Thus, it is intended that the present disclosure cover the modifications and variations of the present disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting diode, comprising:
   a cathode electrode;
   an anode electrode;
   a first emitting material layer which comprises a first host and a first delayed fluorescent material, wherein the first emitting layer is between the cathode electrode and the anode electrode; and
   a second emitting material layer which comprises a second delayed fluorescent material and a first fluorescent or phosphorescent material, wherein the second emitting layer is between the cathode electrode and the anode electrode.

2. The organic light-emitting diode of claim 1, wherein each of the first and second delayed fluorescent materials has an energy bandgap equal to or less than about 0.3 eV between an excited state singlet energy level and an excited state triplet energy level.

3. The organic light-emitting diode of claim 1, wherein each of an excited state singlet energy level and an excited state triplet energy level of the first host is higher than each of an excited state singlet energy level and an excited state triplet energy level of the first delayed fluorescent materials, respectively.

4. The organic light-emitting diode of claim 1, wherein the second emitting material layer comprises the second delayed fluorescent material and the first fluorescent material, and wherein an excited state singlet energy level of the second delayed fluorescent material is higher than an excited state singlet energy level of the first fluorescent material.

5. The organic light-emitting diode of claim 4, wherein an excited state triplet energy level of the second delayed fluorescent material is higher than an excited state triplet energy level of the first fluorescent material.

6. The organic light-emitting diode of claim 1, wherein the second emitting material layer comprises the second delayed fluorescent material and the first phosphorescent material, and
wherein an excited state triplet energy level of the second delayed fluorescent material is higher than an excited state triplet energy level of the first phosphorescent material.

7. The organic light-emitting diode of claim 1, wherein an energy level bandgap between a HOMO energy level of the first host and a HOMO energy level of the first delayed fluorescent material, or an energy level bandgap between a LUMO energy level of the first host and a LUMO energy level of the first delayed fluorescent material is equal to or less than about 0.5 eV.

8. The organic light-emitting diode of claim 7, wherein the first emitting material is positioned between the anode electrode and the second emitting material, and
wherein the HOMO energy level of the first host is lower than the HOMO energy level of the first delayed fluorescent material.

9. The organic light-emitting diode of claim 8, wherein the first host comprises a same material as an electron blocking layer.

10. The organic light-emitting diode of claim 7, wherein the first emitting material is positioned between the cathode electrode and the second emitting material, and
wherein the LUMO energy level of the first host is higher than the LUMO energy level of the first delayed fluorescent material.

11. The organic light-emitting diode of claim 10, wherein the first host comprises a same material as a hole blocking layer.

12. The organic light-emitting diode of claim 1, further comprising a first energy control layer between the first emitting material layer and the second emitting material layer,
wherein an excited state triplet energy level of a material of the first energy control layer is higher than an excited state triplet energy level of the first delayed fluorescent material.

13. The organic light-emitting diode of claim 1, wherein the first delayed fluorescent material is the same as the second delayed fluorescent material.

14. The organic light-emitting diode of claim 1, further comprising a third emitting material layer which comprises a second host and a third delayed fluorescent material, between the cathode electrode and the anode electrode,
wherein the second emitting material layer is positioned between the first emitting material layer and the third emitting material layer.

15. The organic light-emitting diode of claim 14, wherein the third delayed fluorescent material has an energy bandgap equal to or less than about 0.3 eV between an excited state singlet energy level and an excited state triplet energy level.

16. The organic light-emitting diode of claim 14, wherein the first, second and third delayed fluorescent materials are the same.

17. The organic light-emitting diode of claim 14, wherein the first emitting material is positioned between the anode electrode and the second emitting material,
wherein a HOMO energy level of the first host is lower than a HOMO energy level of the first delayed fluorescent material,
wherein the first host comprises a same material as an electron blocking layer,
wherein a LUMO energy level of the second host is higher than a LUMO energy level of the third delayed fluorescent material, and
wherein the second host comprises a same material as a hole blocking layer.

18. The organic light-emitting diode of claim 14, further comprising a second energy control layer between the second emitting material layer and the third emitting material layer,
wherein an excited state triplet energy level of a material of the second energy control layer is higher than an excited state triplet energy level of the third delayed fluorescent material.

19. The organic light-emitting diode of claim 1, further comprising a third emitting material layer which comprises a third delayed fluorescent material and a second fluorescent or phosphorescent material, wherein the third emitting material layer is between the cathode electrode and the anode electrode,
wherein the first emitting material layer is positioned between the second emitting material layer and the third emitting material layer.

20. The organic light-emitting diode of claim 19, wherein the third delayed fluorescent material has an energy bandgap equal to or less than about 0.3 eV between an excited state singlet energy level and an excited state triplet energy level.

21. The organic light-emitting diode of claim 19, wherein the first, second and third delayed fluorescent materials are the same.

22. The organic light-emitting diode of claim 19, further comprising a second energy control layer between the first emitting material layer and the third emitting material layer,
wherein an excited state triplet energy level of a material of the second energy control layer is higher than an excited state triplet energy level of the first delayed fluorescent material.

23. An organic light-emitting device, comprising the organic light-emitting diode of claim 1.

24. The organic light-emitting device of claim 23, wherein the organic light-emitting device is an organic light-emitting display device or an organic light-emitting illumination device.

25. The organic light-emitting diode of claim 1, wherein the first host is a first compound of Chemical Formula 1:

Chemical Formula 1

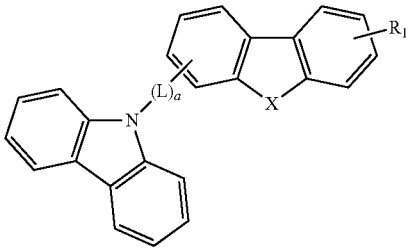

where in Chemical Formula 1, $R_1$ is hydrogen, deuterium, tritium, $C_5$~$C_{30}$ aryl group unsubstituted or substituted with $C_5$~$C_{30}$ aromatic group, or $C_4$~$C_{30}$ hetero aryl group unsubstituted or substituted with $C_5$~$C_{30}$ aromatic group, X is nitrogen, oxygen or sulfur, L is $C_5$~$C_{30}$ arylene group or $C_4$~$C_{30}$ hetero arylene group and a is 1 or 2.

26. The organic light-emitting diode of claim 1, wherein the delayed fluorescent material is a compound of Chemical Formula 3:

DF-1

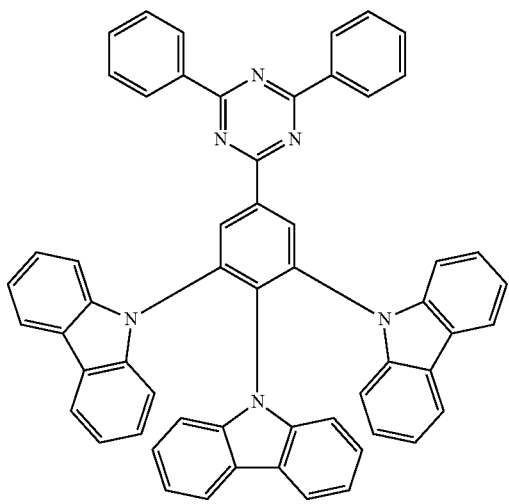

DF-2

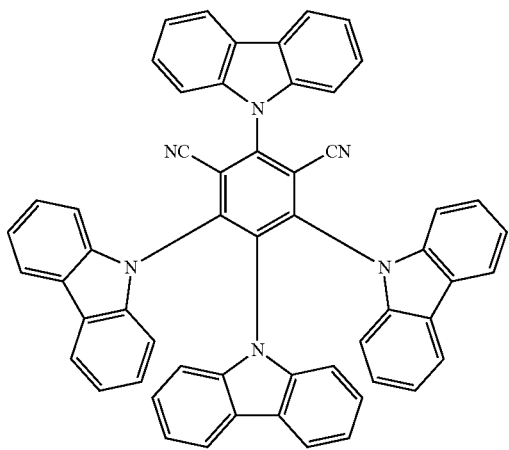

DF-3

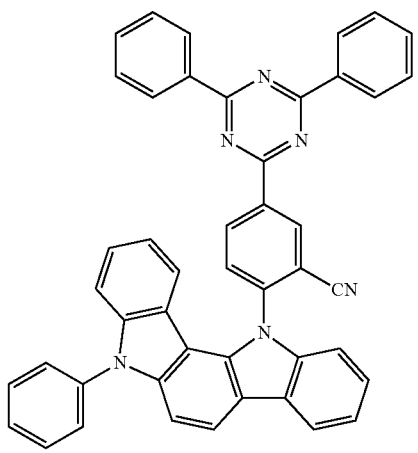

DF-4

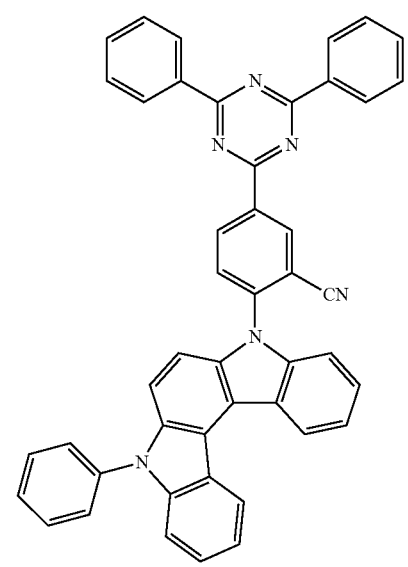

DF-5

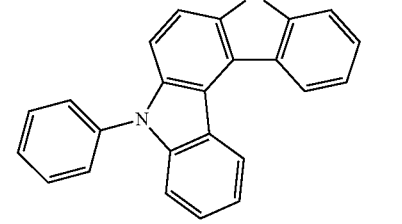

* * * * *